(12) United States Patent
Hisada et al.

(10) Patent No.: US 11,631,764 B2
(45) Date of Patent: Apr. 18, 2023

(54) MANUFACTURING METHOD OF SEMICONDUCTOR DEVICE AND SEMICONDUCTOR DEVICE

(71) Applicant: RENESAS ELECTRONICS CORPORATION, Tokyo (JP)

(72) Inventors: Kenichi Hisada, Ibaraki (JP); Koichi Arai, Ibaraki (JP); Hironobu Miyamoto, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 217 days.

(21) Appl. No.: 17/060,486

(22) Filed: Oct. 1, 2020

(65) Prior Publication Data

US 2021/0028306 A1 Jan. 28, 2021

Related U.S. Application Data

(63) Continuation of application No. 16/282,981, filed on Feb. 22, 2019, now Pat. No. 10,833,188.

(30) Foreign Application Priority Data

Mar. 14, 2018 (JP) .............................. JP2018-046411

(51) Int. Cl.
*H01L 29/78* (2006.01)
*H01L 29/423* (2006.01)
(Continued)

(52) U.S. Cl.
CPC .... *H01L 29/7813* (2013.01); *H01L 21/02378* (2013.01); *H01L 21/02529* (2013.01);
(Continued)

(58) Field of Classification Search
CPC ............. H01L 21/266; H01L 21/02529; H01L 21/02378; H01L 21/046; H01L 29/0865;
(Continued)

(56) References Cited

U.S. PATENT DOCUMENTS 7,872,308 B2   1/2011   Akiyama et al.
8,283,721 B2  10/2012   Nakano
(Continued)

FOREIGN PATENT DOCUMENTS

JP   2009-260253 A   11/2009
JP      5196980 B2    5/2013
(Continued)

OTHER PUBLICATIONS

Japanese Notice of Reasons for Refusal issued in corresponding Japanese Patent Application No. 2018-046411, dated Aug. 31, 2021, with English translation. U.S. PTO Non-Final Office Action issued in related parent U.S. Appl. No. 16/282,981, dated Apr. 3, 2020.
(Continued)

*Primary Examiner* — Karen Kusumakar
*Assistant Examiner* — Adam S Bowen
(74) *Attorney, Agent, or Firm* — McDermott Will & Emery LLP

(57) ABSTRACT

First and second p-type semiconductor regions (electric-field relaxation layers) are formed by ion implantation using a dummy gate and side wall films on both sides of the dummy gate as a mask. In this manner, it is possible to reduce a distance between the first p-type semiconductor region and a trench and a distance between the second p-type semiconductor region and the trench, and symmetry of the first and second p-type semiconductor regions with respect to the trench can be enhanced. As a result, semiconductor elements can be miniaturized, and on-resistance and an electric-field relaxation effect, which are in a trade-off relationship, can be balanced, so that characteristics of the semiconductor elements can be improved.

6 Claims, 50 Drawing Sheets

(51) Int. Cl.
  *H01L 29/16*  (2006.01)
  *H01L 29/66*  (2006.01)
  *H01L 21/308*  (2006.01)
  *H01L 29/08*  (2006.01)
  *H01L 21/04*  (2006.01)
  *H01L 21/02*  (2006.01)
  *H01L 21/266*  (2006.01)

(52) U.S. Cl.
  CPC .......... *H01L 21/046* (2013.01); *H01L 21/266* (2013.01); *H01L 21/3086* (2013.01); *H01L 29/0865* (2013.01); *H01L 29/1608* (2013.01); *H01L 29/4236* (2013.01); *H01L 29/66068* (2013.01); *H01L 29/66545* (2013.01); *H01L 29/66734* (2013.01)

(58) Field of Classification Search
  CPC ........... H01L 21/3086; H01L 29/66734; H01L 29/66545; H01L 29/4236; H01L 29/1095; H01L 29/7811; H01L 29/0623
  See application file for complete search history.

(56) References Cited

U.S. PATENT DOCUMENTS

| | | |
|---|---|---|
| 9,972,715 B2 | 5/2018 | Ueno |
| 2006/0091432 A1 | 5/2006 | Guha et al. |
| 2011/0156136 A1 | 6/2011 | Amari |
| 2014/0264564 A1 | 9/2014 | Cheng et al. |
| 2016/0079375 A1 | 3/2016 | Yamazaki |
| 2016/0099316 A1 | 4/2016 | Arai et al. |
| 2017/0047440 A1* | 2/2017 | Ohashi ................ H01L 29/1608 |
| 2018/0331209 A1* | 11/2018 | Shiomi ................ H01L 21/049 |

FOREIGN PATENT DOCUMENTS

| | | |
|---|---|---|
| JP | 2017-038001 A | 2/2017 |
| JP | 2017-069270 A | 4/2017 |

OTHER PUBLICATIONS

U.S. PTO Notice of Allowance issued in related parent U.S. Appl. No. 16/282,981, dated Jul. 23, 2020.
Parent U.S. Appl. No. 16/282,981, filed Feb. 22, 2019.

* cited by examiner

FIG. 10
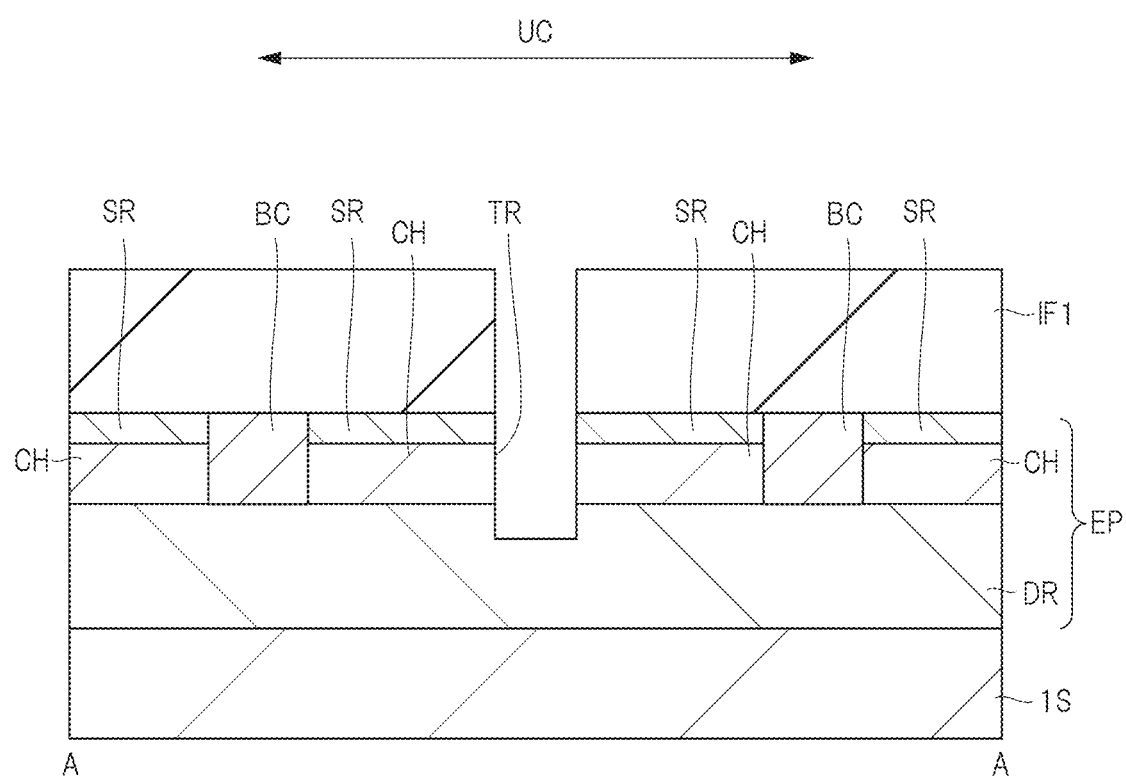
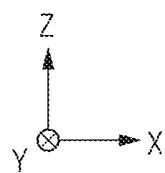

FIG. 11
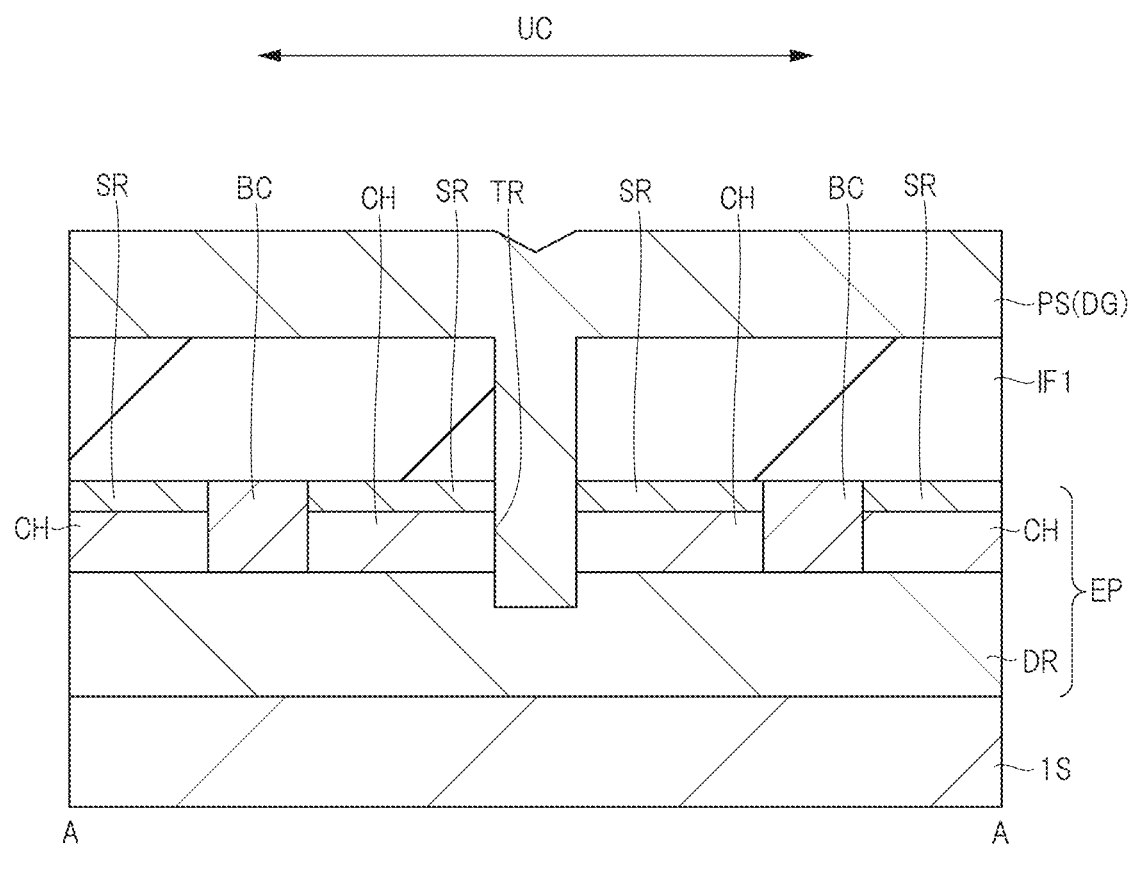
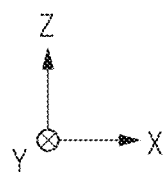

FIG. 29
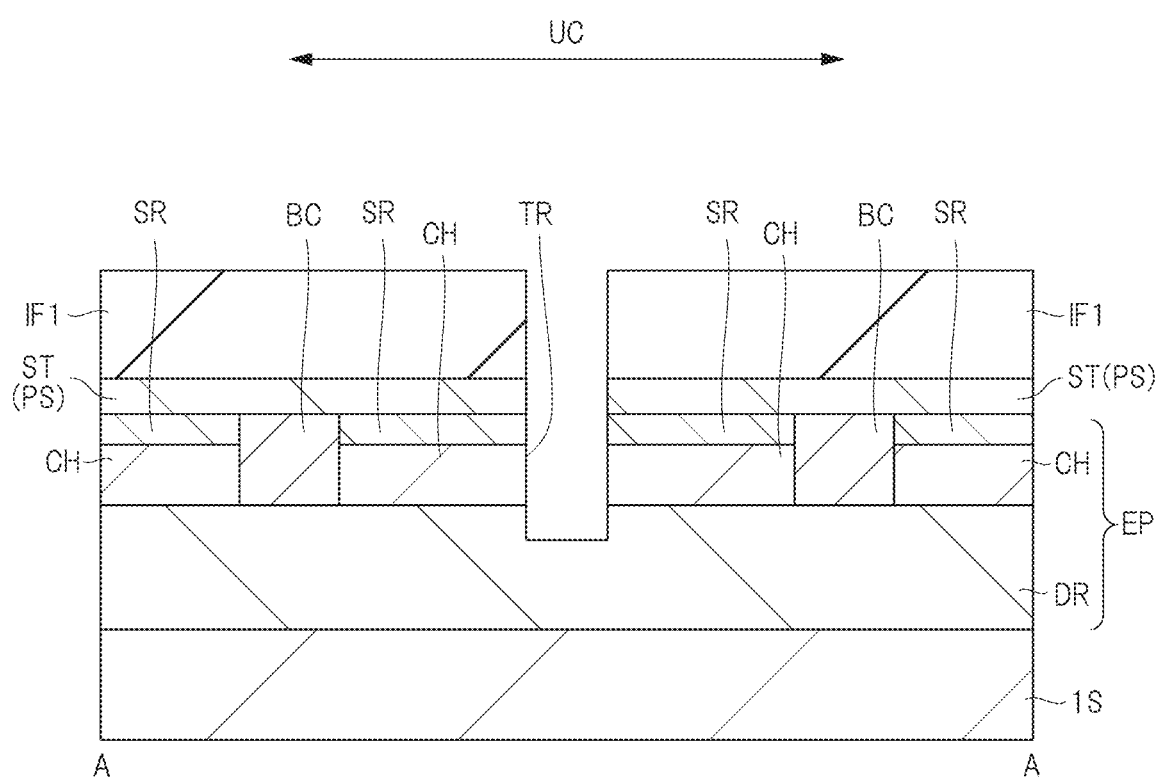
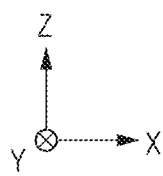

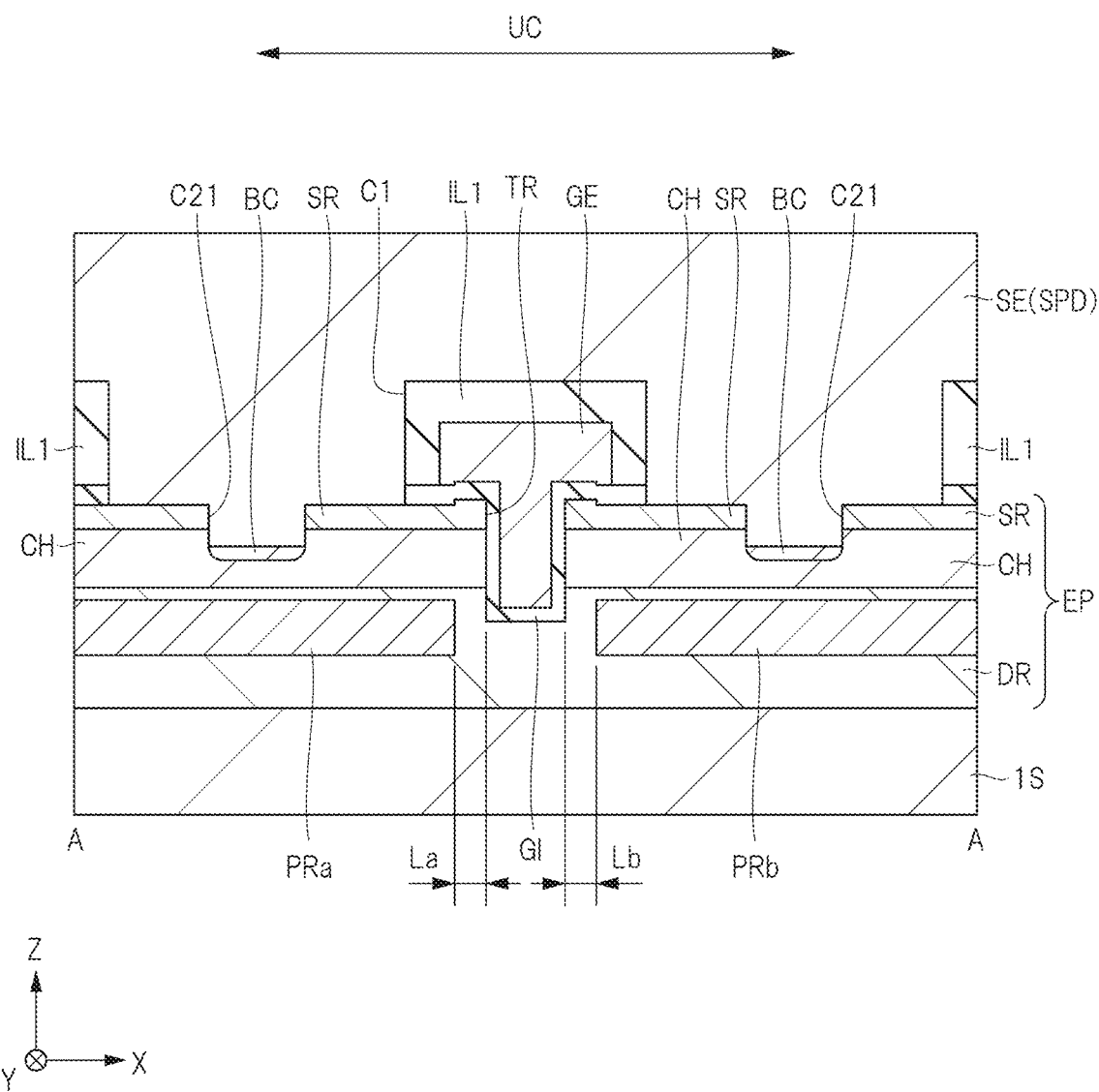

MANUFACTURING METHOD OF SEMICONDUCTOR DEVICE AND SEMICONDUCTOR DEVICE

CROSS-REFERENCE TO RELATED APPLICATION

This is a Continuation of U.S. patent application Ser. No. 16/282,981, filed on Feb. 22, 2019, which claims priority from Japanese Patent Application No. 2018-046411 filed on Mar. 14, 2018, the content of which is hereby incorporated by reference into this application.

TECHNICAL FIELD OF THE INVENTION

The present invention relates to a manufacturing method of a semiconductor device and the semiconductor device, and can be suitably applied in particular to a semiconductor device using silicon carbide (SiC).

BACKGROUND OF THE INVENTION

In the field of the semiconductor device having a transistor, a semiconductor device using an SiC substrate has been under study. For example, when an SiC substrate is used in a power transistor, breakdown voltage increases because SiC has a wider bandgap than silicon (Si).

For example, Japanese Patent Application Laid-Open Publication No. 2017-38001 (Patent Document 1) discloses a semiconductor device with an MIS structure using SiC. In this semiconductor device, a first region of a p well region is inclined at an inclination angle θ.

Furthermore, Japanese Patent No. 5196980 (Patent Document 2) discloses a semiconductor device in which an impurity concentration of a lowermost portion of a semi-superjunction structure is made higher than that of other portions in a p-type pillar layer, so that a depletion layer is likely to spread downward (into a drift layer) from a pn junction between the lowermost portion and the drift layer, and thus a structure with high breakdown voltage can be achieved.

SUMMARY OF THE INVENTION

The inventors are engaged in research and development of semiconductor devices using silicon carbide (SiC) and have made every effort to improve characteristics of semiconductor devices.

As described above, SiC has a wider bandgap than silicon (Si) and thus can increase breakdown voltage. However, in a MISFET that is a semiconductor device using SiC, an increasing breakdown voltage of SiC may pose a problem to the breakdown voltage of a gate insulating film. That is, the gate insulating film may disadvantageously break before breakage of SiC occurs.

In this case, as described below, by disposing an electric-field relaxation layer near a trench in which a gate electrode is embedded via the gate insulating film, the electric field generated near the gate insulating film is relaxed to thereby enhance the breakdown voltage of the gate insulating film.

However, in a case where the electric-field relaxation layer is formed by ion implantation or the like with using a predetermined film as a mask, alignment margins are needed and miniaturization of elements cannot be achieved. Furthermore, possible mask misalignment hinders the electric-field relaxation layers from being formed symmetrically with respect to the trench, leading to degraded element characteristics.

Thus, there is a desire for study of a manufacturing method of a semiconductor device and a configuration of a semiconductor device that allow miniaturization of the elements and improvement of the element characteristics.

An outline of typical embodiments disclosed in the present application will be given below in brief.

A manufacturing method of a semiconductor device illustrated in an embodiment disclosed in the present application includes the steps of: embedding a dummy gate in a trench; protruding the dummy gate from a source region; and forming side wall films on side walls of the dummy gate. The manufacturing method further includes the step of ion-implanting impurities of a conductivity type opposite to a conductivity type of a drift layer with using the dummy gate and the side wall film as a mask, thereby forming a first semiconductor region in the drift layer on a first side of the trench and forming a second semiconductor region in the drift layer on a second side of the trench.

A semiconductor device illustrated in an embodiment disclosed in the present application includes an SiC layer having a drift layer, a channel layer on the drift layer, and a source region on the channel layer. Also, the semiconductor device further includes: a trench penetrating the channel layer to reach the drift layer to be in contact with the source layer; a gate insulating film formed on an inner wall of the trench; a gate electrode embedded in the trench; a first semiconductor region formed in the drift layer on a first side of the trench; and a second semiconductor region formed in the drift layer on a second side of the trench. In addition, a distance between the trench and the first semiconductor region and a distance between the trench and the second semiconductor region are each shorter than or equal to a width of the trench.

According to the manufacturing method of the semiconductor device illustrated in the typical embodiments disclosed below in the present application, it is possible to manufacture a semiconductor device capable of achieving miniaturization of elements and favorable element characteristics. Furthermore, according to the semiconductor device illustrated in the typical embodiments disclosed below in the present application, it is possible to provide a fine semiconductor device with favorable characteristics.

BRIEF DESCRIPTIONS OF THE DRAWINGS

FIG. 10 is a cross-sectional view illustrating the manufacturing process of the semiconductor device according to the first embodiment;

FIG. 11 is a cross-sectional view illustrating the manufacturing process of the semiconductor device according to the first embodiment;

FIG. 29 is a cross-sectional view illustrating the manufacturing process of the semiconductor device according to the third embodiment;

FIG. 65 is a cross-sectional view illustrating the manufacturing process of the semiconductor device according to the sixth embodiment.

DESCRIPTIONS OF THE PREFERRED EMBODIMENTS

Figure 1:
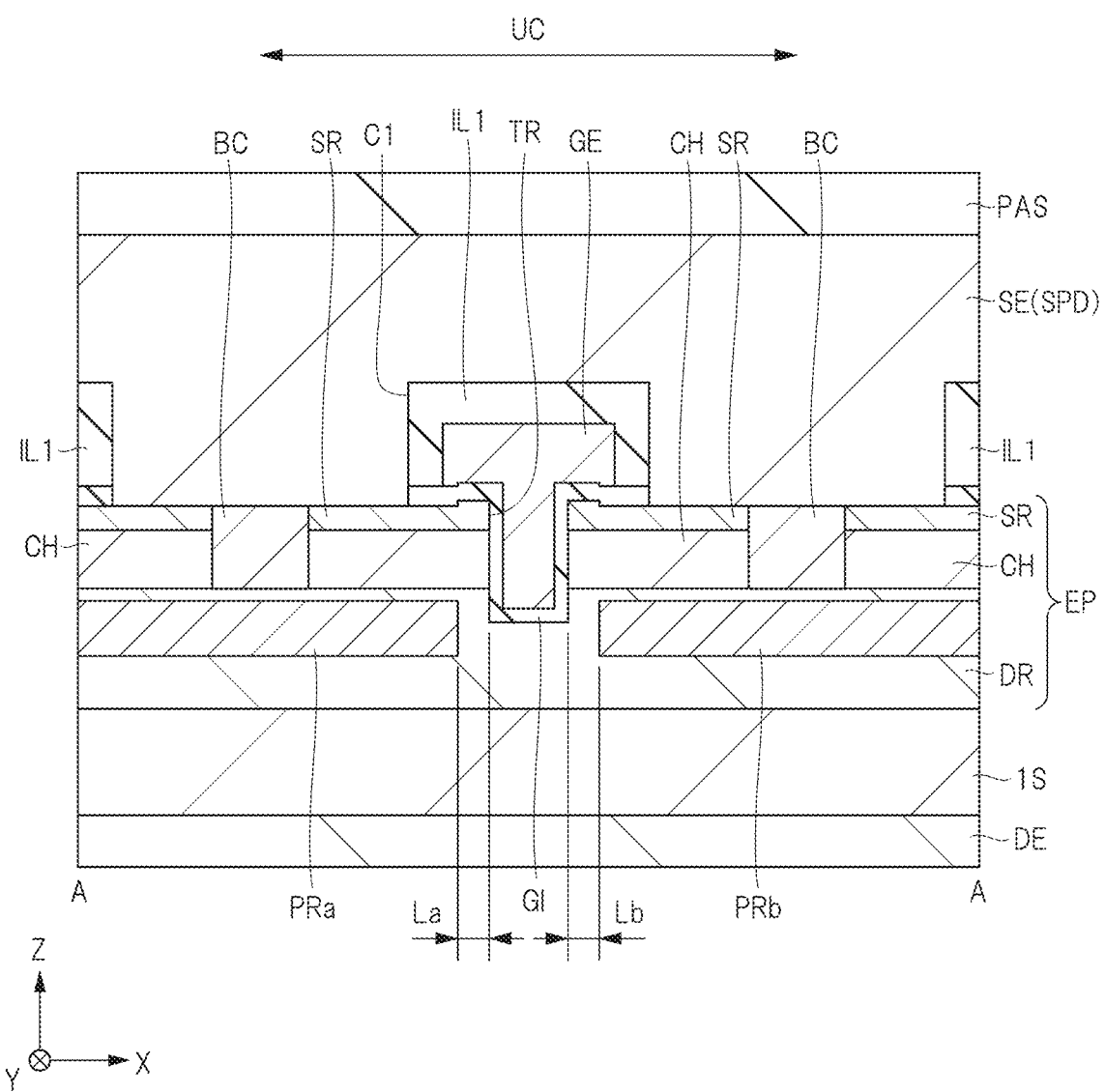
FIG. 1 is a cross-sectional view illustrating a configuration of a semiconductor device according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when mentioning the number of elements (including number of pieces, values, amount, range, and the like), the number of the elements is not limited to a specific number unless otherwise stated or except the case where the number is apparently limited to a specific number in principle, and the number larger or smaller than the specified number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the number and the like described above (including the number of pieces, numerical value, amount, range and others).

Hereinafter, embodiments of the present invention will be described in detail with reference to the accompanying drawings. Note that components having the same function are denoted by the same reference characters throughout the drawings for describing the embodiments, and the repetitive description thereof will be omitted. Also, when a plurality of similar members (portions) are present, an individual or specific portion among them is denoted by a generic character added with a symbol in some cases. In addition, the description of the same or similar portions is not repeated in principle unless particularly required in the following embodiments.

Also, in some drawings used in the following embodiments, hatching is omitted even in a cross-sectional view so as to make the drawings easy to see. In addition, hatching is used even in a plan view so as to make the drawings easy to see.

Further, the size of respective portions does not correspond to that of an actual device in cross-sectional view and plan view, and a specific portion may be shown in a relatively enlarged manner in some cases so as to make the drawings easy to see. Also, even when a cross-sectional view and a plan view correspond to each other, a specific portion may be shown in a relatively enlarged manner in some case so as to make the drawings easy to see.

First Embodiment

[Description of Structure]

A semiconductor device according to a first embodiment will be described below in detail with reference to the drawings.

Figure 2A:
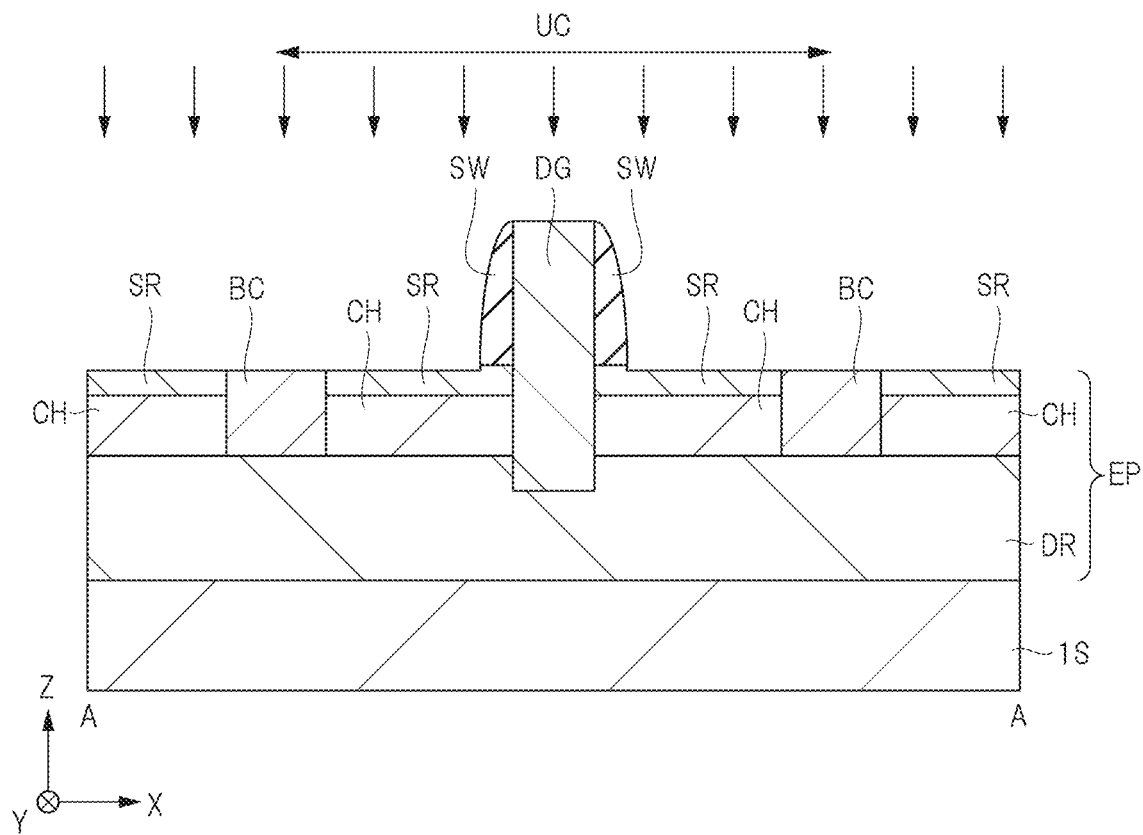
FIGS. 2A and 2B are cross-sectional views each illustrating a manufacturing process of the semiconductor device according to the first embodiment.
Figure 2B:
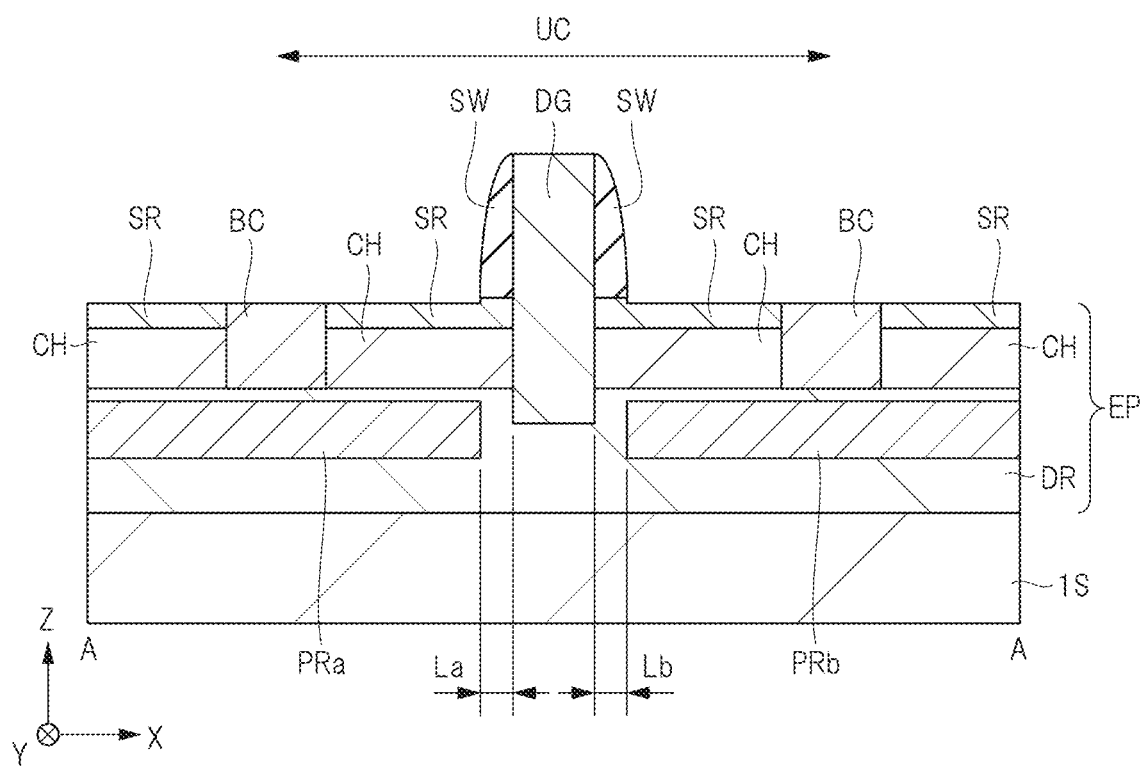

FIG. 1 is a cross-sectional view illustrating a configuration of a semiconductor device according to the first embodiment. FIGS. 2A and 2B are cross-sectional views each illustrating a manufacturing process of the semiconductor device according to the first embodiment. The semiconductor device illustrated in FIG. 1 is a trench gate power transistor.

As illustrated in FIG. 1, the semiconductor device according to the first embodiment includes a drift layer (drain region) DR provided on a front surface (first surface) side of an SiC substrate 1S, a channel layer CH provided on the drift layer DR, and a source region SR provided on the channel layer CH. The drift layer DR includes an n-type semiconductor region, the channel layer CH includes a p-type semiconductor region, and the source region SR includes an n-type semiconductor region. The semiconductor regions are formed of SiC, the p-type semiconductor region includes p-type impurities, and the n-type semiconductor region includes n-type impurities. Furthermore, the semiconductor regions are formed in, for example, an epitaxial layer EP made of SiC.

Also, the semiconductor device according to the first embodiment includes a gate electrode GE arranged, via a gate insulating film GI, in a trench TR penetrating the source region SR and the channel layer CH to reach the drift layer DR.

Furthermore, on each of the right and left sides of the trench TR, one end of the source region SR is in contact with the trench TR, and a body contact region BC is provided at the other end of the source region SR opposite to the one end. The body contact region BC includes a p-type semiconductor region having a higher impurity concentration than the channel layer CH and is formed to achieve ohmic contact with the channel layer CH.

Furthermore, an interlayer insulating film IL1 is provided on the gate electrode GE. The interlayer insulating film IL1 is formed of an insulating film such as a silicon oxide film. A source electrode SE is provided on the interlayer insulating film IL1 and in a contact hole C1 in the interlayer insulating film IL1. The source electrode SE is formed of a conductive film. Note that a portion of the source electrode SE located inside the contact hole C1 may be regarded as a plug (via), and a portion of the source electrode SE extending on the interlayer insulating film IL1 may be regarded as a wiring. The source electrode SE is electrically connected to the body contact regions BC and the source region SR. A surface protection film PAS made of an insulating film is formed on the source electrode SE. Note that a drain electrode DE is formed on a back surface (second surface) side of the SiC substrate 1S.

The transistor illustrated in FIG. 1 is repeatedly arranged in plan view as described later (see FIG. 6B). Thus, the transistor illustrated in FIG. 1 may be referred to as a "unit transistor (unit cell) UC". The "unit transistor (unit cell) UC" is a minimum repetition unit.

In the first embodiment, p-type semiconductor regions (PRa and PRb or electric-field relaxation layers) that are embedded layers are provided below the channel layer CH on both sides of the trench TR. The p-type semiconductor regions (PRa and PRb) are located below the channel layer CH and include impurities of a conductivity type opposite to the conductivity type of the drift layer DR (p-type impurities). By providing the p-type semiconductor regions (PRa and PRb) as described above, the breakdown voltage of the gate insulating film GI, for example, the bottom electric field in the trench described later can be improved.

As illustrated in FIG. 2A and FIG. 2B, the p-type semiconductor regions (PRa and PRb or electric-field relaxation layers) are formed by ion implantation using a dummy gate DG provided in the trench TR to protrude upward from the trench TR and side wall films SW formed on both sides of the dummy gate DG as a mask. That is, the p-type semiconductor regions (PRa and PRb or electric-field relaxation layers) are impurity regions formed in a self-alignment manner in association with the side walls of the side wall films SW of the dummy gate DG. This enables a reduction in a distance La between the p-type semiconductor region PRa and the trench TR (the shortest distance in plan view, see FIG. 6B) and a distance Lb between the p-type semiconductor region PRb and the trench TR (the shortest distance in plan view). Each of the distances La and Lb corresponds to a width of a corresponding one of the side wall films SW (a length in an X direction). Furthermore, the distance La and the distance Lb can be made approximately equivalent to each other. In other words, it is possible to reduce a difference between the distance La and the distance Lb. Moreover, in other words, variations in the distance La and the distance Lb can be reduced. The distance La and distance Lb thus reduced allow semiconductor elements (unit transistors UC) to be miniaturized. Furthermore, when the distance La and the distance Lb are set approximately equivalent to each other to enhance symmetry of the two semiconductor regions (PRa and PRb) with respect to the trench TR, element characteristics can be improved.

In contrast, in a semiconductor device in a comparative example illustrated below, a distance L2a and a distance L2b are increased due to mask alignment margins when forming the p-type semiconductor regions (PRa and PRb), and possible mask misalignment may make the distance L2a and the distance L2b unbalanced.

Figure 3A:
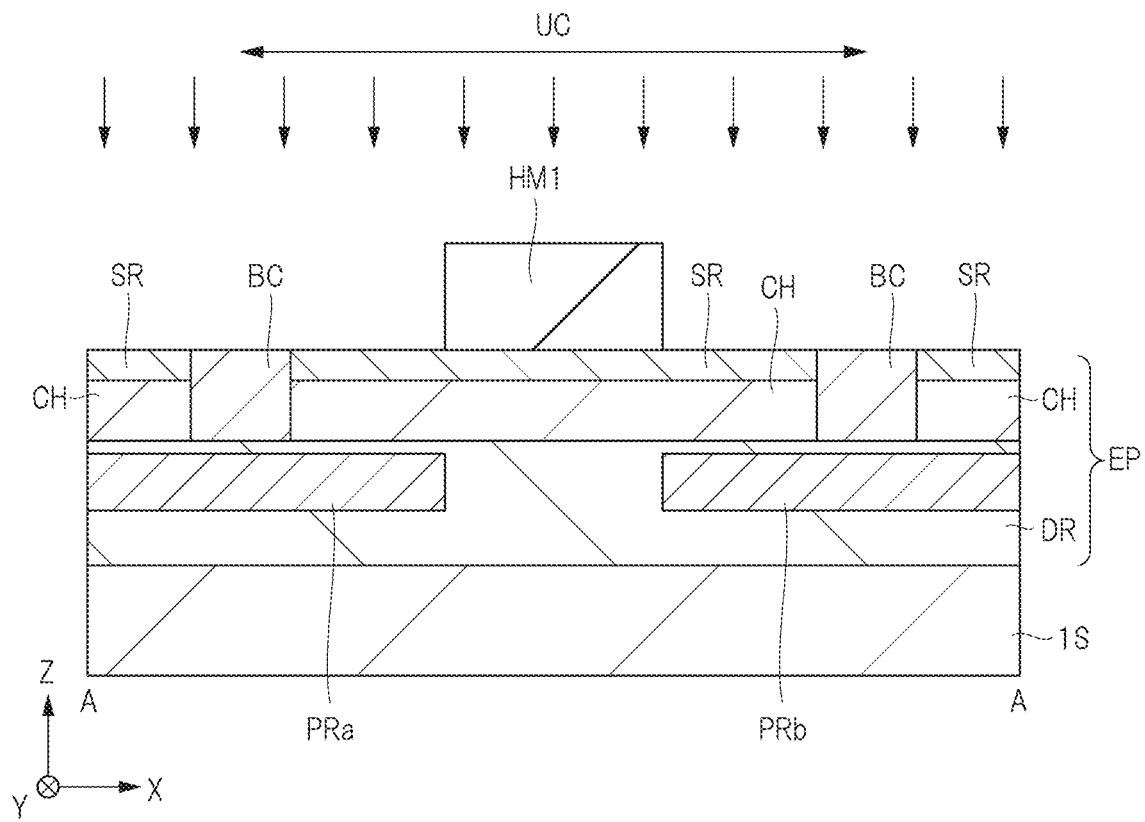
FIGS. 3A and 3B are cross-sectional views each illustrating a manufacturing process of a semiconductor device in the comparative example.
Figure 3B:
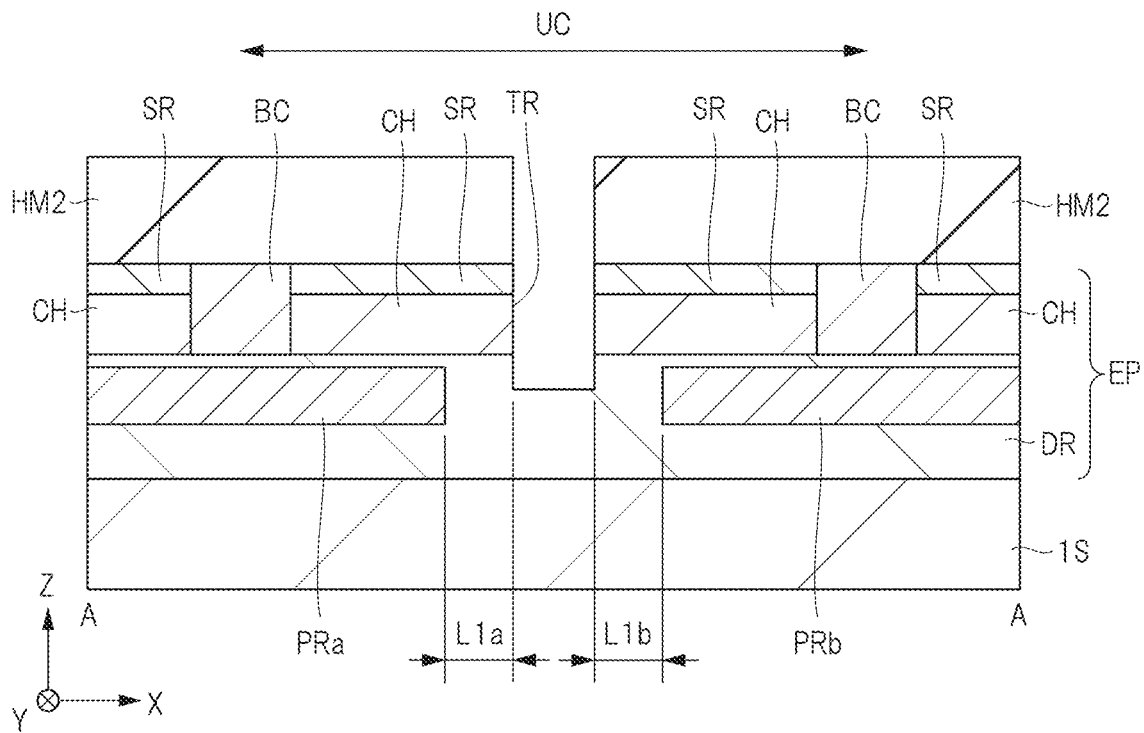

FIGS. 3A to 5 are cross-sectional views illustrating a manufacturing process of the semiconductor device in the comparative example. The semiconductor device in the comparative example can be formed as follows. First, the SiC substrate 1S in which the drift layer DR, the channel layer CH, and the source region SR are formed in this order from bottom to top and the body contact region BC is formed in a stacked portion of the source region SR and the channel layer CH is prepared. Then, as illustrated in FIG. 3A, p-type impurities are ion-implanted with using a hard mask HM1 as a mask to form the p-type semiconductor regions (PRa and PRb). The p-type semiconductor regions (PRa and PRb) are formed on both sides of a region where the trench is to be formed. Next, after the hard mask HM1 is removed, as illustrated in FIG. 3B, the source region SR, the channel layer CH, and the drift layer DR are partially removed with using a hard mask HM2 as a mask to form the trench TR such that the trench TR is located between the p-type semiconductor regions PRa and PRb. Thereafter, the hard mask HM2 is removed.

In the manufacturing process in the comparative example described above, alignment margins for the hard mask HM1 for forming the p-type semiconductor regions (PRa and PRb) are added, and this makes the reduction in the distance between the p-type semiconductor regions PRa and PRb difficult. For example, it is difficult to set each of the distance L1a and the distance L1b shorter than or equal to the width W of the trench TR, which is formed to have a width close to a resolution limit.

Figure 4:
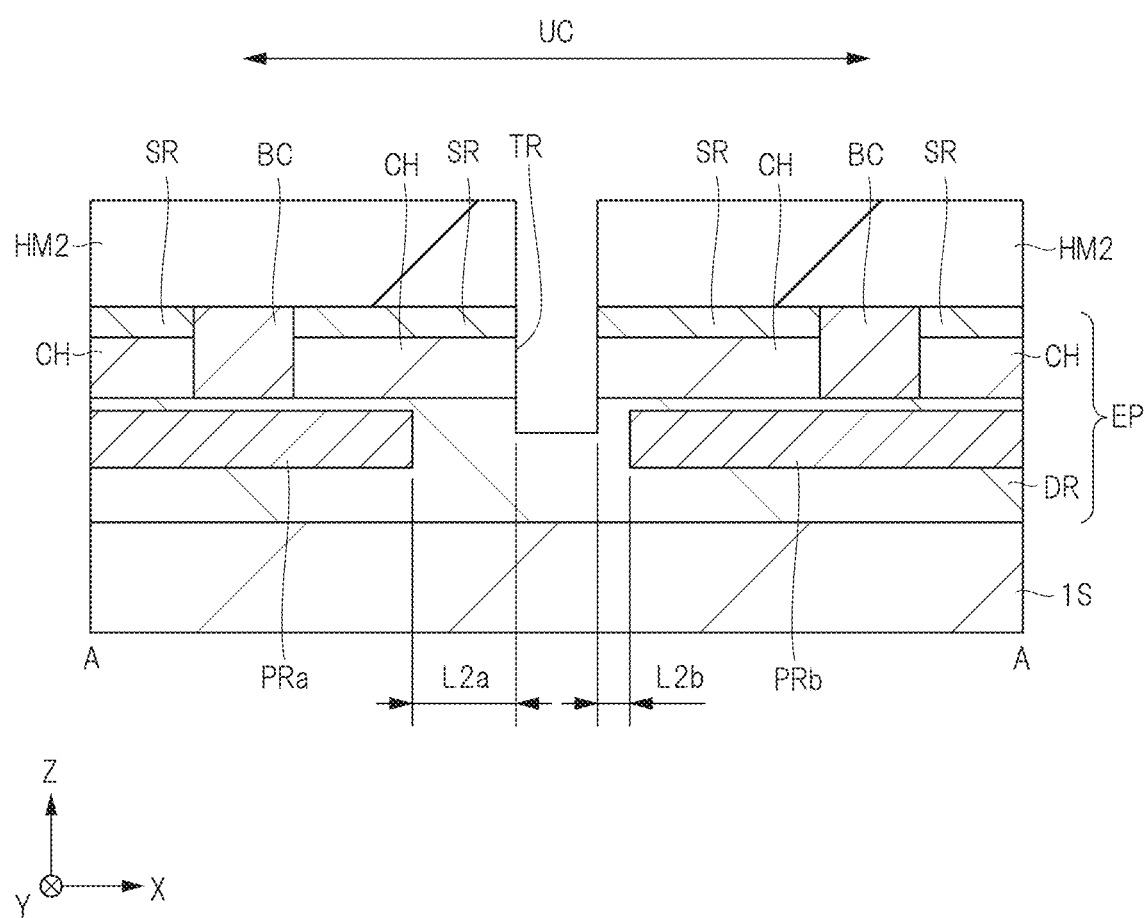
FIG. 4 is a cross-sectional view illustrating the manufacturing process of the semiconductor device in the comparative example.
Figure 5:
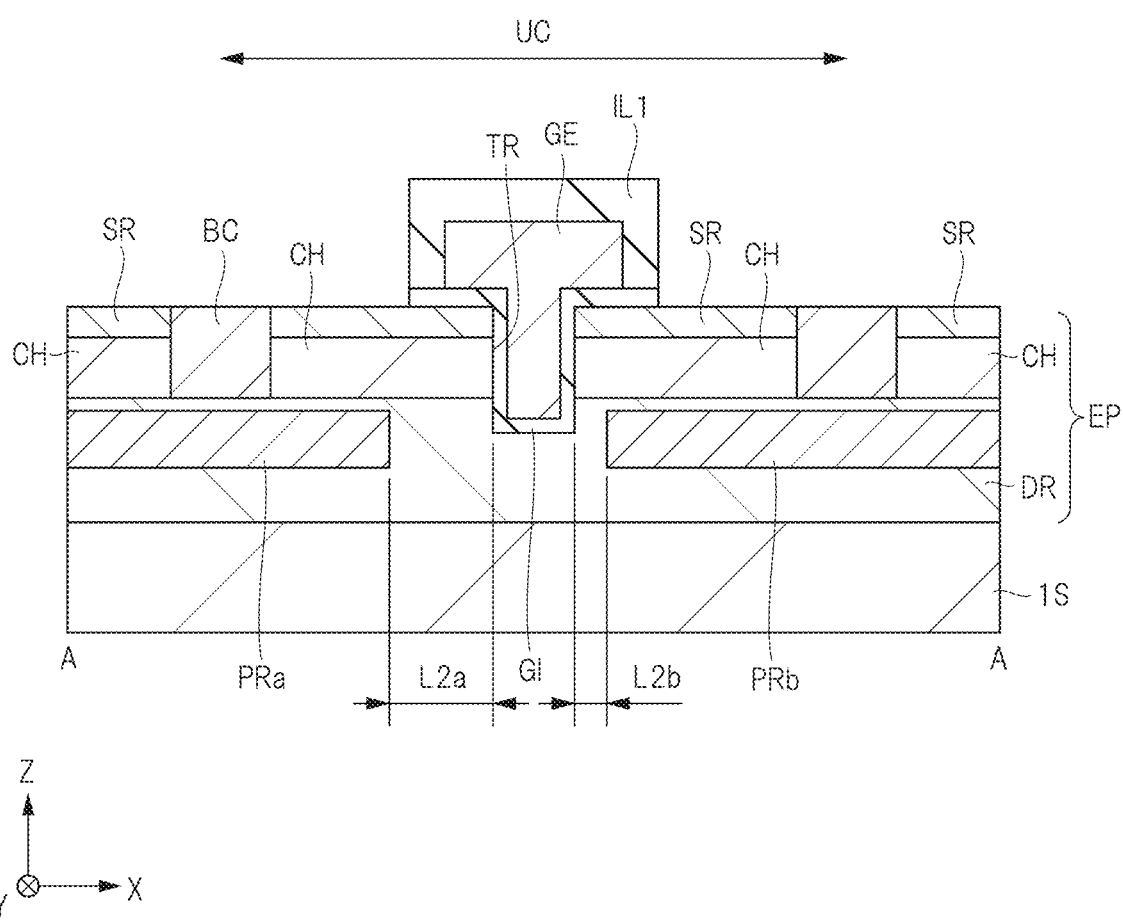
FIG. 5 is a cross-sectional view illustrating the manufacturing process of the semiconductor device in the comparative example.

Furthermore, since the p-type semiconductor regions (PRa and PRb) are formed and then the trench TR is formed so as to be located between the p-type semiconductor regions PRa and PRb, possible misalignment of the hard mask for forming the trench TR (mask misalignment) makes the distance L2a and the distance L2a unbalanced as illustrated in, for example, FIG. 4 and FIG. 5 (in this case, L2a>L2b). Such unbalance between the distance L2a and the distance L2b degrades the characteristics of semiconductor elements.

That is, in a region with the short distance L2b, the distance between the trench (gate electrode GE) TR and the electric-field relaxation layer (p-type semiconductor region PRb) is short, so that an electric-field relaxation effect is increased. However, a current path is narrowed to increase on-resistance. On the other hand, in a region with the long distance L2a, the distance between the trench (gate electrode GE) TR and the electric-field relaxation layer (p-type semiconductor region PRb) is long, so that an appropriate current path can be ensured to inhibit an increase in the on-resistance. However, the electric-field relaxation effect is reduced. As described above, the on-resistance and the electric-field relaxation effect, which are in a trade-off relationship, are unbalanced between the right and left of the trench (gate electrode GE) TR, resulting in that the on-resistance increases and the electric-field relaxation effect decreases in terms of the semiconductor elements.

In contrast, according to the first embodiment, the p-type semiconductor regions (PRa and PRb or electric-field relaxation layers) are formed in a self-alignment manner by ion implantation using the dummy gate DG in the trench TR and the side wall films SW formed on both sides of the dummy gate DG as a mask as described above. This enables a reduction in the distance La between the p-type semiconductor region PRa and the trench TR and the distance Lb between the p-type semiconductor region PRb and the trench TR. Furthermore, the symmetry of the semiconductor regions with respect to the trench can be enhanced. That is, the distance between the p-type semiconductor regions PRa and PRb can be reduced, and each of the distance La and the distance Lb can be made shorter than or equal to the width W of the trench TR, which is formed to have a width close to the resolution limit. The width close to the resolution limit is, for example, 1 μm or less. This allows the semiconductor elements to be miniaturized, and the semiconductor elements can be highly integrated in the semiconductor device.

Furthermore, the on-resistance and the electric-field relaxation effect, which are in a trade-off relationship, are balanced between the right and left of the trench (gate electrode GE) TR, so that the on-resistance and the electric-field relaxation effect set in a design phase can be obtained. As described above, it is possible to improve the characteristics of the semiconductor elements.

Figure 6A:
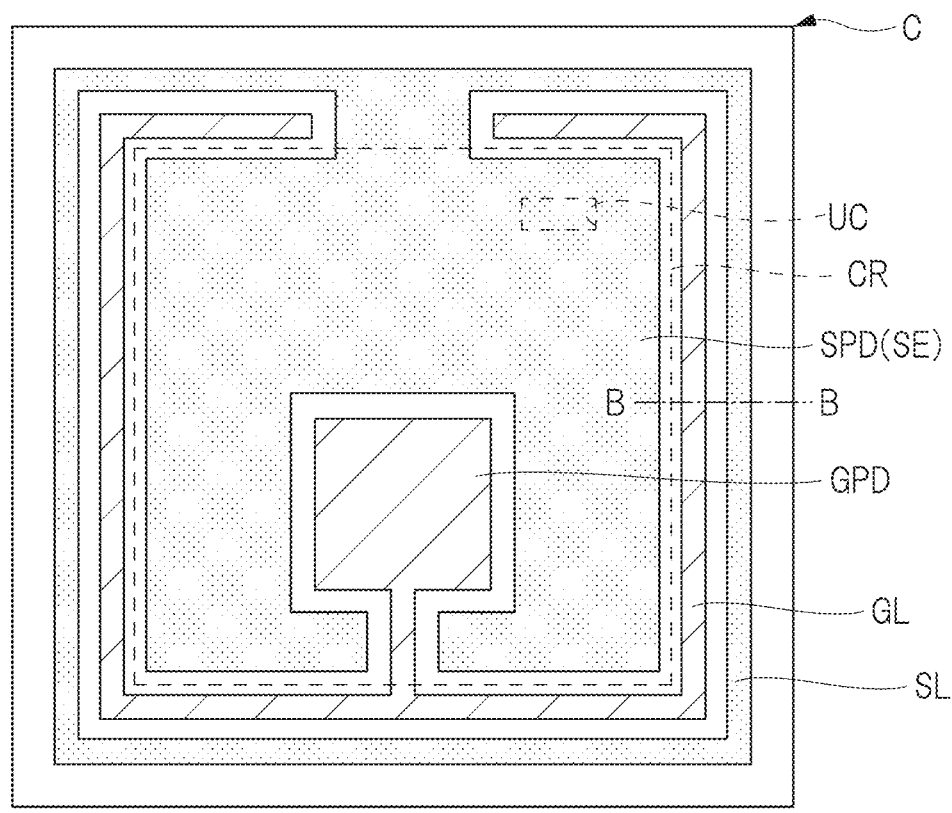
FIGS. 6A and 6B are plan views each illustrating a configuration of the semiconductor device according to the first embodiment.
Figure 6B:
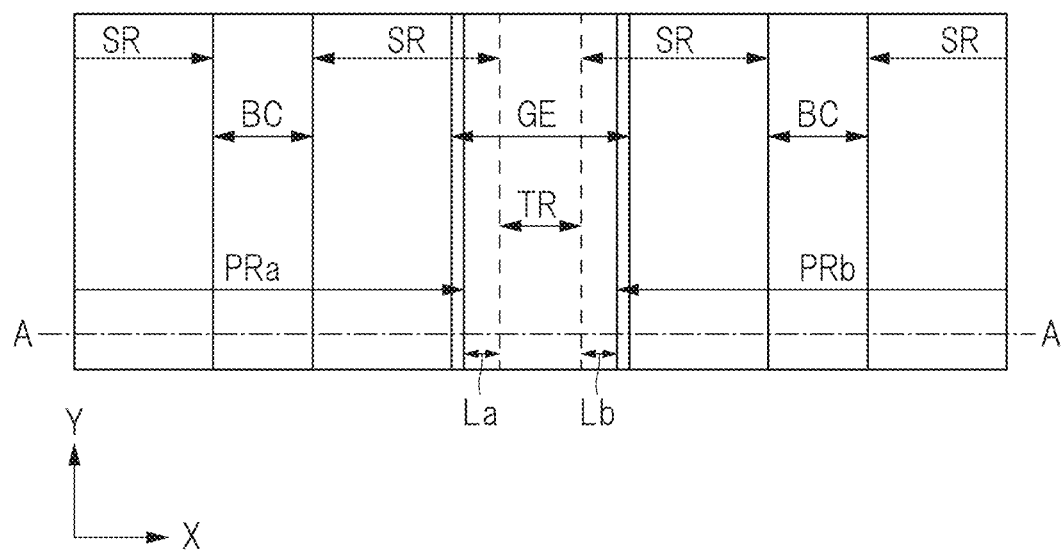

FIGS. 6A and 6B are plan views each illustrating a configuration of the semiconductor device according to the first embodiment. The region UC illustrated in FIG. 1 corresponds to, for example, the region UC illustrated in FIG. 6A, and FIG. 1 corresponds to a cross section taken along line A-A in FIG. 6B.

As illustrated in FIG. 6B, the gate electrode GE is planarly shaped like a rectangle with long sides in a Y direction. The trench TR is planarly shaped like a rectangle with long sides in the Y direction. The source region SR is arranged on both sides of the trench TR. The source region SR is planarly shaped like a rectangle with long sides in the Y direction. Each of the body contact regions BC is arranged outside the source region SR. The body contact region BC is planarly shaped like a rectangle with long sides in the Y direction.

As described above, like the trench TR and the gate electrode GE, the p-type semiconductor regions (PRa and PRb) extend in the Y direction (the direction perpendicular to the page of FIG. 1). As illustrated in FIG. 6B, the p-type semiconductor regions PRa and PRb are arranged at a predetermined interval from each other. The unit transistors UC are repeatedly arranged in the X direction.

Figure 7:
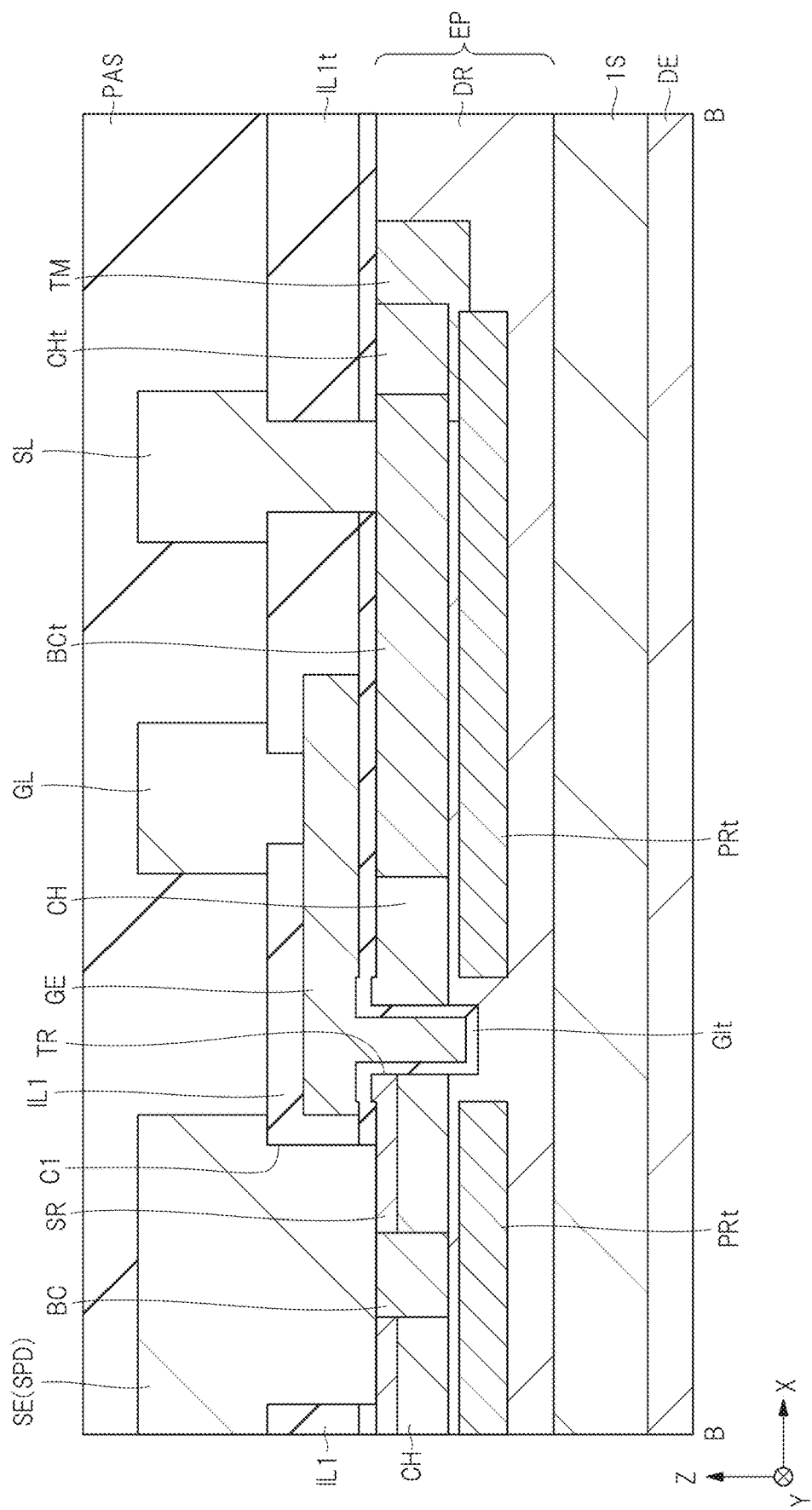
FIG. 7 is a cross-sectional view illustrating an example of a peripheral configuration of the semiconductor device according to the first embodiment.

The source electrode SE is arranged to extend over the gate electrode GE as illustrated in FIG. 1 and FIG. 6A. FIG. 7 is a cross-sectional view illustrating an example of a peripheral configuration of the semiconductor device according to the first embodiment, and corresponds to a cross section taken along line B-B in FIG. 6A. Furthermore, although not illustrated in the cross section in FIG. 1, a gate line GL and a gate pad GPD that are connected to the gate electrode GE are provided (see FIG. 6A and FIG. 7). The gate line GL and the gate pad GPD can be formed of a conductive film in the same layer as that of the source electrode SE. Furthermore, although not illustrated in the cross section in FIG. 1, a source line SL that is connected to the source electrode SE is provided (see FIG. 6A and FIG. 7). The source line SL can be formed of a conductive film in the same layer as that of the source electrode SE. PRt represents a semiconductor region formed in the same layer as that of the p-type semiconductor regions (PRa and PRb), BCt represents a semiconductor region formed in the same layer as that of the body contact region BC, and CHt represents a semiconductor region formed in the same layer as that of the channel layer CH. Furthermore, TM represents a p-type semiconductor region provided around an outer periphery of a cell region CR. Note that the peripheral configuration illustrated in FIG. 7 is just an example and another configuration may be used.

<Operation>

In the semiconductor device (transistor) according to the first embodiment, when a gate voltage higher than or equal to a threshold voltage is applied to the gate electrode GE, an inversion layer (n-type semiconductor region) is formed in the channel layer (p-type semiconductor region) CH that is in contact with side surfaces of the trench TR. Thus, the source region SR and the drift layer DR are electrically connected by the inversion layer, and when a potential difference is present between the source region SR and the drift layer DR, electrons flow from the source region SR through the inversion layer to the drift layer DR. In other words, a current flows from the drift layer DR through the inversion layer to the source region SR. The transistor can be turned on in this manner.

On the other hand, when a voltage lower than the threshold voltage is applied to the gate electrode GE, the inversion layer formed in the channel layer CH disappears, making the source region SR and the drift layer DR electrically discontinuous. The transistor can be turned off in this manner.

As described above, the ON/OFF operation of the transistor is performed by changing the gate voltage applied to the gate electrode GE of the transistor.

[Description of Manufacturing Method]

Next, a manufacturing method of the semiconductor device according to the first embodiment will be described with reference to FIGS. 8 to 21, and a configuration of the semiconductor device will be further clarified. FIGS. 8 to 21 are cross-sectional views illustrating a manufacturing process of the semiconductor device according to the first embodiment.

Figure 8:
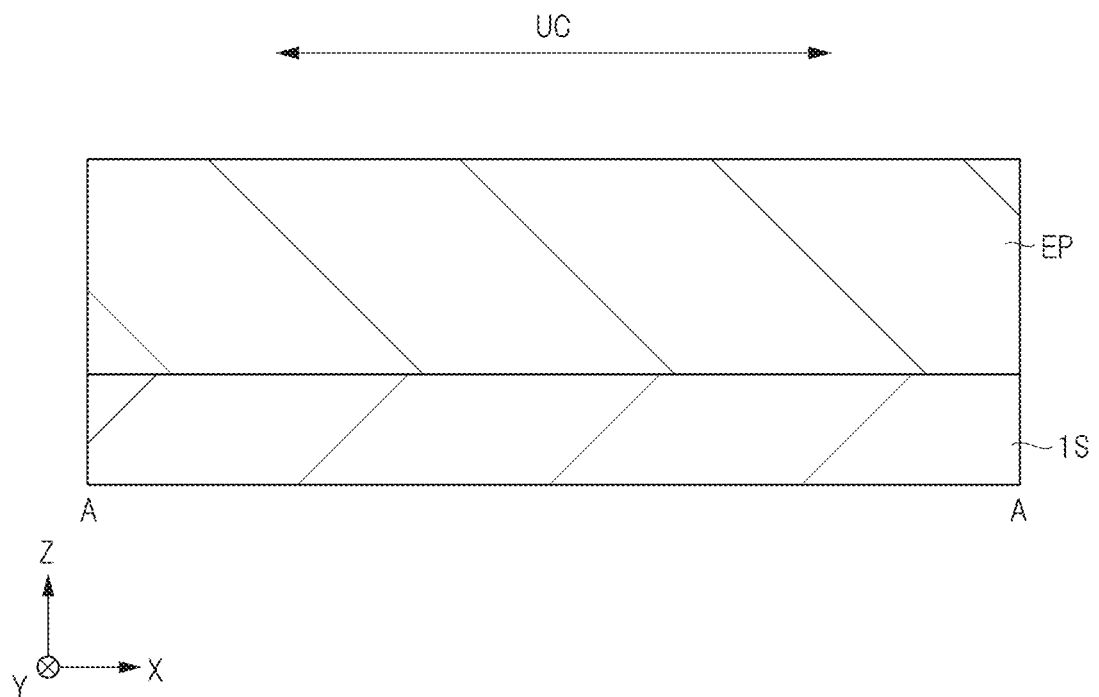
FIG. 8 is a cross-sectional view illustrating the manufacturing process of the semiconductor device according to the first embodiment.

First, as illustrated in FIG. 8, the SiC substrate (a semiconductor substrate or a wafer made of SiC) 1S on which the epitaxial layer EP made of SiC is formed is prepared.

A method of forming the epitaxial layer EP on the SiC substrate 1S is not limited, but the epitaxial layer EP can be formed as follows. For example, an n-type epitaxial layer made of SiC is grown on the SiC substrate 1S while introducing n-type impurities such as nitrogen (N) or phosphorus (P), thereby forming the epitaxial layer EP. The drift layer DR is provided below the epitaxial layer EP.

Figure 9:
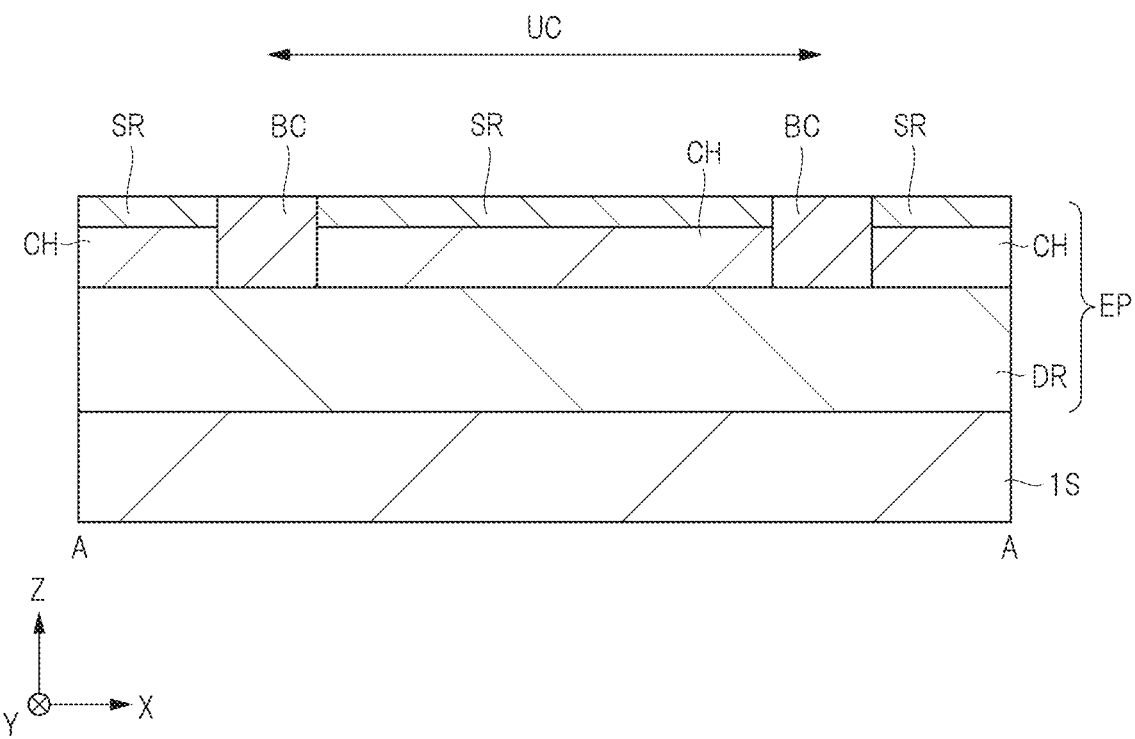
FIG. 9 is a cross-sectional view illustrating the manufacturing process of the semiconductor device according to the first embodiment.

Then, as illustrated in FIG. 9, a p-type semiconductor region serving as the channel layer CH and an n-type semiconductor region serving as the source region SR are formed by ion implantation. Furthermore, p-type semiconductor regions serving as the body contact regions BC are formed by ion implantation. For example, p-type impurities (aluminum (Al), boron (B), or the like) are ion-implanted into an upper portion of the epitaxial layer EP to form the p-type semiconductor region (channel layer CH), and n-type impurities (nitrogen (N), phosphorus (P), or the like) are subsequently ion-implanted into an upper portion of the p-type semiconductor region (channel layer CH) to form the n-type semiconductor region (source region SR). The concentration of the n-type impurities in the source region SR is higher than the concentration of the p-type impurities in the epitaxial layer (drift layer DR) EP. Next, p-type impurities are selectively ion-implanted into a stacked portion of the p-type semiconductor region (channel layer CH) and the n-type semiconductor region (source region SR) to form the p-type semiconductor regions (body contact regions BC). The concentration of the p-type impurities in the body contact regions BC is higher than the concentration of the p-type impurities in the channel layer CH. In the ion implantation step, the impurities are ion-implanted with using a photoresist film or a hard mask as a mask. Furthermore, in the ion implantation step, the impurity concentration, an implantation depth of the impurities, and the like can be accurately controlled by using the multi-stage ion implantation. The multi-stage ion implantation is a method of performing ion implantation a plurality of times for each predetermined depth while adjusting the implantation energy and the impurity concentration.

Then, as illustrated in FIG. 10, the trench TR that penetrates the source region SR and the channel layer CH to reach the drift layer DR is formed.

For example, an insulating film (for example, a plasma TEOS film with a film thickness of approximately 4 μm) IF1 having an opening in a formation region of the trench TR is formed on the epitaxial layer EP by using a photolithography technique and an etching technique. Next, the source region SR, the channel layer CH, and an upper portion of the drift layer DR are etched with using the insulating film (hard mask) IF1 as a mask to form the trench TR with a width of approximately 0.8 μm and a depth of approximately 1.5 μm. The drift layer DR, the channel layer CH, the source region SR, and the insulating film IF1 are exposed to the side surfaces of the trench TR in this order from bottom to top. Furthermore, the drift layer DR is exposed to a bottom surface of the trench TR.

Figure 12:
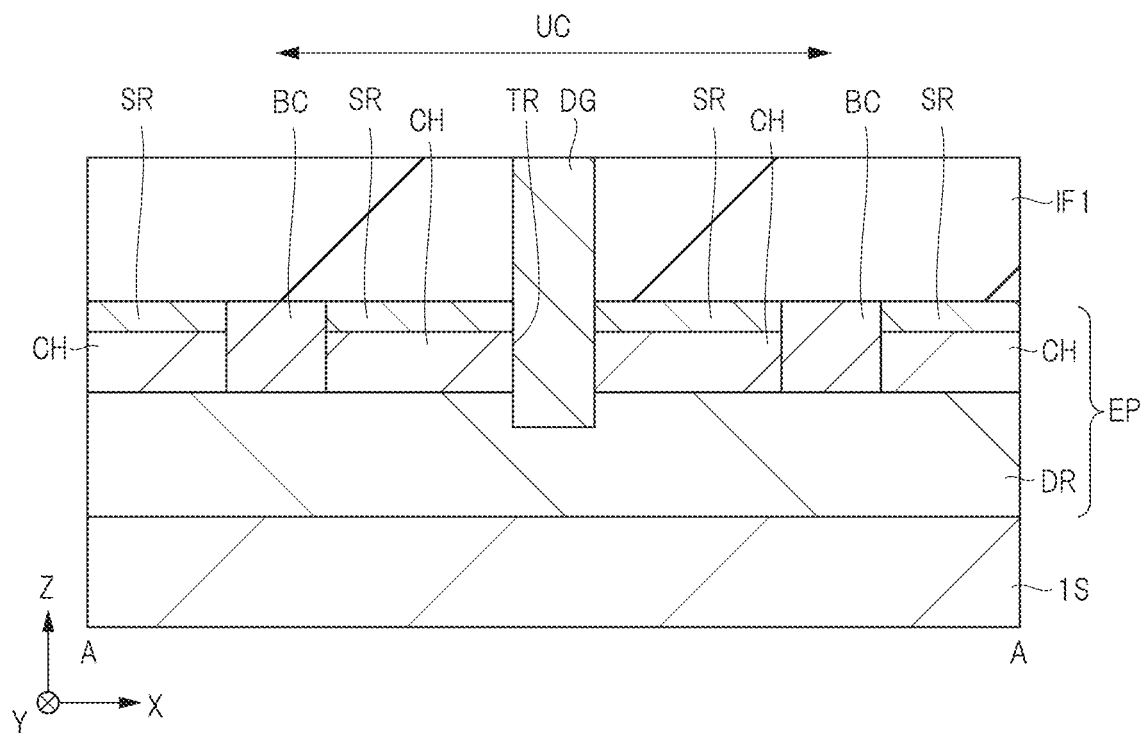
FIG. 12 is a cross-sectional view illustrating the manufacturing process of the semiconductor device according to the first embodiment.
Figure 13:
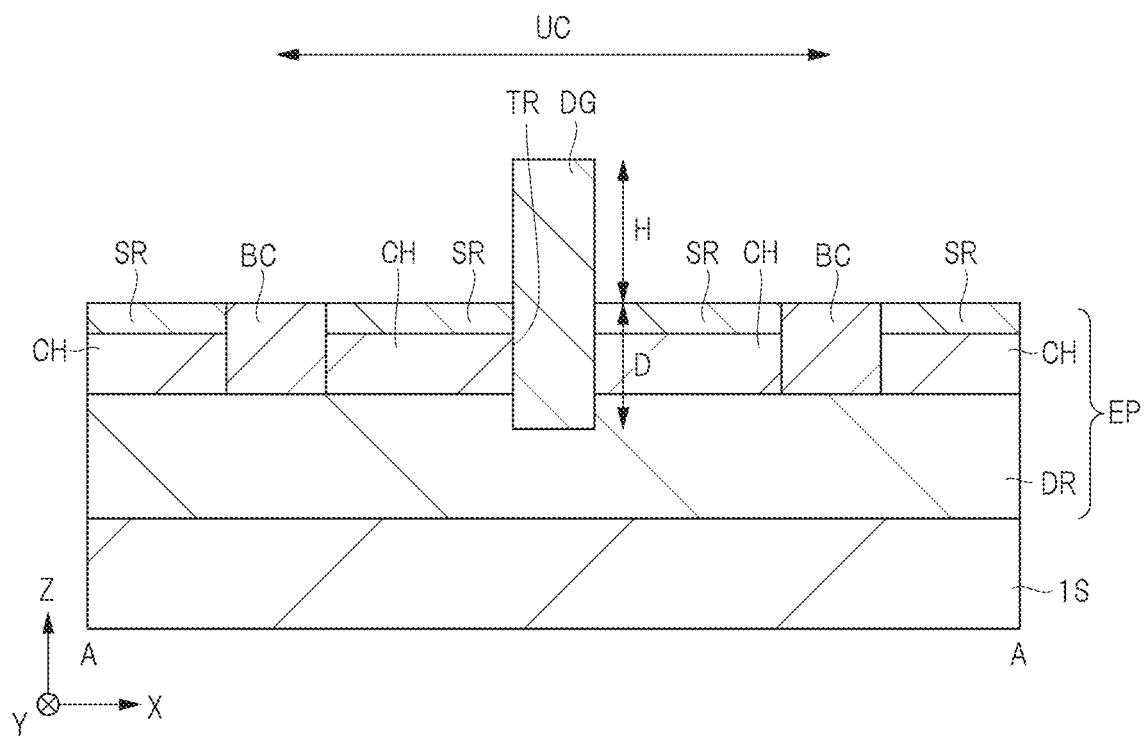
FIG. 13 is a cross-sectional view illustrating the manufacturing process of the semiconductor device according to the first embodiment.

Then, as illustrated in FIGS. 11 to 13, the dummy gate DG that is provided in the trench TR and protrudes upward from the trench TR is formed. First, as illustrated in FIG. 11, a polycrystalline silicon film PS is deposited as a dummy gate material in the trench TR and on the insulating film IF1 so as to have a film thickness sufficient to fill the trench TR (for example, a film thickness of approximately 1 μm) by chemical vapor deposition (CVD) or the like. Then, as illustrated in FIG. 12, an upper portion of the polycrystalline silicon film PS is polished by chemical mechanical polishing (CMP) or the like until the insulating film IF1 is exposed. The dummy gate DG is formed in this manner. The polishing by the CMP may be replaced with etch-back. Next, as illustrated in FIG. 13, the insulating film IF1 is removed by the etching technique. For example, wet etching using diluted HF is performed. As a result, the dummy gate DG that is embedded in the trench TR and protrudes from a front surface of the epitaxial layer (source region SR) EP by a distance equivalent to the film thickness of the insulating film IF1 can be formed. A height H of a portion (protruding portion) of the dummy gate DG that protrudes from the front surface of the epitaxial layer (source region SR) EP is at least 1.5 times, more preferably, at least 1.8 times as large as a depth D of the trench TR. By ensuring the height of the protruding portion as described above, control of a width (a length in the X direction) of each of the side wall films SW described below can be facilitated.

Figure 14:
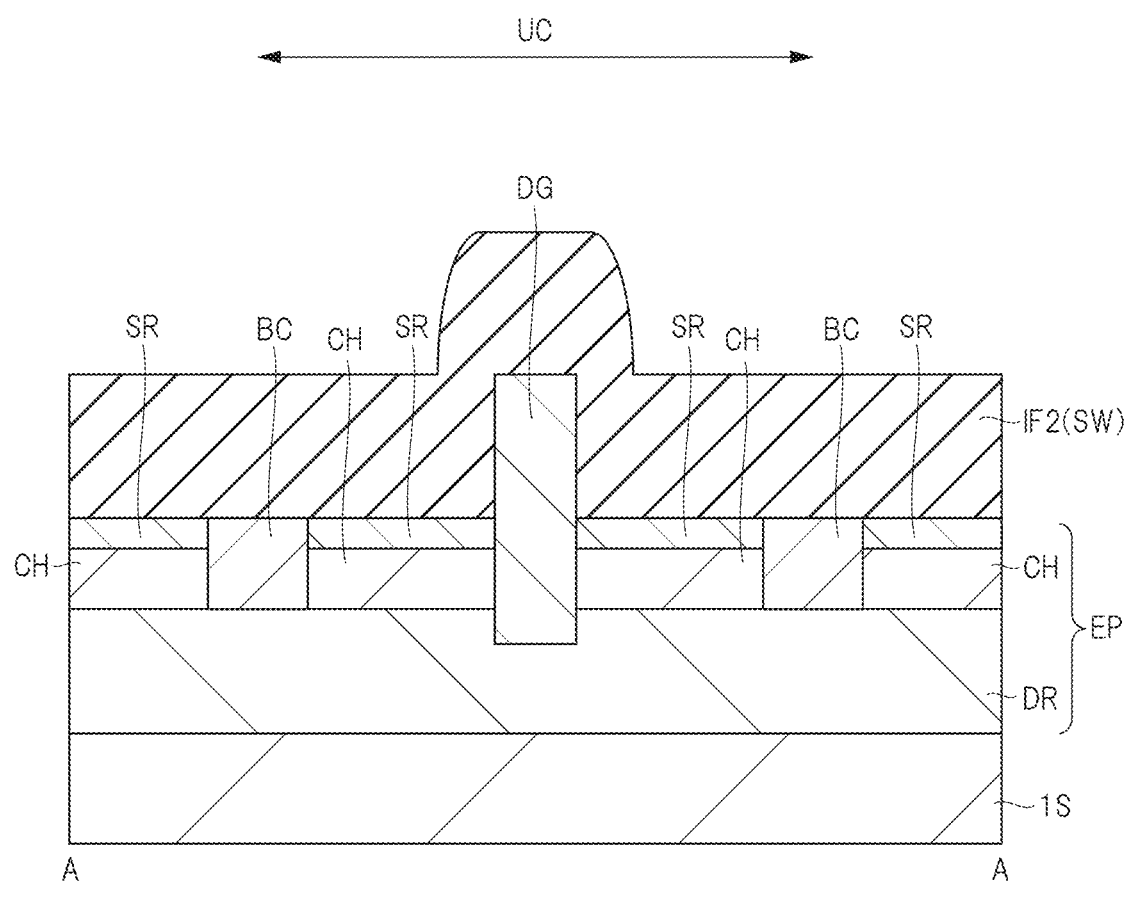
FIG. 14 is a cross-sectional view illustrating the manufacturing process of the semiconductor device according to the first embodiment.
Figure 15:
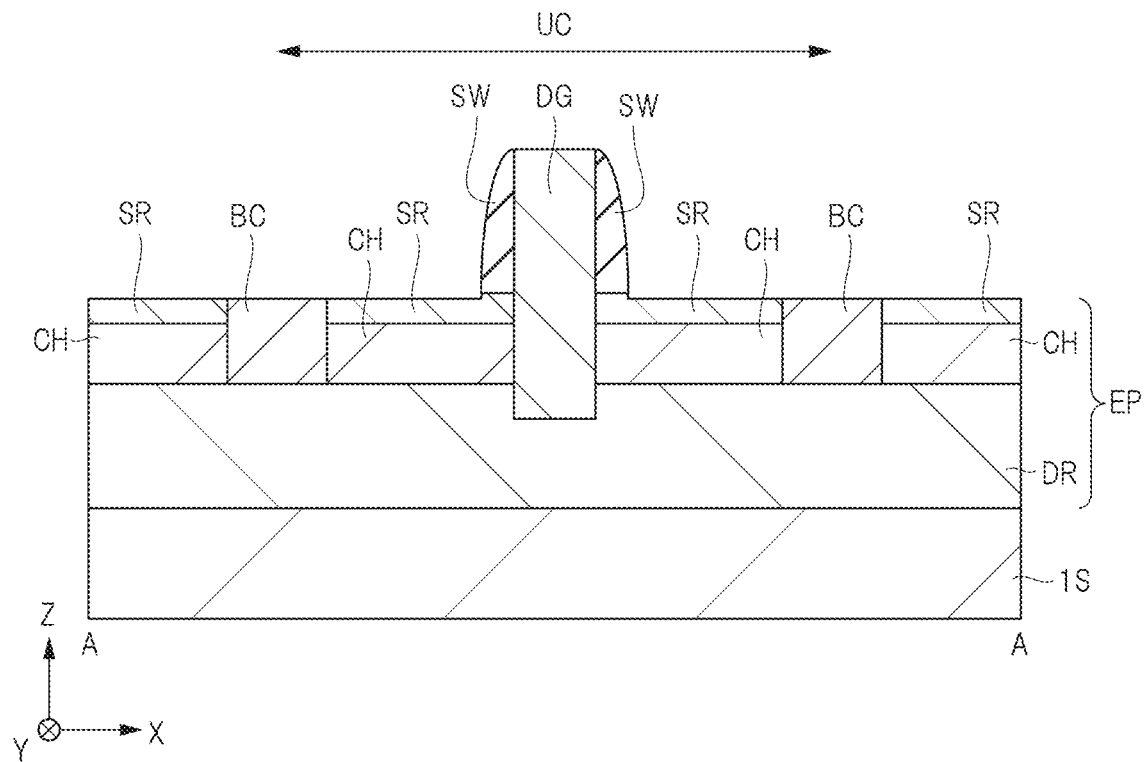
FIG. 15 is a cross-sectional view illustrating the manufacturing process of the semiconductor device according to the first embodiment.
Figure 16:
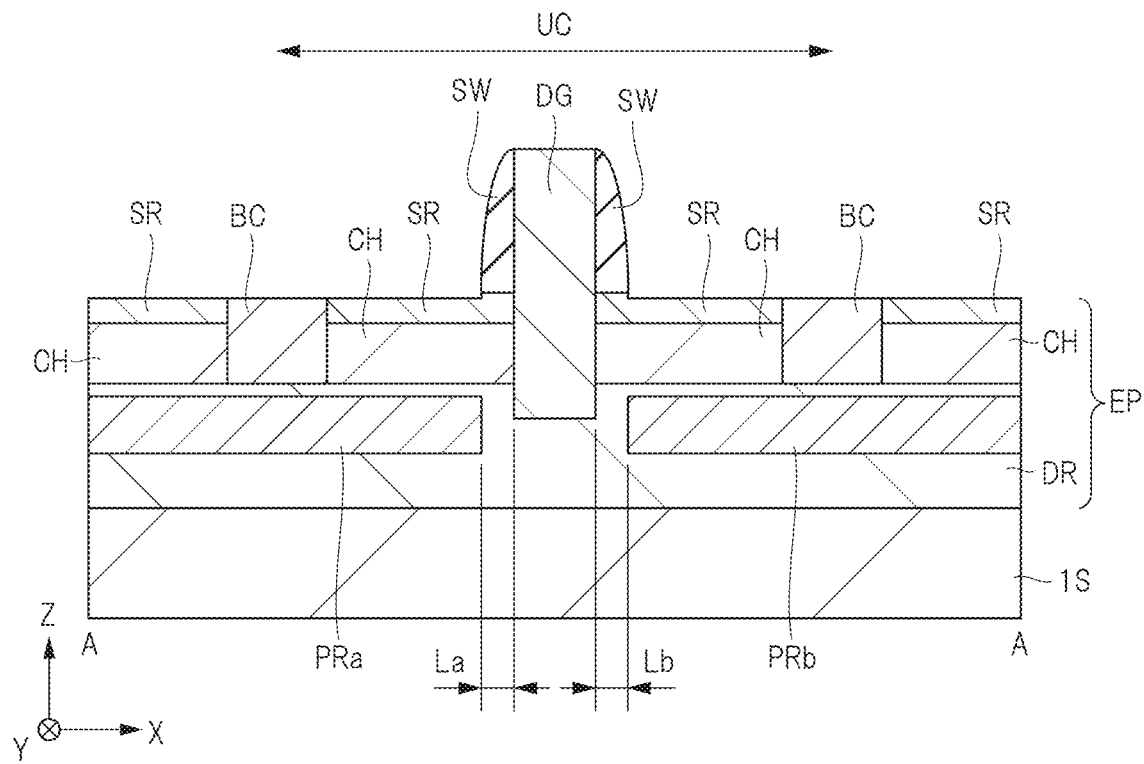
FIG. 16 is a cross-sectional view illustrating the manufacturing process of the semiconductor device according to the first embodiment.

Next, as illustrated in FIGS. 14 to 16, the p-type semiconductor regions (PRa and PRb) are formed in the drift layer DR on both sides of the trench TR. First, as illustrated in FIG. 14, an insulating film (for example, a silicon oxide film) IF2 for forming the side wall films SW is formed on the epitaxial layer (source region SR) EP and on the dummy gate DG by using CVD or the like. Then, the insulating film IF2 is etched back as illustrated in FIG. 15. In the etch-back step, the insulating film IF2 is removed by anisotropic dry etching from a front surface thereof by a predetermined film thickness. This step allows the insulating film IF2 to remain like side walls on the side wall portions on both sides of the protruding portion of the dummy gate DG to form the side wall films SW. The width (the length in the X direction) of each of the side wall films SW can be controlled by the film thickness of the insulating film IF2 and etch-back conditions.

In this case, over-etching may be performed to slightly etch the front surface of the epitaxial layer (source region SR) EP on both sides of the side wall films SW. In this case, a step difference is generated between the front surface of the epitaxial layer (source region SR) EP covered with the side wall films SW and the front surface of the epitaxial layer (source region SR) EP located outside the side wall films SW. By slightly etching the front surface of the epitaxial layer (source region SR) EP as described above, front surface portions of the epitaxial layer (source region SR) EP in which the n-type impurities are likely to have a low concentration can be removed, and connection resistance between the source electrode SE and the source region SR or each of the body contact regions BC described later can be reduced. In particular, when the source region SR and the body contact regions BC are formed by ion implantation, a concentration gradient of the impurity ions is likely to occur, and the diffusion (uniformization) of the impurities by thermal treatment is less likely to be achieved in the SiC layer (the epitaxial layer made of SiC). Thus, the effect of reduction in the connection resistance between the source electrode SE and the source region SR obtained by slightly etching the front surface of the epitaxial layer (source region SR) EP is great.

Next, as illustrated in FIG. 16, the p-type semiconductor regions (PRa and PRb) are formed by ion implantation. For example, p-type impurities such as aluminum (Al) or boron (B) are implanted into the drift layer DR with using the dummy gate DG and the side wall films SW as a mask. During the ion implantation, ion implantation conditions such as ion implantation energy are adjusted such that each of the p-type semiconductor regions (PRa and PRb) is located at the position deeper than the lower surface of the channel layer CH. The above-described multi-stage implantation may be used to form the p-type semiconductor regions (PRa and PRb).

The p-type semiconductor regions (PRa and PRb) preferably extend to a position deeper than a lower end of the trench TR. In this case, an upper surface of each of the p-type semiconductor regions (PRa and PRb) is located at a position higher than the bottom surface of the trench TR. Furthermore, a lower surface of each of the p-type semiconductor regions (PRa and PRb) is located at a position lower than the bottom surface of the trench TR. In other words, the trench TR and the p-type semiconductor regions (PRa and PRb) are arranged at overlapping positions in a depth direction (Z direction).

Also, in this step, the p-type semiconductor regions (PRa and PRb or electric-field relaxation layers) are formed by ion implantation using the dummy gate DG in the trench TR and the side wall films SW formed on both sides of the dummy gate DG as a mask as described above. Therefore, it is possible to reduce the distance La between the p-type semiconductor region PRa and the trench TR and the distance Lb between the p-type semiconductor region PRb and the trench TR. Furthermore, the symmetry of the semiconductor regions with respect to the trench can be enhanced. That is, the distance between the p-type semiconductor regions PRa and PRb can be reduced, and for example, each of the distance La and the distance Lb can be made shorter than or equal to the width W of the trench TR, which is formed to have a width close to the resolution limit.

Figure 17:
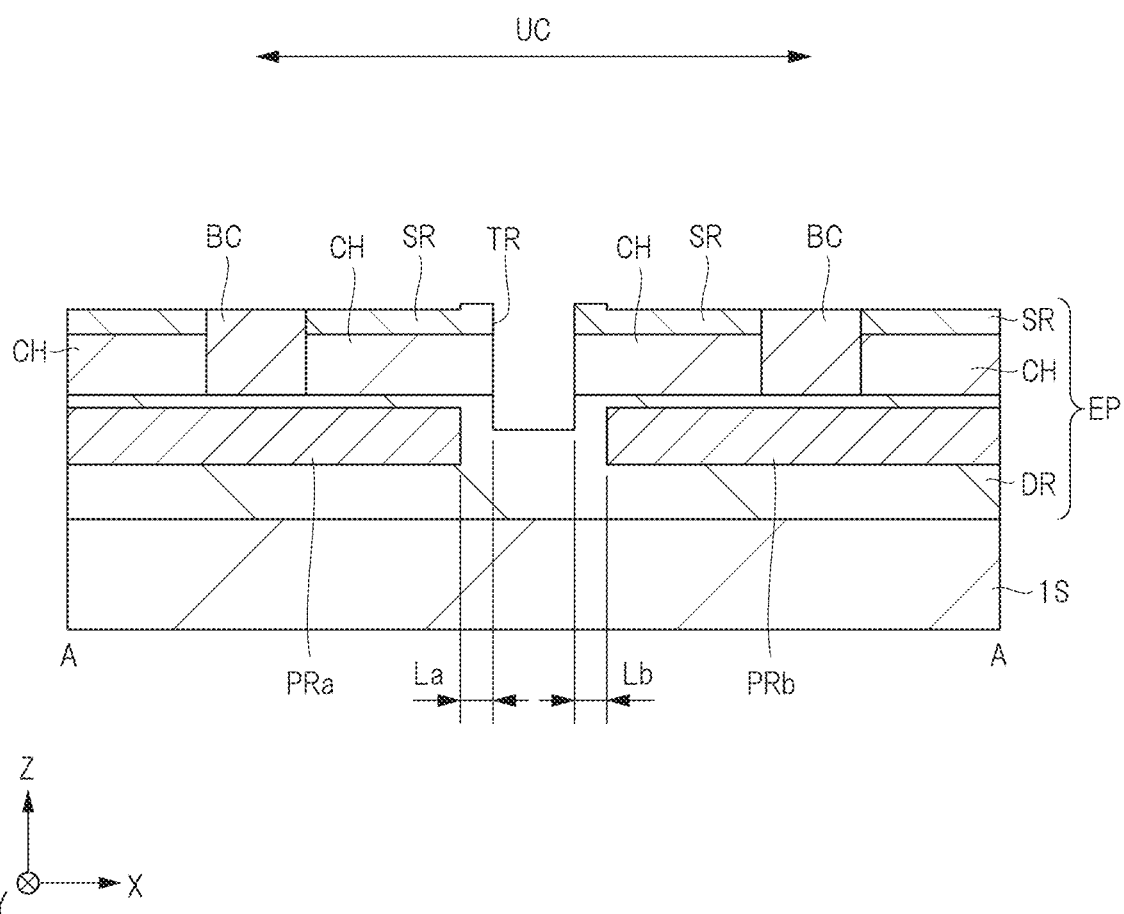
FIG. 17 is a cross-sectional view illustrating the manufacturing process of the semiconductor device according to the first embodiment.

Then, as illustrated in FIG. 17, the dummy gate DG and the side wall films SW are removed by the etching technique. For example, the side wall films SW are removed by wet etching using diluted HF, and the dummy gate DG is removed by wet etching using nitric-hydrofluoric acid.

In the above-described step, the polycrystalline silicon film PS is used as a dummy gate material. However, another material exhibiting appropriate etching selectivity with respect to the insulating film IF2 may be used when the side wall films SW are formed. The expression "exhibit appropriate etching selectivity" means the condition in which a sufficient difference in etching rate is present between the films (the insulating film IF2 and the dummy gate DG) in the etching step. When the side wall films SW are formed, the etching rate of the dummy gate DG is lower than the etching rate of the insulating film IF2. For example, Si, N, W, or Al may be used as the dummy gate material other than polycrystalline silicon.

Then, thermal treatment (activation annealing) is performed to activate the already implanted impurities. For example, thermal treatment is performed at 1700° C. At this time, a protection film made of amorphous carbon may be formed on the SiC substrate 1S for thermal treatment.

Figure 18:
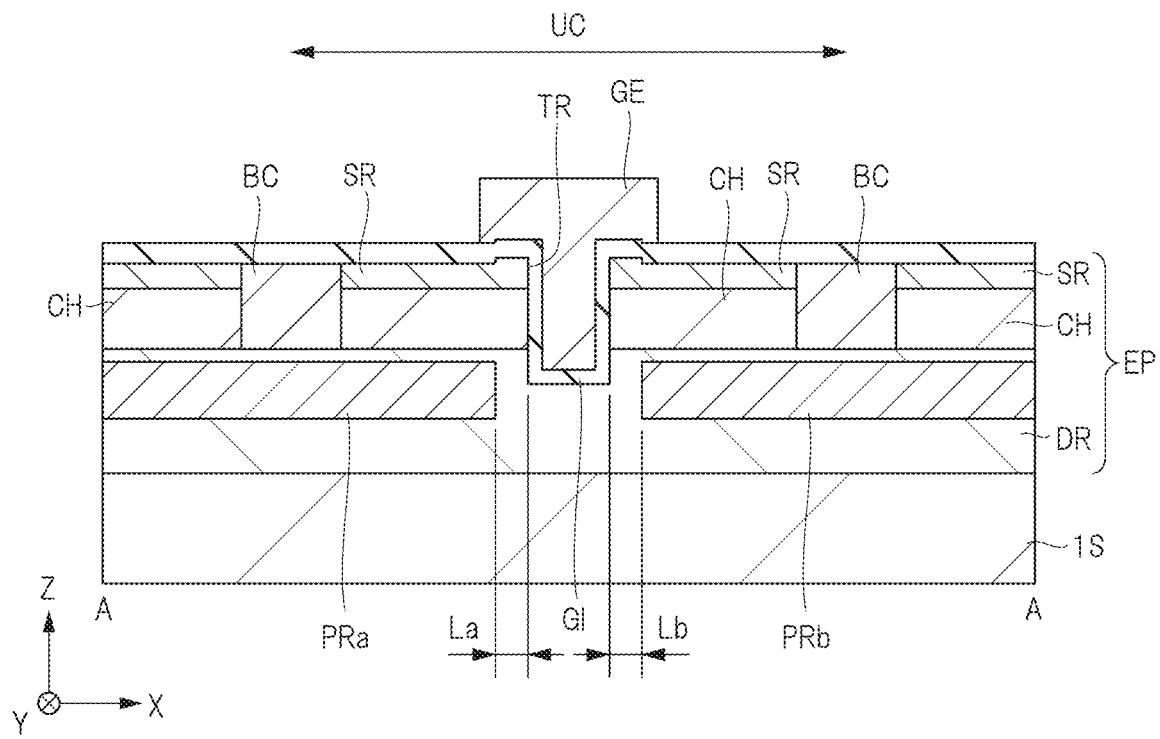
FIG. 18 is a cross-sectional view illustrating the manufacturing process of the semiconductor device according to the first embodiment.

Then, as illustrated in FIG. 18, a silicon oxide film as the gate insulating film GI is formed on, for example, an inner wall of the trench TR, the source region SR, and the body contact regions BC by atomic layer deposition (ALD) or the like. The epitaxial layer EP exposed in the trench TR may be subjected to thermal oxidation or thermal oxinitridation to form the gate insulating film GI. Furthermore, a high-dielectric-constant film such as an aluminum oxide film or a hafnium oxide film which has a higher dielectric constant than a silicon oxide film may be used as the gate insulating film GI other than a silicon oxide film or a silicon oxynitride film.

Then, the gate electrode GE which is arranged on the gate insulating film GI and with which the trench TR is to be filled is formed. For example, a polycrystalline silicon film is deposited as a conductive film for forming the gate electrode GE by CVD or the like. Next, a photoresist film (not illustrated in the drawings) covering a formation region of the gate electrode GE is formed on the conductive film, and the conductive film is etched with using the photoresist film as a mask. The gate electrode GE is formed in this manner.

Figure 19:
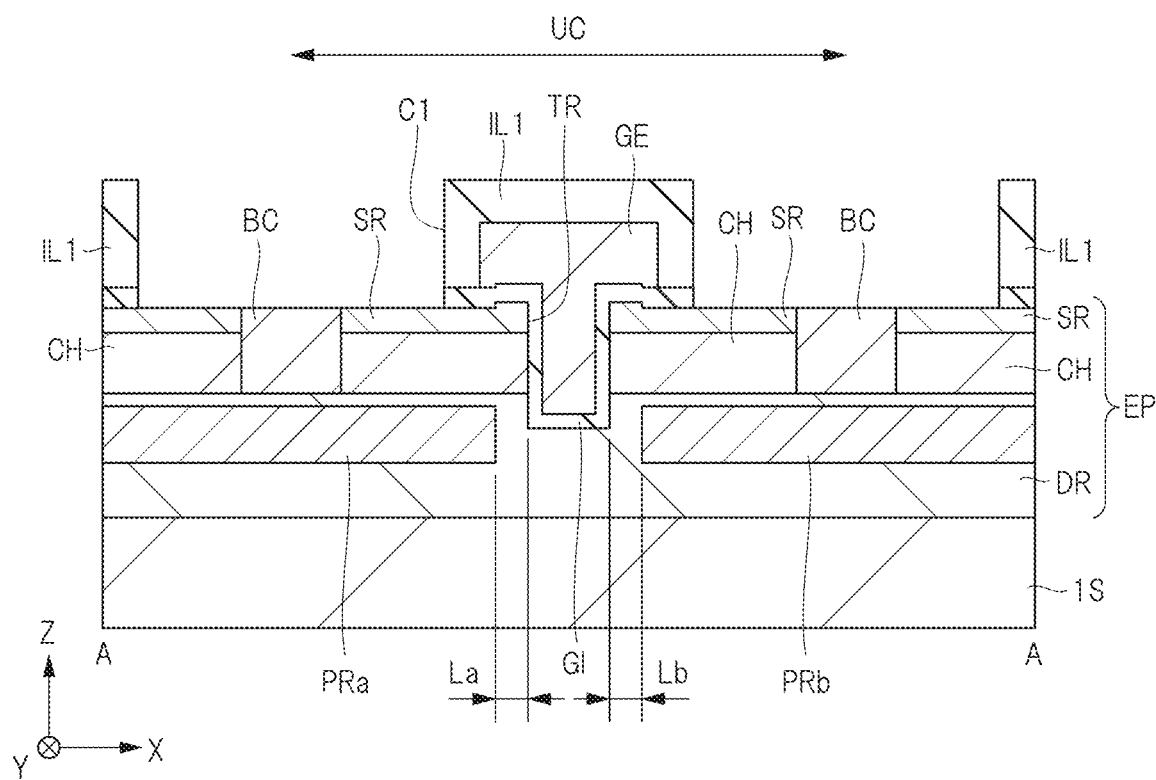
FIG. 19 is a cross-sectional view illustrating the manufacturing process of the semiconductor device according to the first embodiment.

Then, as illustrated in FIG. 19, the interlayer insulating film IL1 covering the gate electrode GE is formed, and the contact holes C1 are formed.

For example, a silicon oxide film is deposited as the interlayer insulating film IL1 on the gate insulating film GI and the gate electrode GE by the CVD. Then, a photoresist film (not illustrated in the drawings) having openings above each of the body contact regions BC and portions of the source region SR on both sides of the body contact regions BC is formed on the interlayer insulating film IL1. Then, the interlayer insulating film IL1 and the gate insulating film GI located below the interlayer insulating film IL1 are etched with using the photoresist film as a mask, thereby forming the contact holes C1. The body contact region BC and the portions of the source region SR on both sides of the body contact region BC are exposed on a bottom surface of the corresponding contact hole C1. Also, the interlayer insulating film IL1 on the gate electrode GE, which is not illustrated in the cross section in FIG. 19, is removed to form a contact hole (not illustrated in the drawings) on the gate electrode GE.

Figure 20:
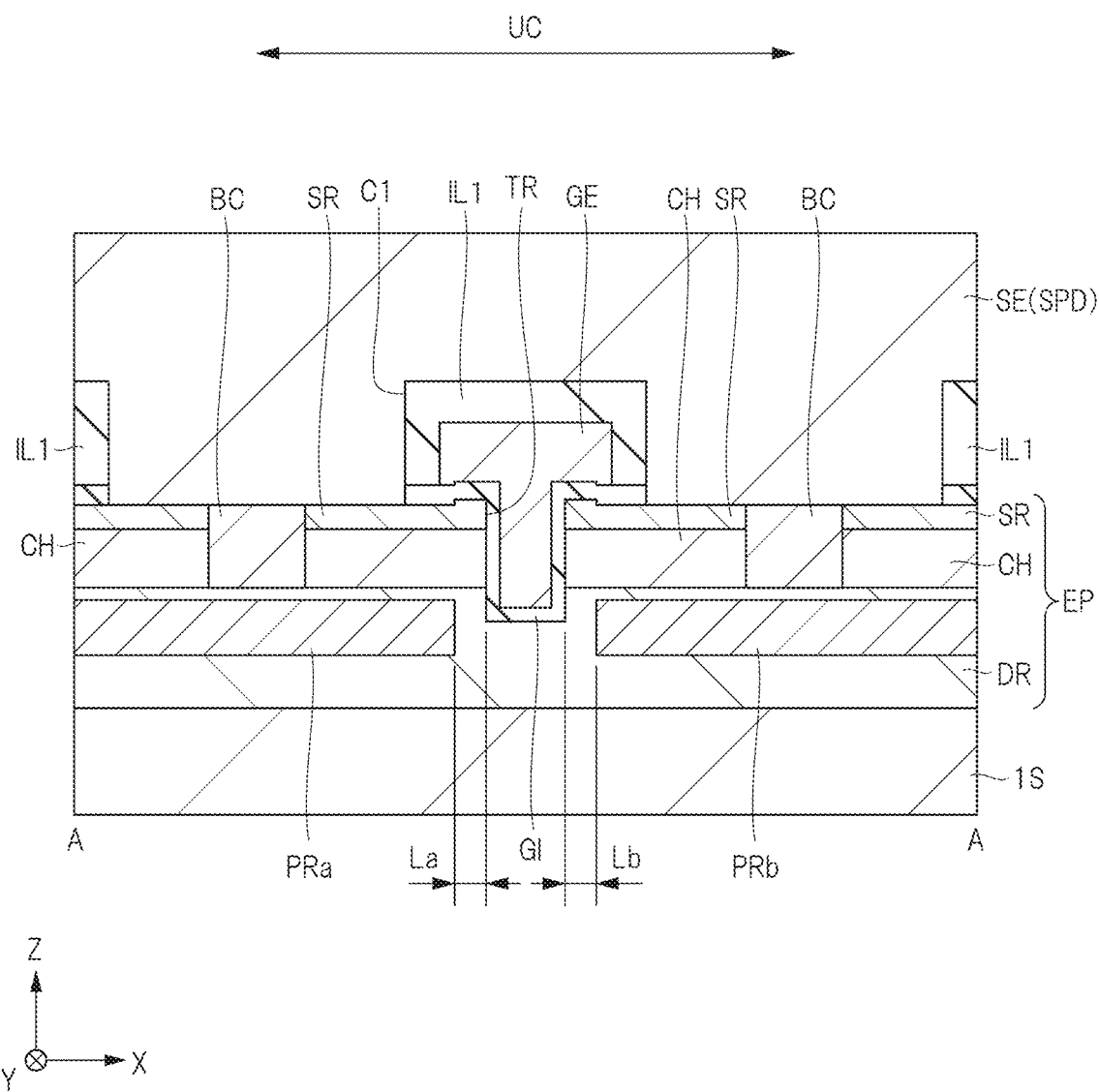
FIG. 20 is a cross-sectional view illustrating the manufacturing process of the semiconductor device according to the first embodiment.

Then, as illustrated in FIG. 20, the source electrode SE is formed. For example, a TiN film is formed as a barrier metal film (not illustrated in the drawings) in each of the contact holes C1 and on the interlayer insulating film IL1 by sputtering or the like. Next, an AlSi film is formed as a conductive film on the barrier metal film (not illustrated in the drawings) by sputtering or the like. The stacked film of the barrier metal film (not illustrated in the drawings) and the conductive film (Al film) is then patterned to form the source electrode SE. At this time, the gate line GL and the gate pad GPD not illustrated in the cross section in FIG. 20 are formed (see FIG. 6A and FIG. 7). The source electrode SE and the like may be formed after a silicide film is formed on the bottom surface of each of the contact holes C1.

Figure 21:
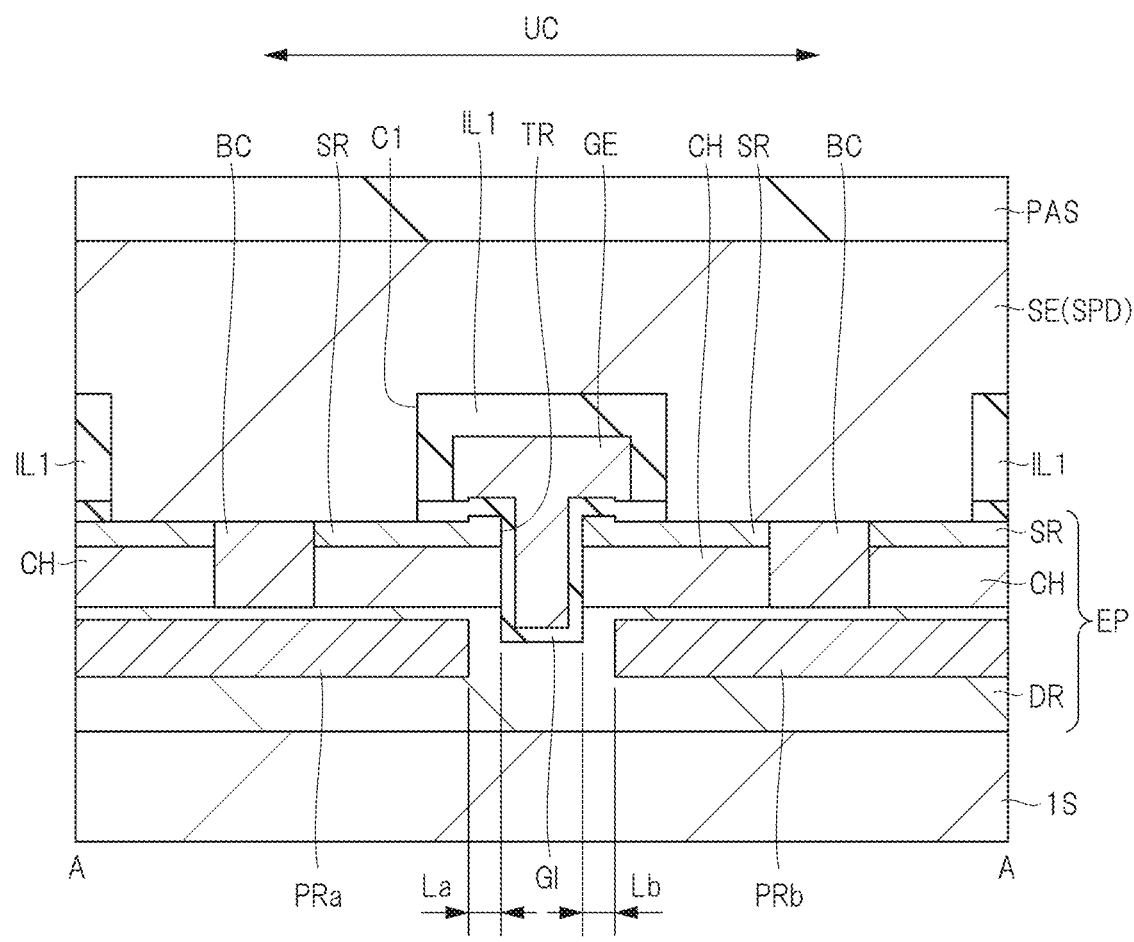
FIG. 21 is a cross-sectional view illustrating the manufacturing process of the semiconductor device according to the first embodiment.

Next, as illustrated in FIG. 21, the surface protection film PAS is formed to cover the source electrode SE, the gate line GL, and the gate pad GPD. For example, a silicon oxide film is deposited as the surface protection film PAS on the source electrode SE and the like by the CVD or the like. Then, the surface protection film PAS is patterned to expose a partial region (source pad SPD) of the source electrode SE and a partial region of the gate pad GPD. These exposed portions form external connection regions (pads).

Next, the SiC substrate 1S is placed such that a back surface (second surface) of the SiC substrate 1S opposite to a main surface of the SiC substrate 1S faces upward, and the back surface of the SiC substrate 1S is ground to thin the SiC substrate 1S.

Next, the drain electrode DE is formed on the back surface of the SiC substrate 1S (FIG. 1). For example, the SiC substrate 1S is placed such that the back surface of the SiC substrate 1S faces upward, and a metal film is formed on the back surface side of the SiC substrate 1S. For example, a Ti film, an Ni film, and an Au film are sequentially formed by sputtering. In this manner, the drain electrode DE made of a metal film can be formed. Note that a silicide film may be formed between the metal film and the SiC substrate 1S. Thereafter, the SiC substrate (wafer) 1S including a plurality of chip regions is cut into the respective chip regions.

Through the steps described above, the semiconductor device according to the first embodiment can be formed.

As described above, since the p-type semiconductor regions (PRa and PRb or electric-field relaxation layers) are formed by ion implantation using the dummy gate DG in the trench and the side wall films SW formed on both sides of the dummy gate DG as a mask in the first embodiment, it is possible to reduce the distance La between the p-type semiconductor region PRa and the trench TR and the distance Lb between the p-type semiconductor region PRb and the trench TR. This enables the semiconductor elements to be miniaturized, and the semiconductor elements can be highly integrated in the semiconductor device.

Furthermore, since the symmetry of the p-type semiconductor regions PRa and PRb with respect to the trench can be enhanced, the on-resistance and the electric-field relaxation effect, which are in a trade-off relationship, are balanced, so that the on-resistance and the electric-field relaxation effect set in a design phase can be obtained. As described above, it is possible to improve the characteristics of the semiconductor elements.

Moreover, since the distance La between the p-type semiconductor region PRa and the trench TR and the distance Lb between the p-type semiconductor region PRb and the trench TR can be reduced in the first embodiment, the on-resistance can be reduced by improving the impurity concentration of the drift layer (epitaxial layer EP) DR.

Figure 22:
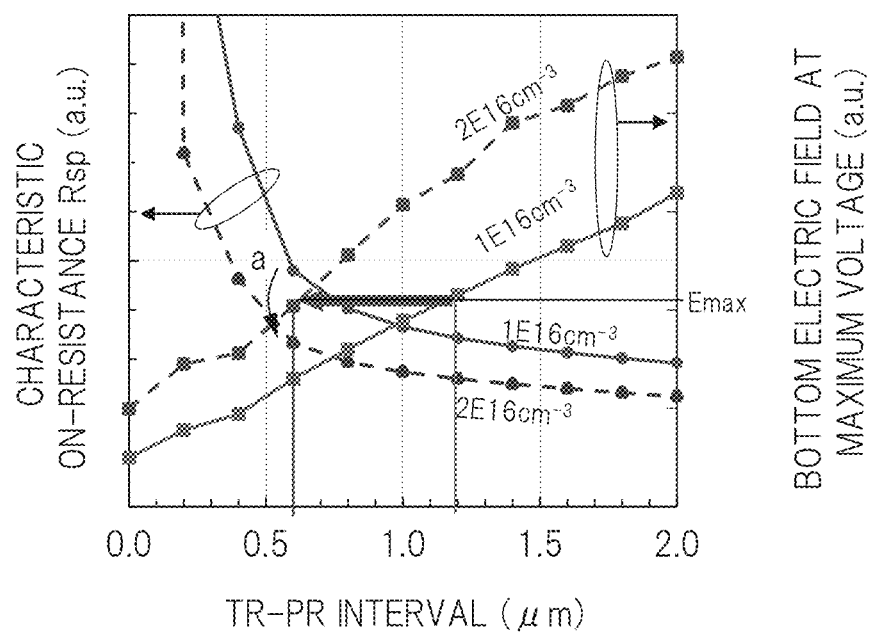
FIG. 22 is a graph illustrating a relationship between an impurity concentration in a drift layer and an interval between a trench and a p-type semiconductor region.

FIG. 22 is a graph illustrating a relationship between the interval between the trench TR and the p-type semiconductor region PR (the TR-PR interval or the distance La or Lb) and the impurity concentration of the drift layer (epitaxial layer EP) DR. The horizontal axis represents the interval between the trench TR and the p-type semiconductor region PR (distance La or Lb (μm)). Furthermore, the left vertical axis represents the on-resistance (characteristic on-resistance Rsp (a.u.)) and the right vertical axis represents a bottom electric field in the trench (the bottom electric field at the maximum voltage (a.u.)).

Figure 23:
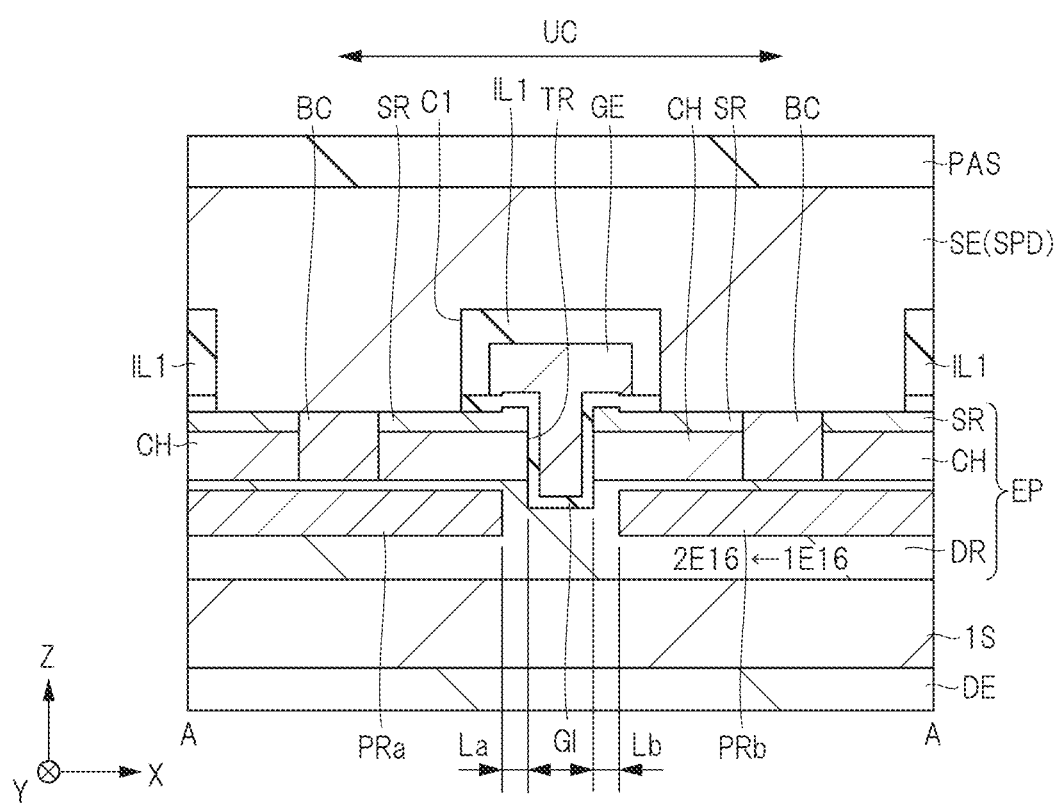
FIG. 23 is a cross-sectional view illustrating a semiconductor device in which the impurity concentration of the drift layer is increased.

FIG. 23 is a cross-sectional view of the semiconductor device in which the impurity concentration of the drift layer DR has been increased. Here, the case where the state of the n-type impurities in the drift layer DR is changed from a low concentration (for example, 1E16 cm$^{-3}$ ($1 \times 10^{16}$ cm$^{-3}$)) to a high concentration (for example, 2E16 cm$^{-3}$ ($2 \times 10^{16}$ cm$^{-3}$)) will be studied.

As illustrated in FIG. 22, in a case where the interval (distance La or Lb) between the trench TR and the p-type semiconductor region PR is reduced from 1.2 μm to 0.6 μm and the concentration of the n-type impurities in the drift layer DR is changed from 1E16 cm$^{-3}$ to 2E16 cm$^{-3}$, the on-resistance can be reduced (arrow a). Furthermore, even though the bottom electric field in the trench is increased, the bottom electric field can be kept approximately at Emax (an allowable value for a case where the interval is 1.2 μm and the n-type impurities in the drift layer DR have low concentration).

As described above, by adjusting the impurity concentration of the drift layer (epitaxial layer EP) DR, the on-resistance can be reduced without changing the bottom electric field in the trench. That is, the on-resistance can be improved while achieving the electric-field relaxation effect, which is in a trade-off relationship with the on-resistance.

Second Embodiment

In a second embodiment, an applied example of the first embodiment will be described.

Applied Example 1

Figure 24:
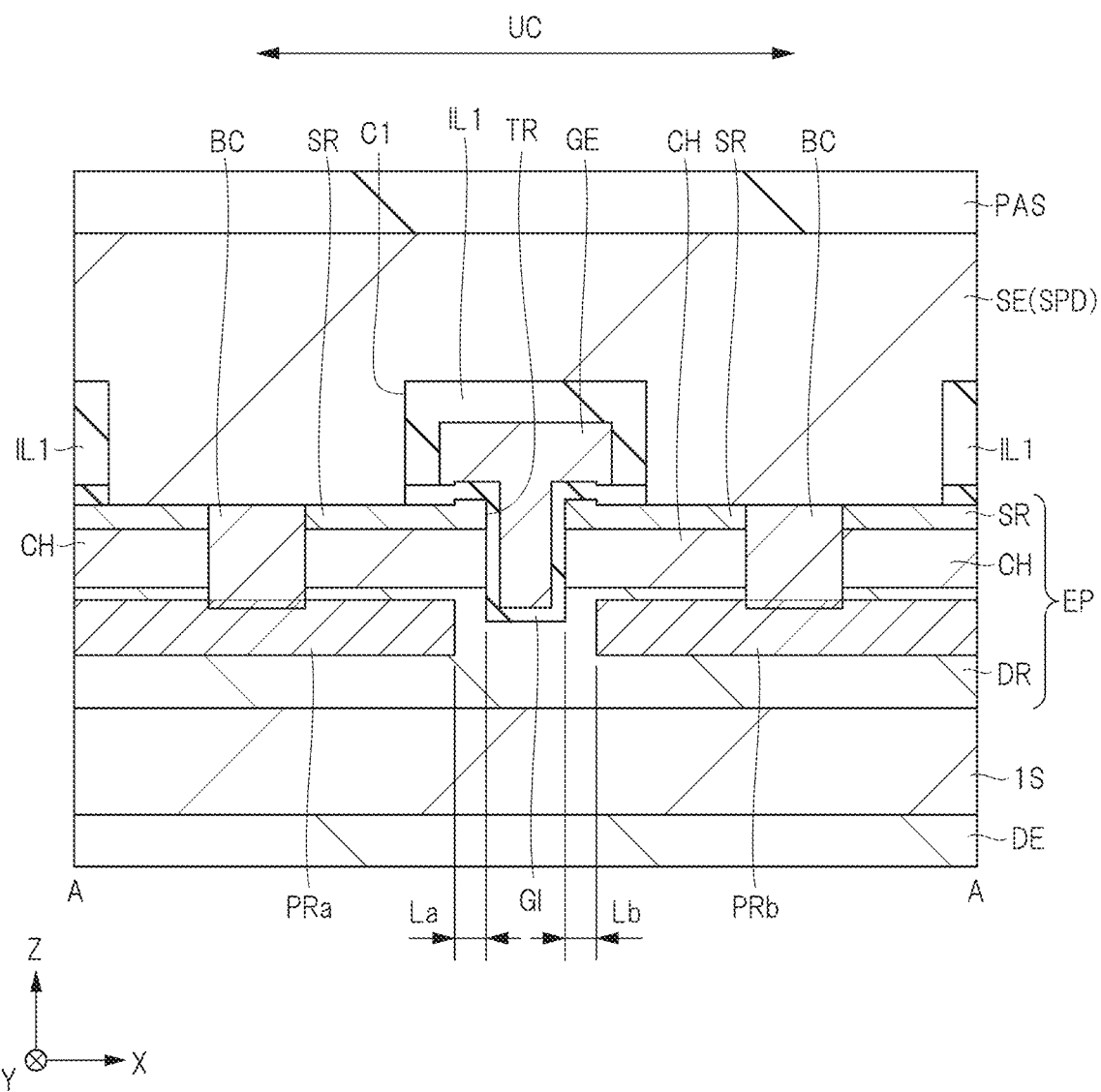
FIG. 24 is a cross-sectional view illustrating a configuration of a semiconductor device in Applied Example 1 of a second embodiment.

FIG. 24 is a cross-sectional view illustrating a configuration of a semiconductor device in Applied Example 1 of the second embodiment.

In the first embodiment (FIG. 1), a bottom surface of each of the body contact regions BC is located at a position higher than the upper surface of the p-type semiconductor regions PRa and PRb. However, the bottom surface of the body contact region BC may be located at a position lower than the upper surface of the p-type semiconductor regions PRa and PRb.

For example, as illustrated in FIG. 24, the body contact regions BC are formed deeply such that a lower portion of each of the body contact regions BC overlaps an upper portion of the corresponding one of the p-type semiconductor regions PRa and PRb. Such deep body contact regions BC can be formed by, for example, adding a deeper ion implantation step to the multi-stage ion implantation step.

Applied Example 2

Figure 25:
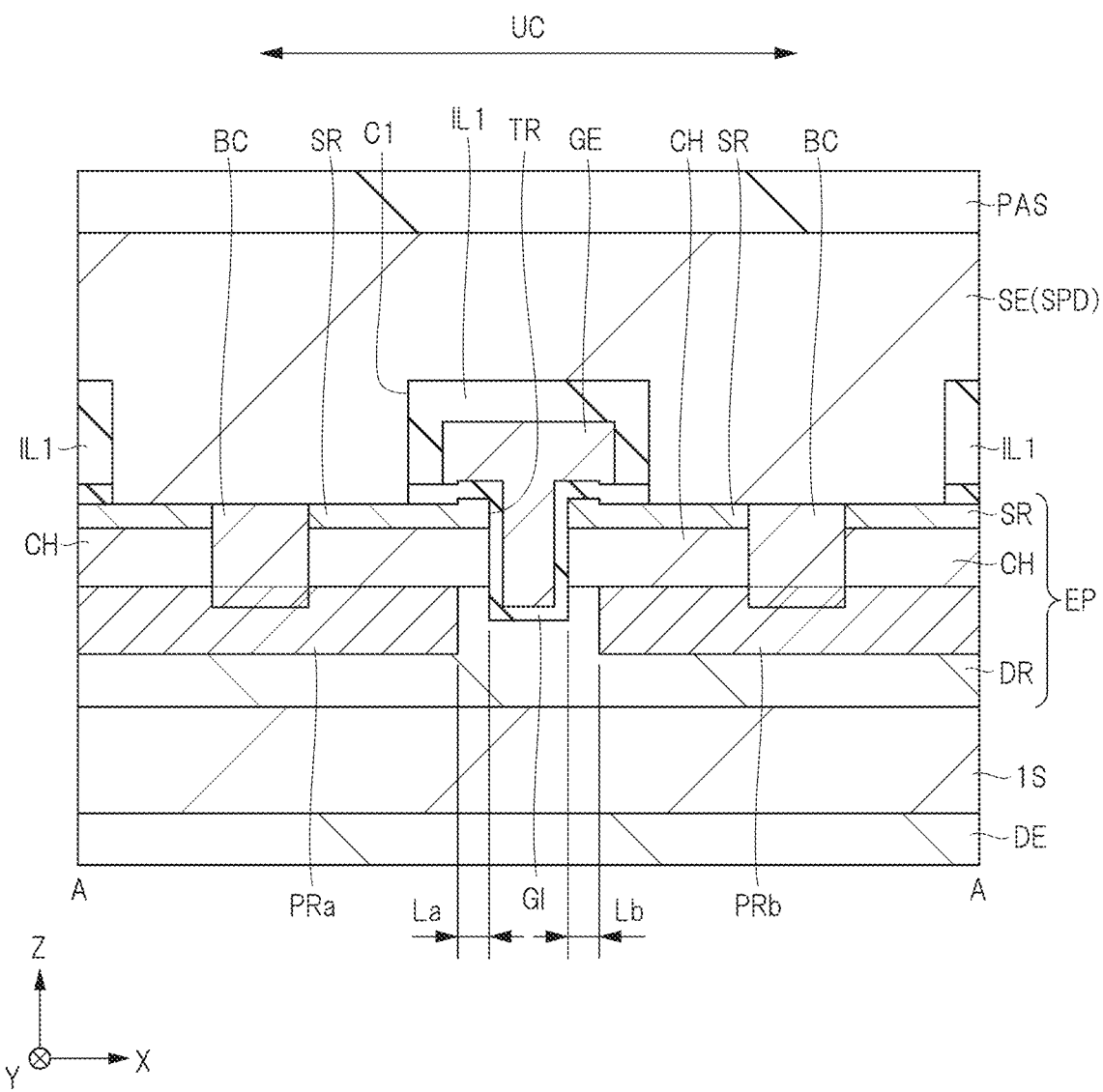
FIG. 25 is a cross-sectional view illustrating a configuration of a semiconductor device in Applied Example 2 of the second embodiment.

FIG. 25 is a cross-sectional view illustrating a configuration of a semiconductor device in Applied Example 2 of the second embodiment.

In the first embodiment (FIG. 1), the upper surface of each of the p-type semiconductor regions PRa and PRb is located at a position lower than an upper surface of the channel layer CH. However, the upper surface of each of the p-type semiconductor regions PRa and PRb may be located at approximately the same position as that of the upper surface of the channel layer CH. In Applied Example 2, each of the p-type semiconductor regions PRa and PRb is in contact with the channel layer CH.

More specifically, as illustrated in FIG. 25, formation of the p-type semiconductor regions PRa and PRb is started at a higher position than that in the first embodiment (FIG. 1). The p-type semiconductor regions PRa and PRb described above can be formed by, for example, adding a shallower ion implantation step to the multi-stage ion implantation step. In Applied Example 2, the body contact regions BC may be formed deeply as is the case with Applied Example 1 described above.

Also in the second embodiment, it is possible to achieve the effect of miniaturizing the semiconductor elements and improving the element characteristics described in the first embodiment. Moreover, since the p-type semiconductor regions PRa and PRb are connected to the source region SR and thus grounded in the second embodiment, it is possible to reduce parasitic capacitance and to improve switching characteristics.

Third Embodiment

In the first embodiment (FIG. 1), a step difference is generated as a result of over-etching between the front surface of the epitaxial layer (source region SR) EP on both sides of the side wall films SW and the front surface of the epitaxial layer (source region SR) EP covered with the side wall films SW. However, the configuration in which the step difference is eliminated may be adopted.

[Description of Structure]

Figure 26:
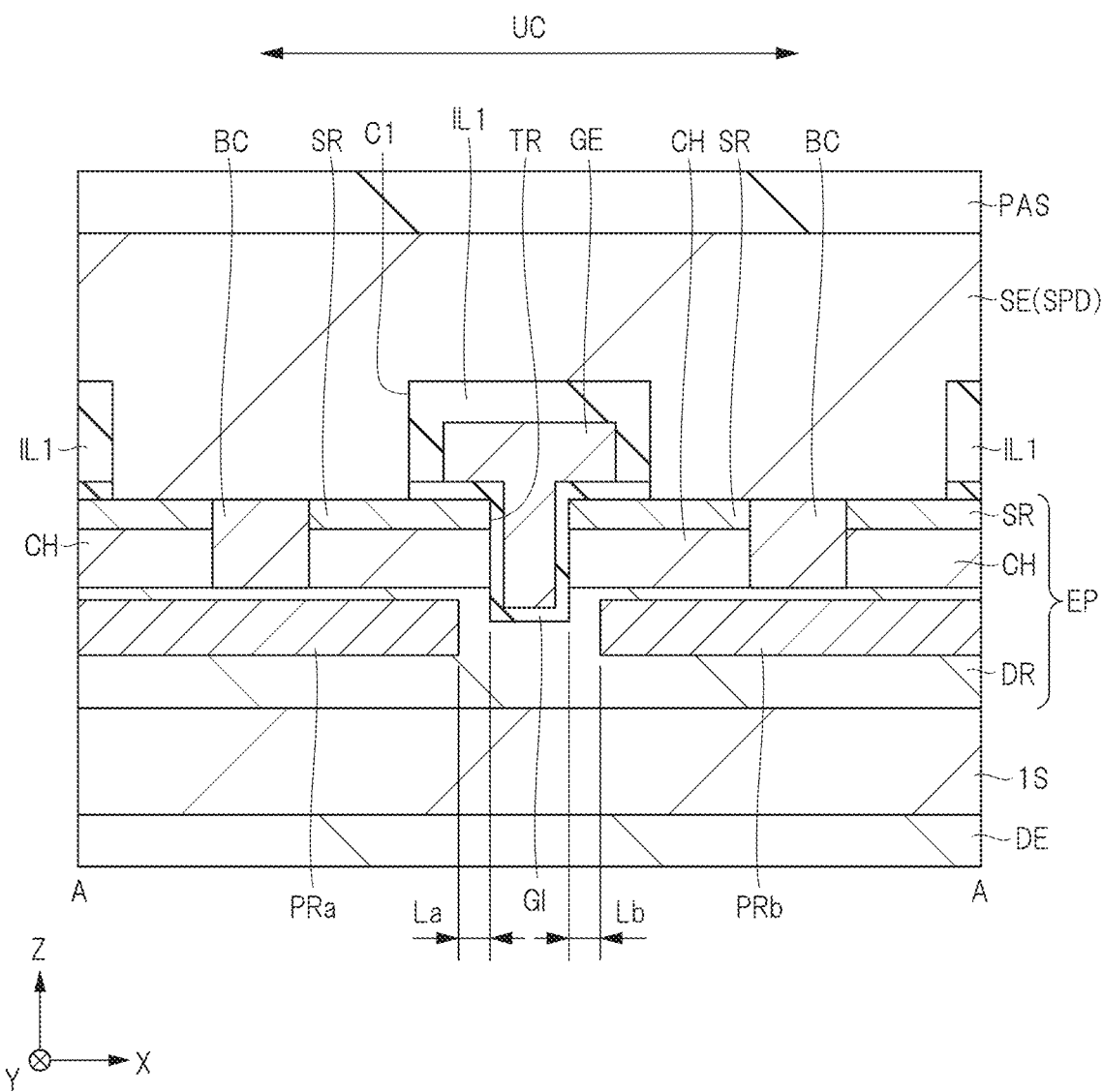
FIG. 26 is a cross-sectional view illustrating a configuration of a semiconductor device according to a third embodiment.

FIG. 26 is a cross-sectional view illustrating a configuration of a semiconductor device according to the third embodiment. In the semiconductor device according to the third embodiment, the front surface of the epitaxial layer (source region SR) EP on both sides of the side wall films SW is located at approximately the same height as that of the front surface of the epitaxial layer (source region SR) EP covered with the side wall films SW (see FIG. 34), and the step difference illustrated in the first embodiment (FIG. 1) is not generated. The configuration except for these components is the same as that of the first embodiment (FIG. 1), and thus the description thereof is omitted. Furthermore, operation of the semiconductor device (transistor) according to the third embodiment is the same as that in the first embodiment.

Also in the third embodiment, it is possible to achieve the effect of miniaturizing the semiconductor elements and improving the element characteristics described in the first embodiment. Moreover, since no step difference is present on the front surface of the source region SR in the third embodiment unlike the first embodiment, it is possible to reduce the source resistance.

[Description of Manufacturing Method]

Next, a manufacturing method of the semiconductor device according to the third embodiment will be described with reference to FIGS. 27 to 39, and a configuration of the semiconductor device will be further clarified. FIGS. 27 to 38 are cross-sectional views illustrating a manufacturing process of the semiconductor device according to the third embodiment.

Figure 27:
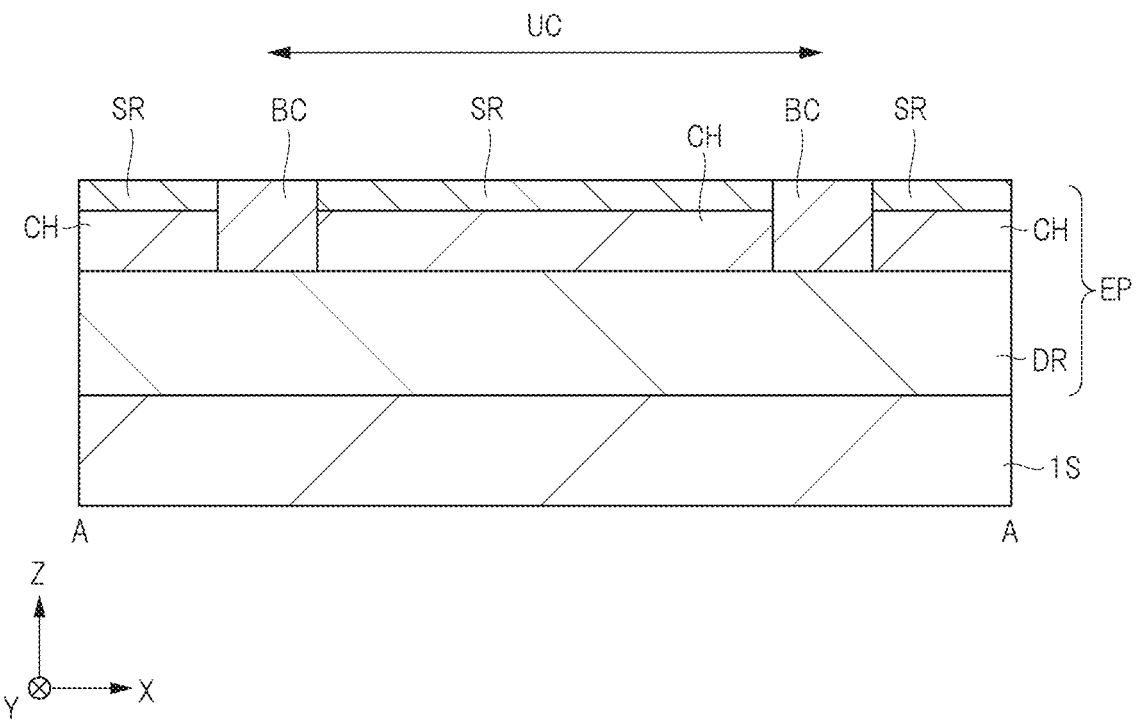
FIG. 27 is a cross-sectional view illustrating a manufacturing process of the semiconductor device according to the third embodiment.

As illustrated in FIG. 27, a p-type semiconductor region serving as the channel layer CH, an n-type semiconductor region serving as the source region SR, and p-type semiconductor regions serving as the body contact regions BC are formed in the epitaxial layer EP on the SiC substrate 1S. These regions can be formed in the same manner as that of the first embodiment.

Figure 28:
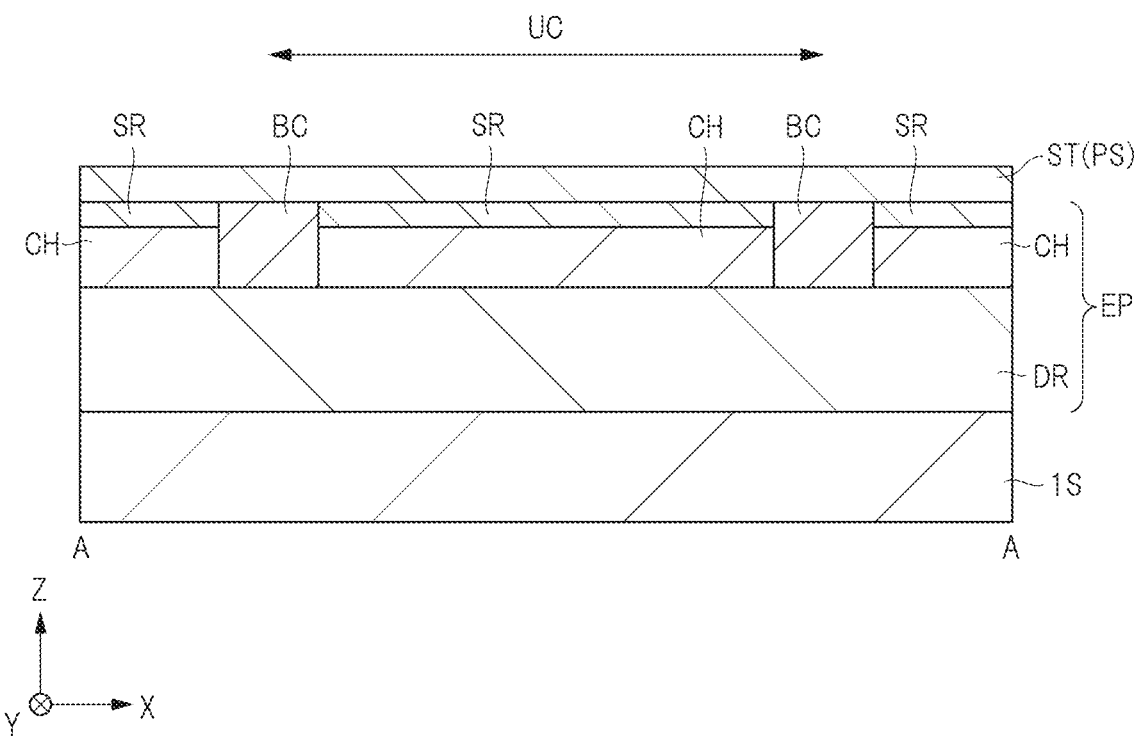
FIG. 28 is a cross-sectional view illustrating the manufacturing process of the semiconductor device according to the third embodiment.

Next, as illustrated in FIG. 28, the polycrystalline silicon film PS is deposited as a stopper film ST on the epitaxial layer EP so as to have a film thickness of approximately 100 nm by the CVD or the like.

Then, as illustrated in FIG. 29, the trench TR that penetrates the stopper film ST, the source region SR, and the channel layer CH to reach the drift layer DR is formed.

For example, the insulating film IF1 having an opening in the formation region of the trench TR is formed on the stopper film ST by using a photolithography technique and an etching technique. Next, the stopper film ST, the source region SR, the channel layer CH, and an upper portion of the drift layer DR are etched with using the insulating film (hard mask) IF1 as a mask to form the trench TR.

Figure 30:
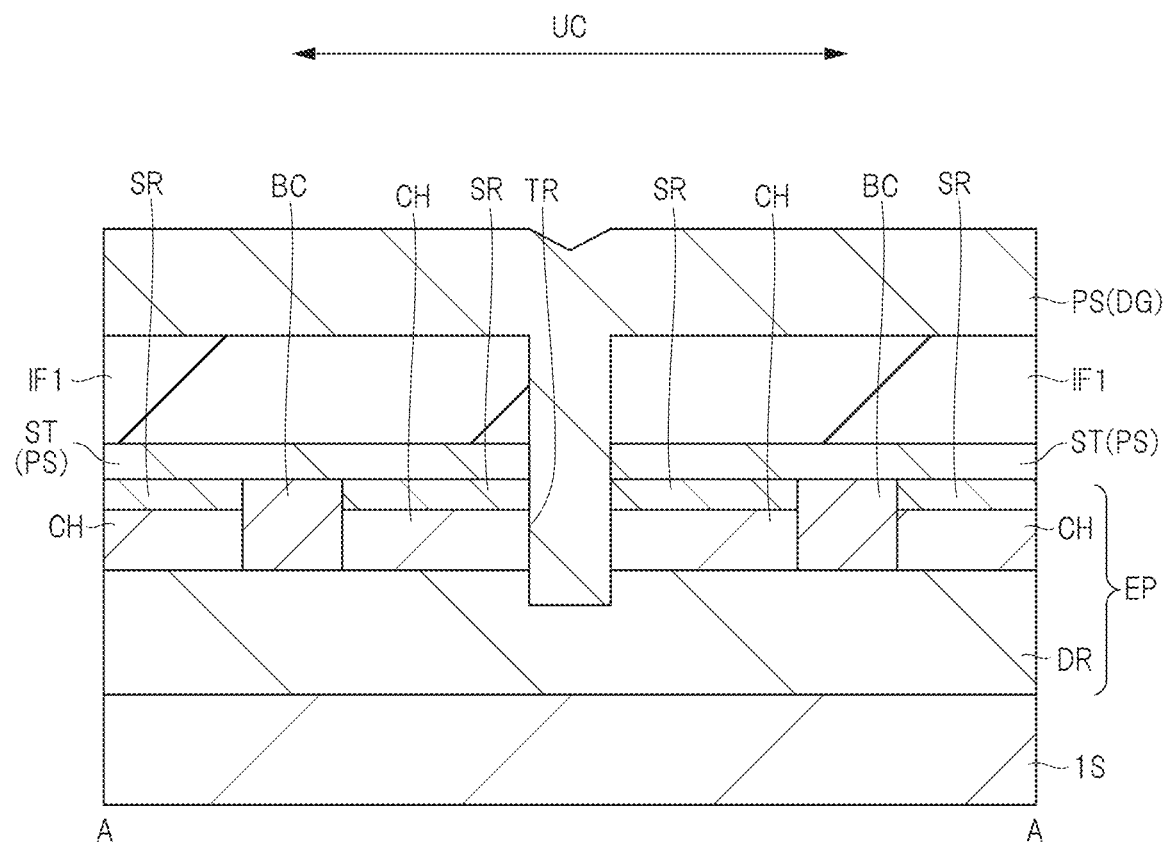
FIG. 30 is a cross-sectional view illustrating the manufacturing process of the semiconductor device according to the third embodiment.
Figure 31:
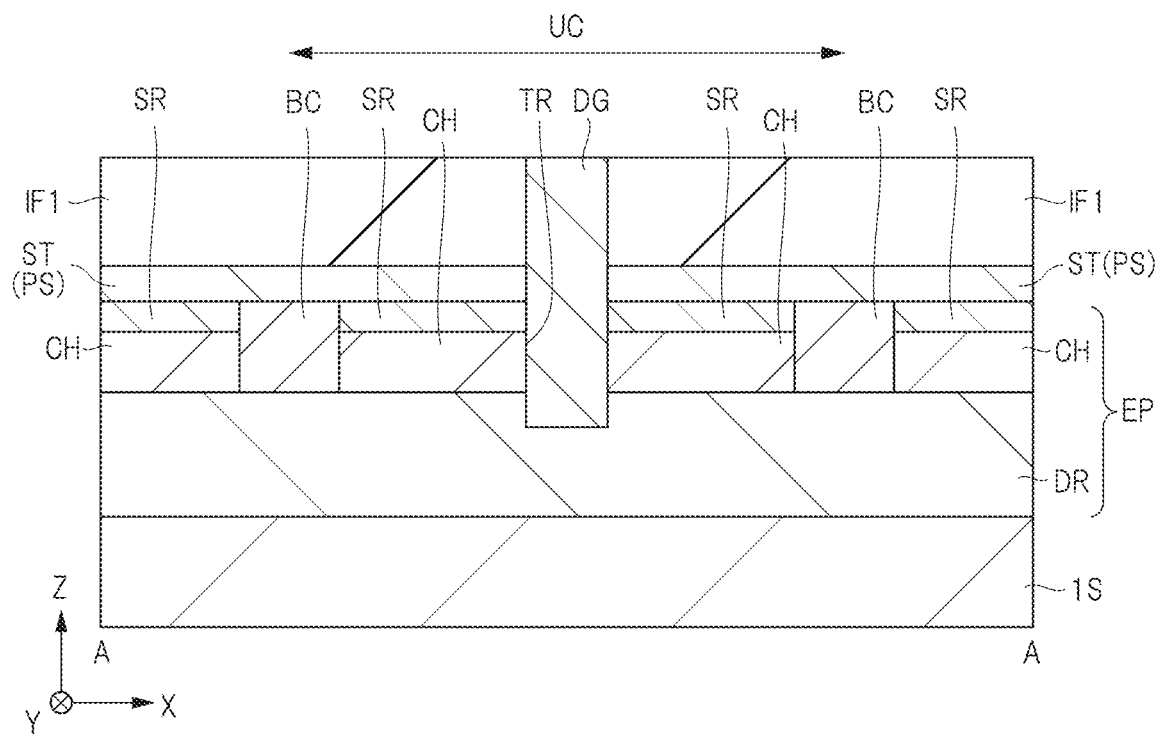
FIG. 31 is a cross-sectional view illustrating the manufacturing process of the semiconductor device according to the third embodiment.
Figure 32:
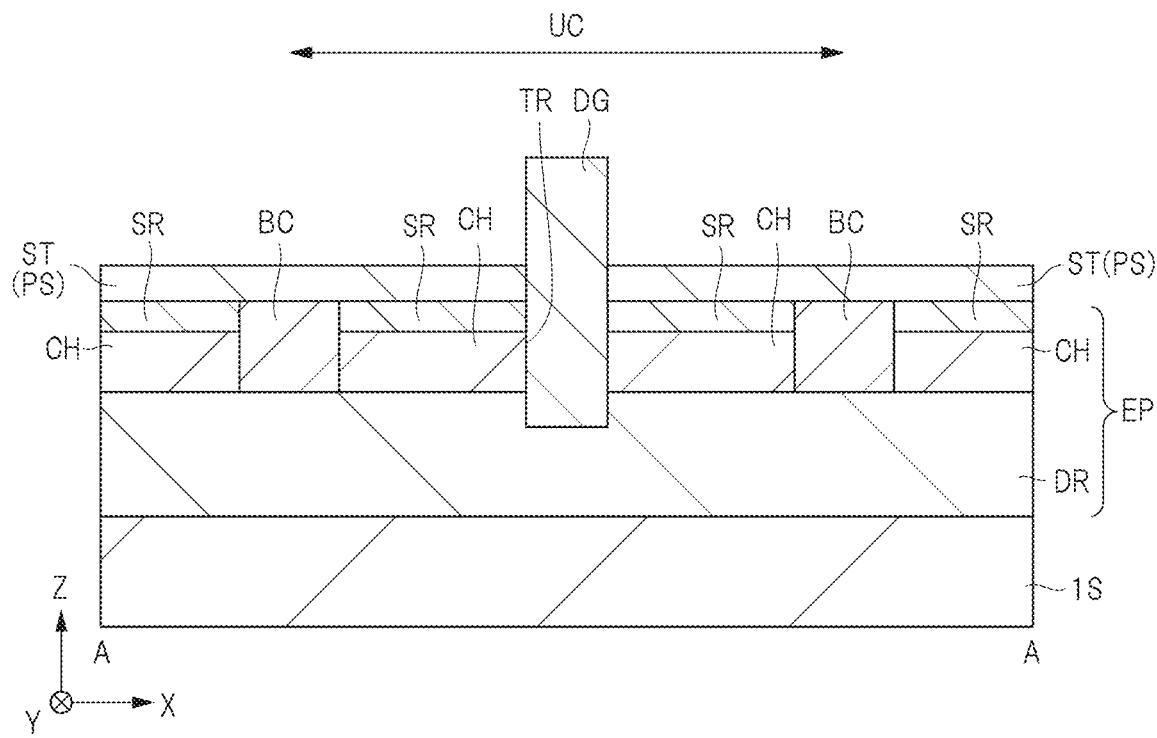
FIG. 32 is a cross-sectional view illustrating the manufacturing process of the semiconductor device according to the third embodiment.

Then, as illustrated in FIGS. 30 to 32, the dummy gate DG that is provided in the trench TR and protrudes upward from the trench TR is formed. First, as illustrated in FIG. 30, a polycrystalline silicon film PS is deposited as a dummy gate material in the trench TR and on the insulating film IF1 so as to have a film thickness sufficient to fill the trench TR by the CVD or the like. Then, as illustrated in FIG. 31, an upper portion of the polycrystalline silicon film PS is polished by the CMP or the like until the insulating film IF1 is exposed. The dummy gate DG is formed in this manner. Next, as illustrated in FIG. 32, the insulating film IF1 is removed by the etching technique. As a result, the dummy gate DG that is embedded in the trench TR and protrudes from a front surface of the stopper film ST by a distance equivalent to the film thickness of the insulating film IF1 can be formed.

Figure 33:
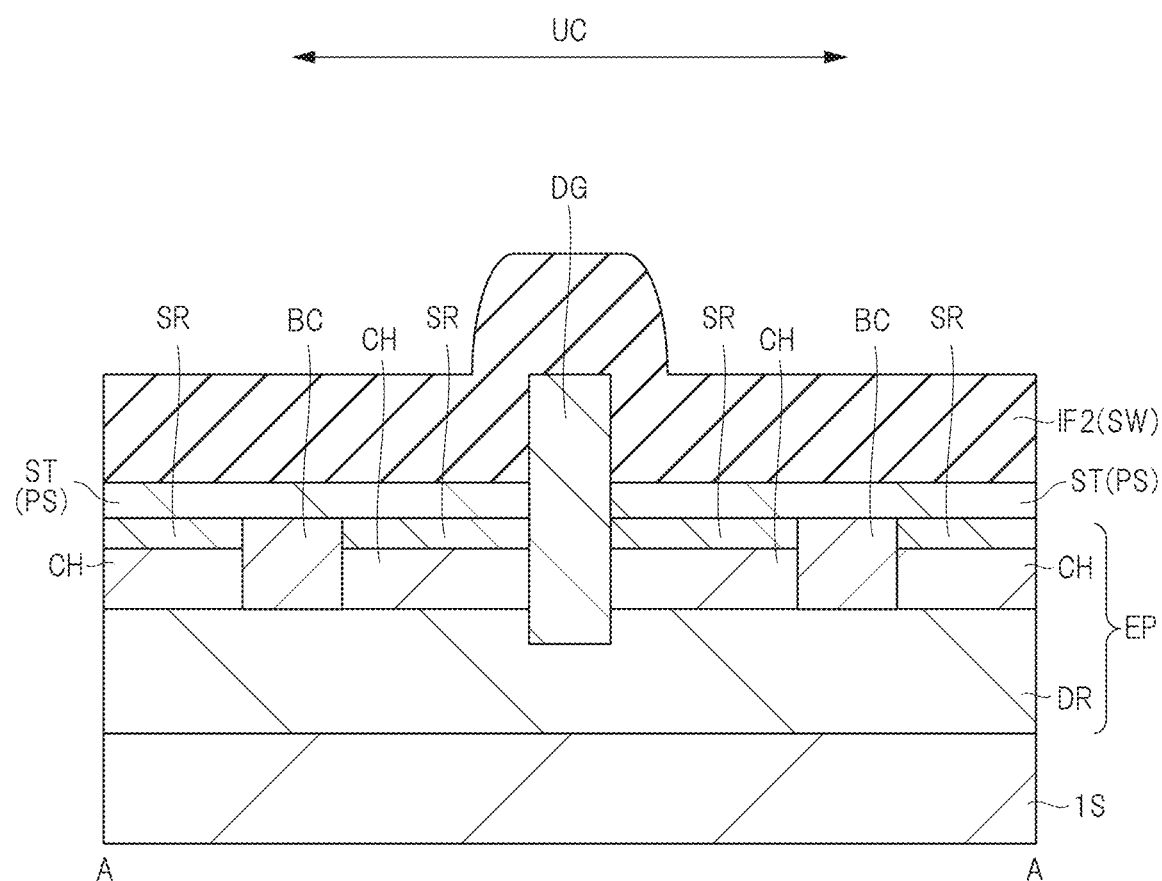
FIG. 33 is a cross-sectional view illustrating the manufacturing process of the semiconductor device according to the third embodiment.
Figure 34:
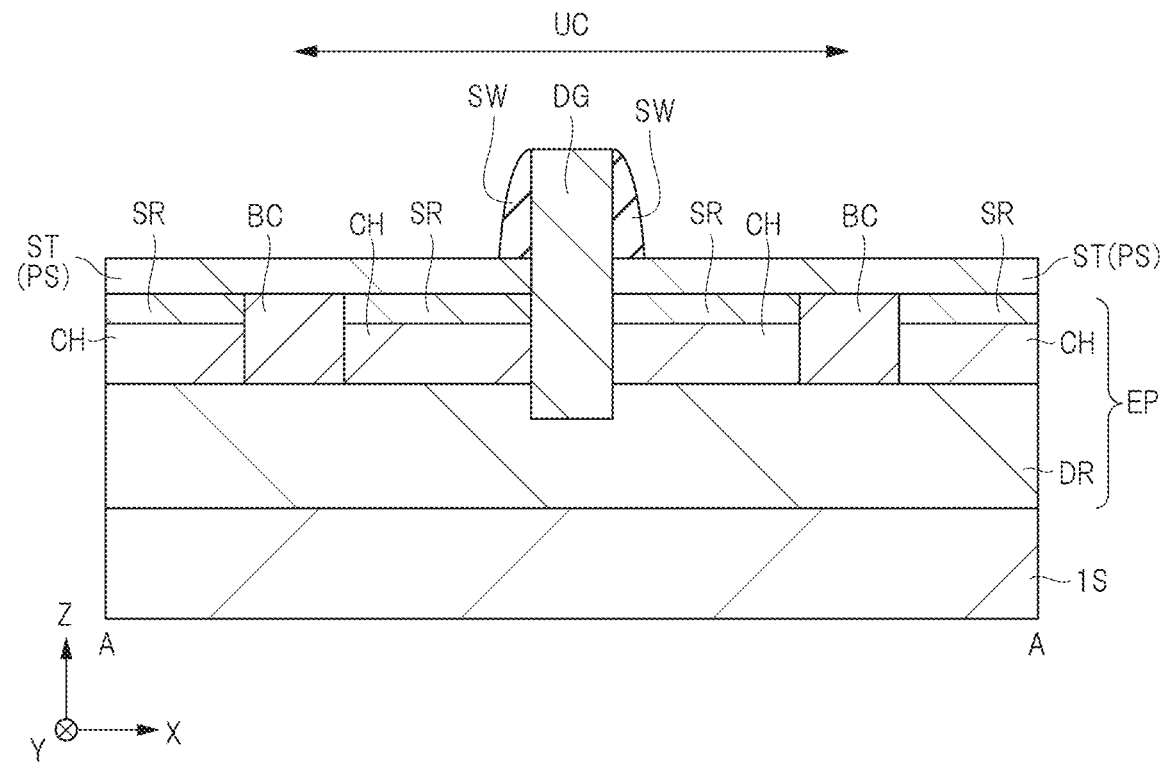
FIG. 34 is a cross-sectional view illustrating the manufacturing process of the semiconductor device according to the third embodiment.
Figure 35:
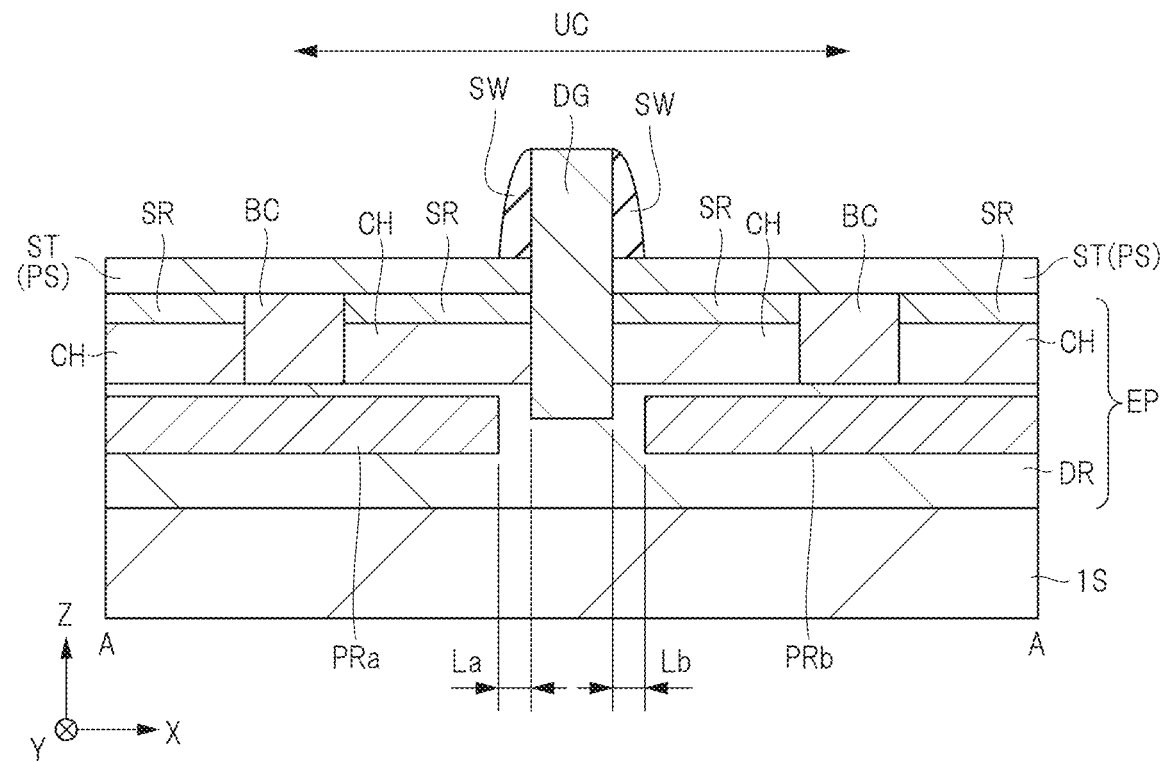
FIG. 35 is a cross-sectional view illustrating the manufacturing process of the semiconductor device according to the third embodiment.

Then, as illustrated in FIGS. 33 to 35, the p-type semiconductor regions (PRa and PRb) are formed in the drift layer DR on both sides of the trench TR. First, as illustrated in FIG. 33, an insulating film (for example, a silicon oxide film) IF2 for forming the side wall films SW is formed on the stopper film ST and on the dummy gate DG by using CVD or the like. Then, the insulating film IF2 is etched back as illustrated in FIG. 34. In the etch-back step, the insulating film IF2 is removed by anisotropic dry etching from a front surface thereof by a predetermined film thickness. This step allows the insulating film IF2 to remain like side walls on the side wall portions on both sides of the protruding portion of the dummy gate DG to form the side wall films SW.

In the third embodiment, when the side wall films SW are formed, the front surface of the epitaxial layer (source region SR) EP on both sides of the side wall films SW is not etched even if over-etching is performed. This is because the stopper film ST exhibiting appropriate etching selectivity with respect to the insulating film IF2 is arranged on the epitaxial layer EP. Accordingly, the step difference illustrated in the first embodiment (FIG. 1) between the front surface of the epitaxial layer (source region SR) EP on both sides of the side wall films SW and the front surface of the epitaxial layer (source region SR) EP covered with the side wall films SW is not generated.

Then, as illustrated in FIG. 35, the p-type semiconductor regions (PRa and PRb) are formed by ion implantation. For example, p-type impurities such as aluminum (Al) or boron (B) are implanted into the drift layer DR with using the dummy gate DG and the side wall films SW as a mask. During the ion implantation, ion implantation conditions such as ion implantation energy are adjusted such that each of the p-type semiconductor regions (PRa and PRb) is located at the position deeper than the lower surface of the channel layer CH. The above-described multi-stage implantation may be used to form the p-type semiconductor regions (PRa and PRb). In this case, the upper surface of each of the p-type semiconductor regions (PRa and PRb) is located at a position higher than the bottom surface of the trench TR. Furthermore, the lower surface of each of the p-type semiconductor regions (PRa and PRb) is located at a position lower than the bottom surface of the trench TR. In other words, the trench TR and the p-type semiconductor regions (PRa and PRb) are arranged at overlapping positions in the depth direction (Z direction).

Also, in this step, the p-type semiconductor regions (PRa and PRb or electric-field relaxation layers) are formed by ion implantation using the dummy gate DG in the trench TR and the side wall films SW formed on both sides of the dummy gate DG as a mask as described above. Therefore, it is possible to reduce the distance La between the p-type semiconductor region PRa and the trench TR and the distance Lb between the p-type semiconductor region PRb and the trench TR. Furthermore, the symmetry of the semiconductor regions with respect to the trench can be enhanced. That is, the distance between the p-type semiconductor regions PRa and PRb can be reduced, and for example, each of the distance L1$a$ and the distance L1$b$ can be made shorter than or equal to the width W of the trench TR, which is formed to have a width close to the resolution limit.

Figure 36:
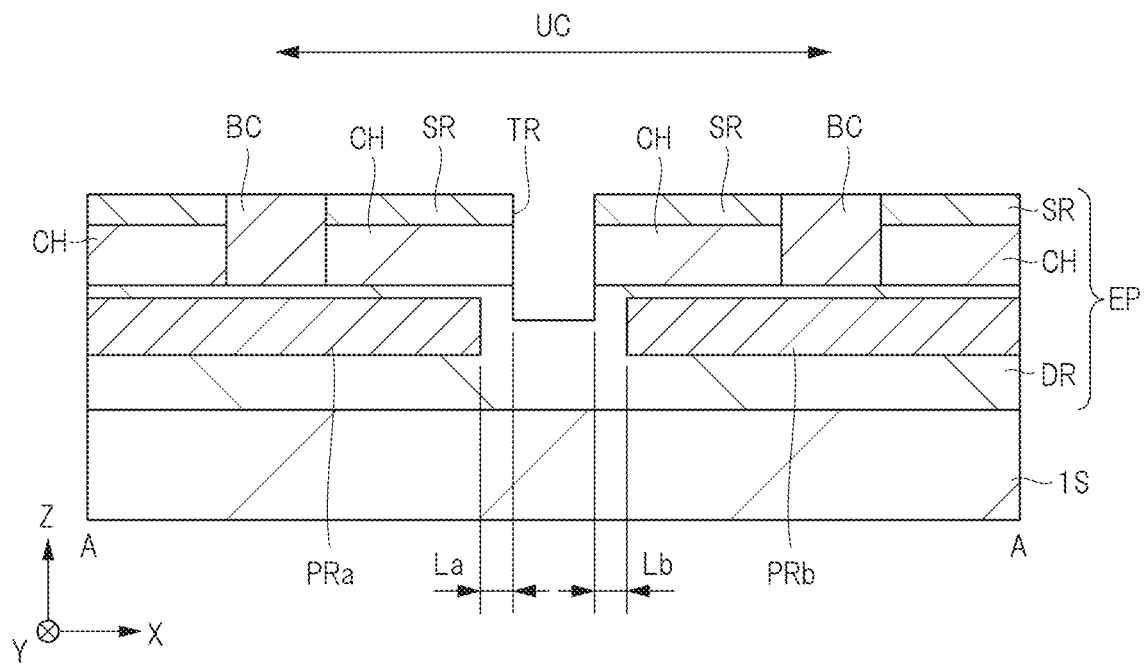
FIG. 36 is a cross-sectional view illustrating the manufacturing process of the semiconductor device according to the third embodiment.

Then, as illustrated in FIG. 36, the dummy gate DG and the stopper film ST are removed by using the etching technique. In the above-described step, the dummy gate DG and the stopper film ST are both the polycrystalline silicon film PS, but may be formed of different films. However, the dummy gate DG and the stopper film ST formed of the same film can be removed by a single etching process. Furthermore, as a dummy gate material and a stopper film material, another material exhibiting appropriate etching selectivity with respect to the insulating film IF2 when the side wall films SW are formed may be used. Then, thermal treatment (activation annealing) is performed to activate the already implanted impurities.

Figure 37:
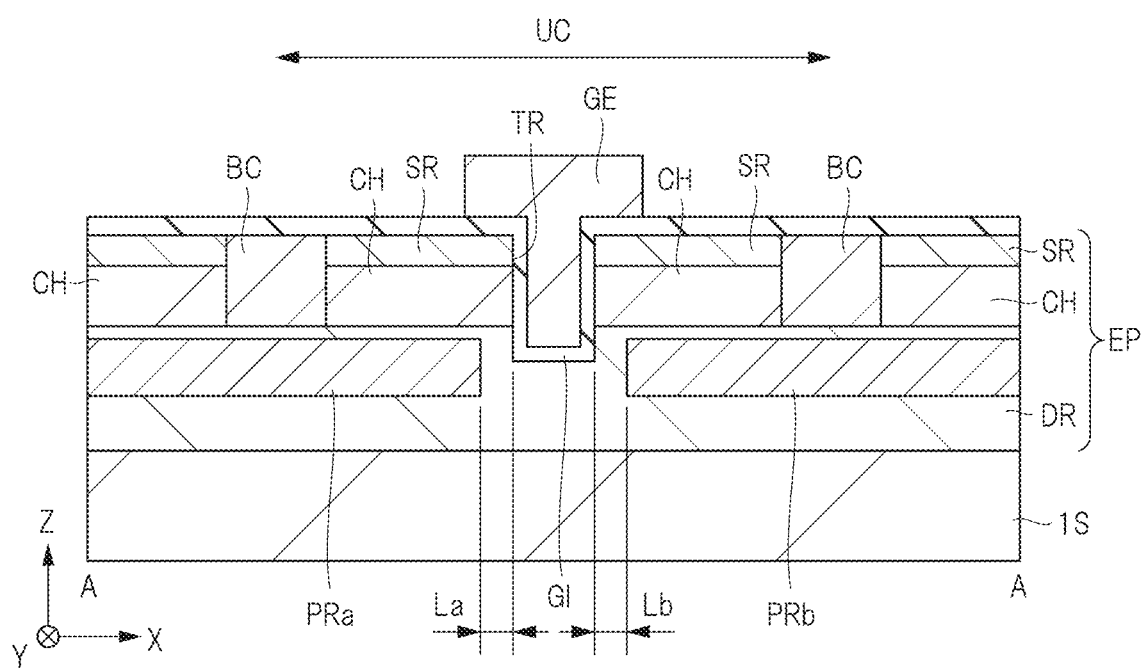
FIG. 37 is a cross-sectional view illustrating the manufacturing process of the semiconductor device according to the third embodiment.

Next, as illustrated in FIG. 37, the gate insulating film GI is formed, and the gate electrode GE is further formed. The gate insulating film GI and the gate electrode GE can be formed in the same manner as that of the first embodiment.

Figure 38:
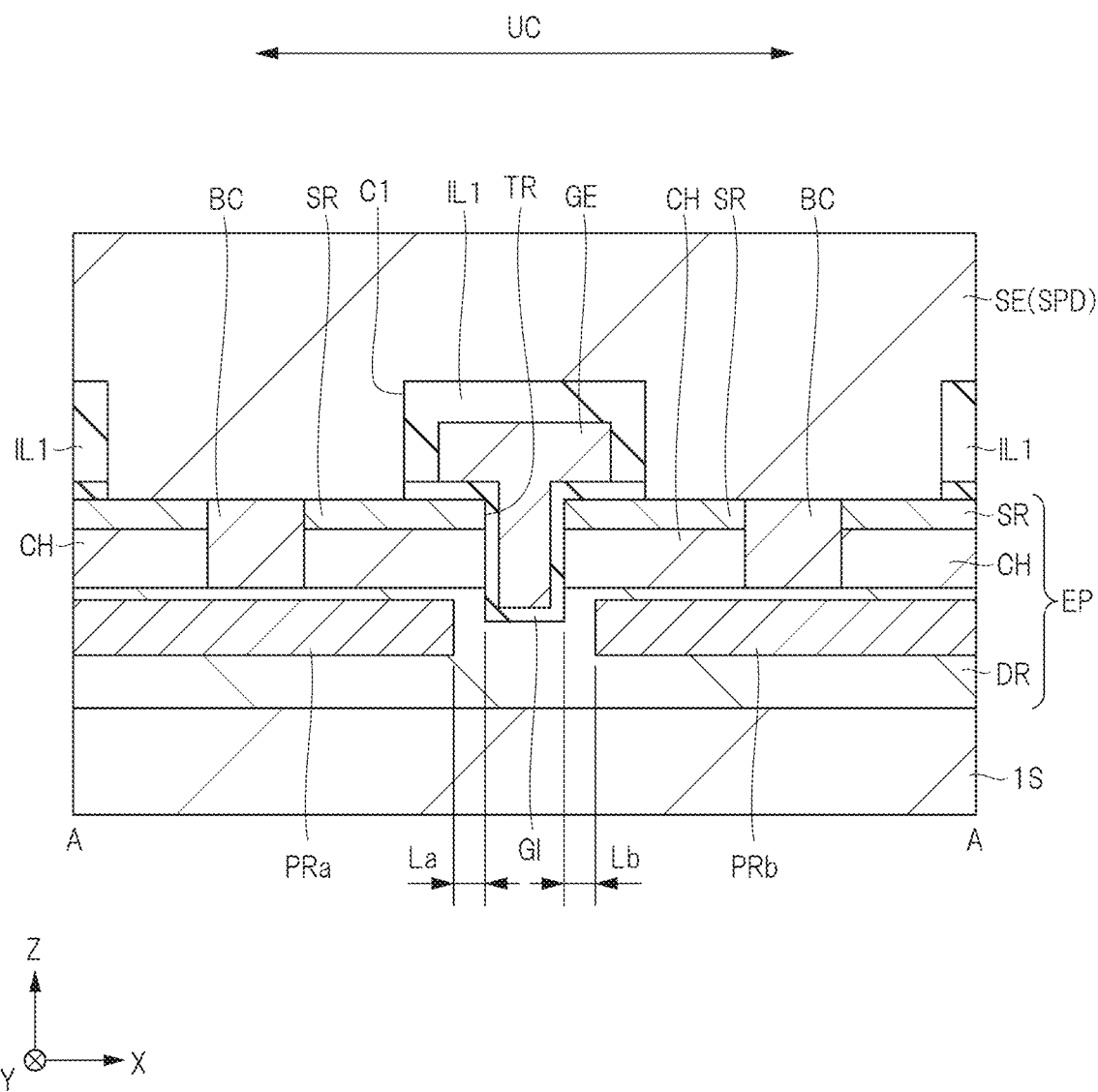
FIG. 38 is a cross-sectional view illustrating the manufacturing process of the semiconductor device according to the third embodiment.

Then, as illustrated in FIG. 38, after the interlayer insulating film IL1 covering the gate electrode GE is formed and the contact holes C1 are formed, the source electrode SE is formed. Moreover, the surface protection film PAS is formed to cover the source electrode SE, and the drain electrode DE is formed on the back surface of the SiC substrate 1S (FIG. 26). The interlayer insulating film IL1, the contact holes C1, the surface protection film PAS, and the drain electrode DE can be formed in the same manner as that of the first embodiment.

Fourth Embodiment

In the first embodiment (FIG. 1), the p-type semiconductor regions (PRa and PRb or electric-field relaxation layers), which are embedded layers, are provided on both sides of the trench TR below the channel layer CH. However, a p-type semiconductor region (RPt, electric-field relaxation layer) may be provided also below the trench TR.

[Description of Structure]

Figure 39:
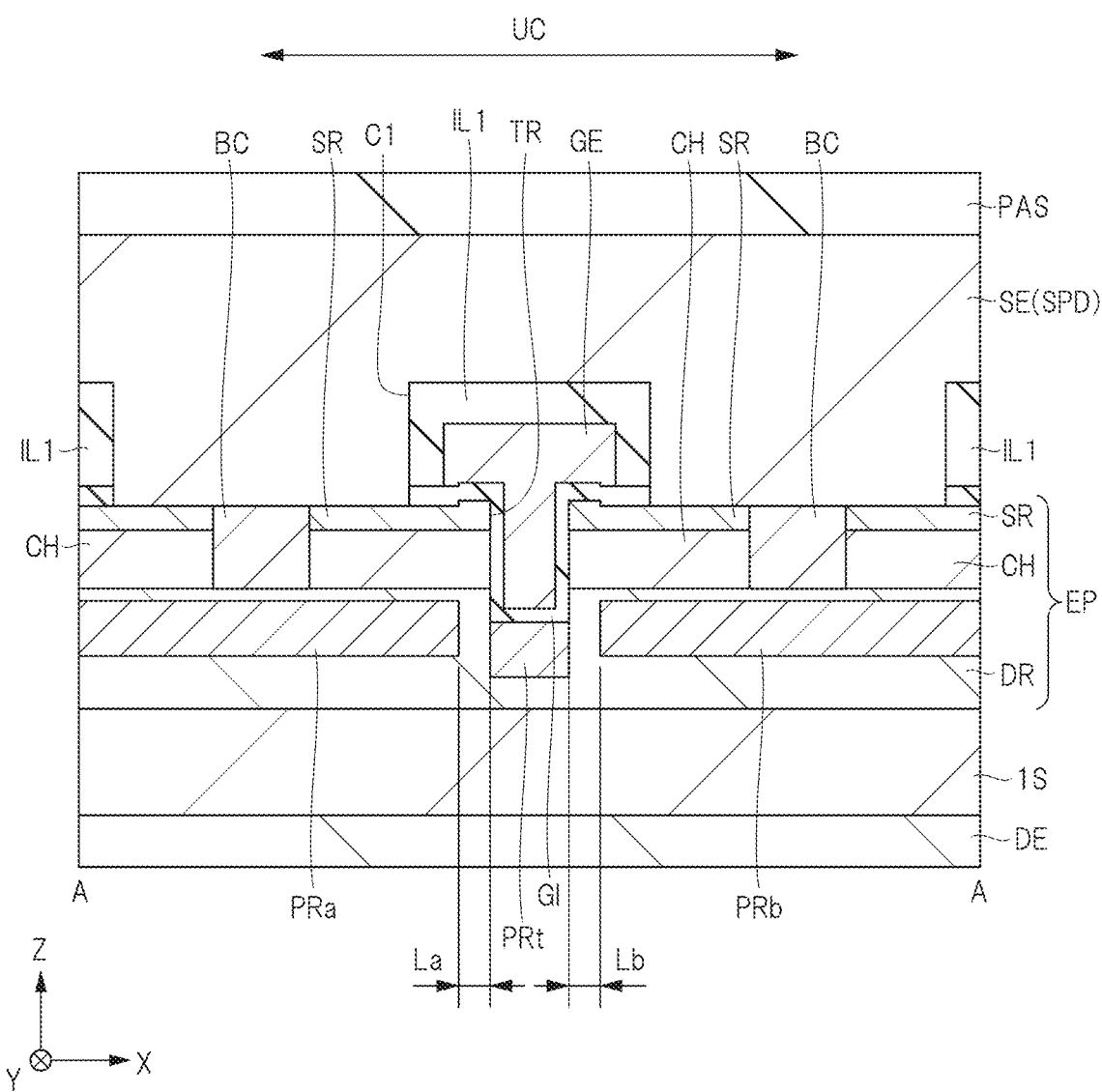
FIG. 39 is a cross-sectional view illustrating a configuration of a semiconductor device according to a fourth embodiment.

FIG. 39 is a cross-sectional view illustrating a configuration of a semiconductor device according to a fourth embodiment. The semiconductor device according to the fourth embodiment is provided with the p-type semiconductor region (PRt) below the trench TR in addition to the p-type semiconductor regions (PRa and PRb) on both sides of the trench TR.

The p-type semiconductor regions PRa and PRt are spaced apart from each other, and a distance between the p-type semiconductor regions PRa and PRt in plan view is, for example, La. The p-type semiconductor regions PRb and PRt are spaced apart from each other, and a distance between the p-type semiconductor regions PRb and PRt in plan view is, for example, Lb. In the fourth embodiment, the configuration except for the p-type semiconductor region PRt is the same as that of the first embodiment (FIG. 1), and thus the description thereof is omitted. Furthermore, operation of the semiconductor device (transistor) according to the fourth embodiment is the same as that in the first embodiment.

As described above, in the fourth embodiment, it is possible to achieve the effect of miniaturizing the semiconductor elements and improving the element characteristics described in the first embodiment. Moreover, since the p-type semiconductor region PRt is provided, the electric-field relaxation effect can be improved.

[Description of Manufacturing Method]

Next, a manufacturing method of the semiconductor device according to the fourth embodiment will be described with reference to FIGS. 40 to 43, and a configuration of the semiconductor device will be further clarified. FIGS. 40 to 43 are cross-sectional views illustrating a manufacturing process of the semiconductor device according to the fourth embodiment.

Figure 40:
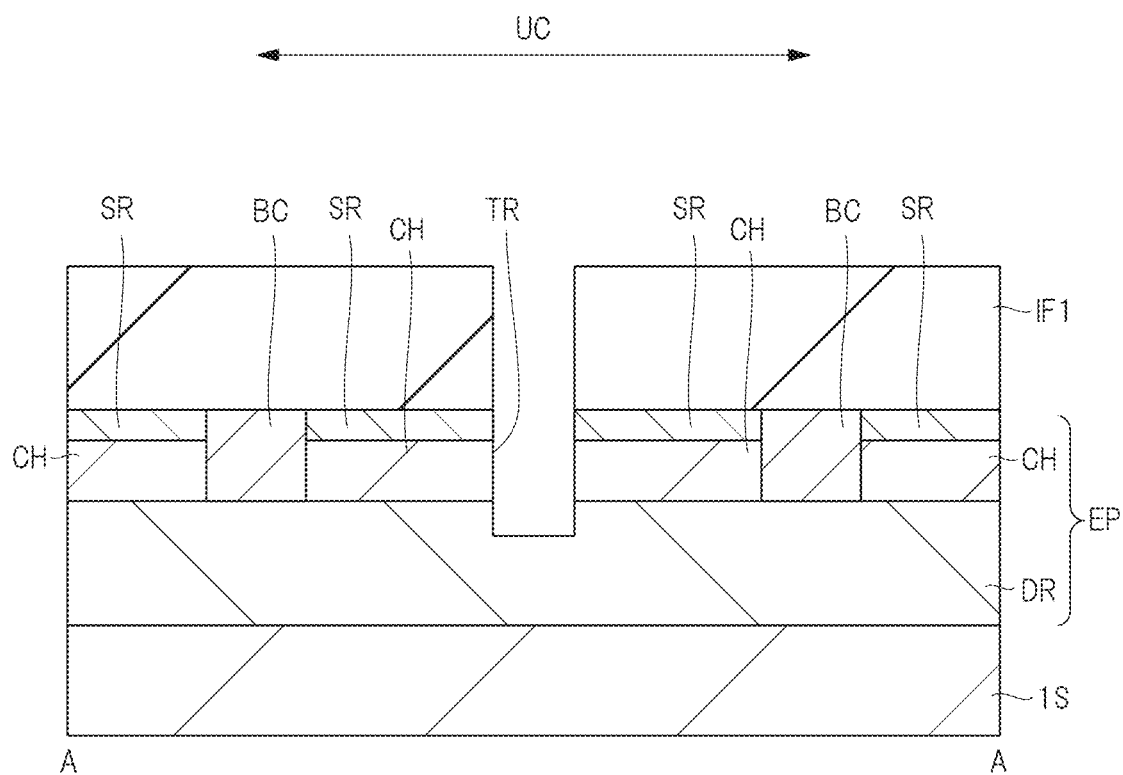
FIG. 40 is a cross-sectional view illustrating a manufacturing process of the semiconductor device according to the fourth embodiment.

As illustrated in FIG. 40, a p-type semiconductor region serving as the channel layer CH, an n-type semiconductor region serving as the source region SR, and p-type semiconductor regions serving as the body contact regions BC are formed in the epitaxial layer EP on the SiC substrate 1S. These regions can be formed in the same manner as that of the first embodiment. Then, the trench TR that penetrates the source region SR and the channel layer CH to reach the drift layer DR is formed.

For example, the insulating film IF1 having an opening in the formation region of the trench TR is formed on the stopper film ST by using a photolithography technique and an etching technique. Next, the source region SR, the channel layer CH, and an upper portion of the drift layer DR are etched with using the insulating film (hard mask) IF1 as a mask to form the trench TR.

Figure 41:
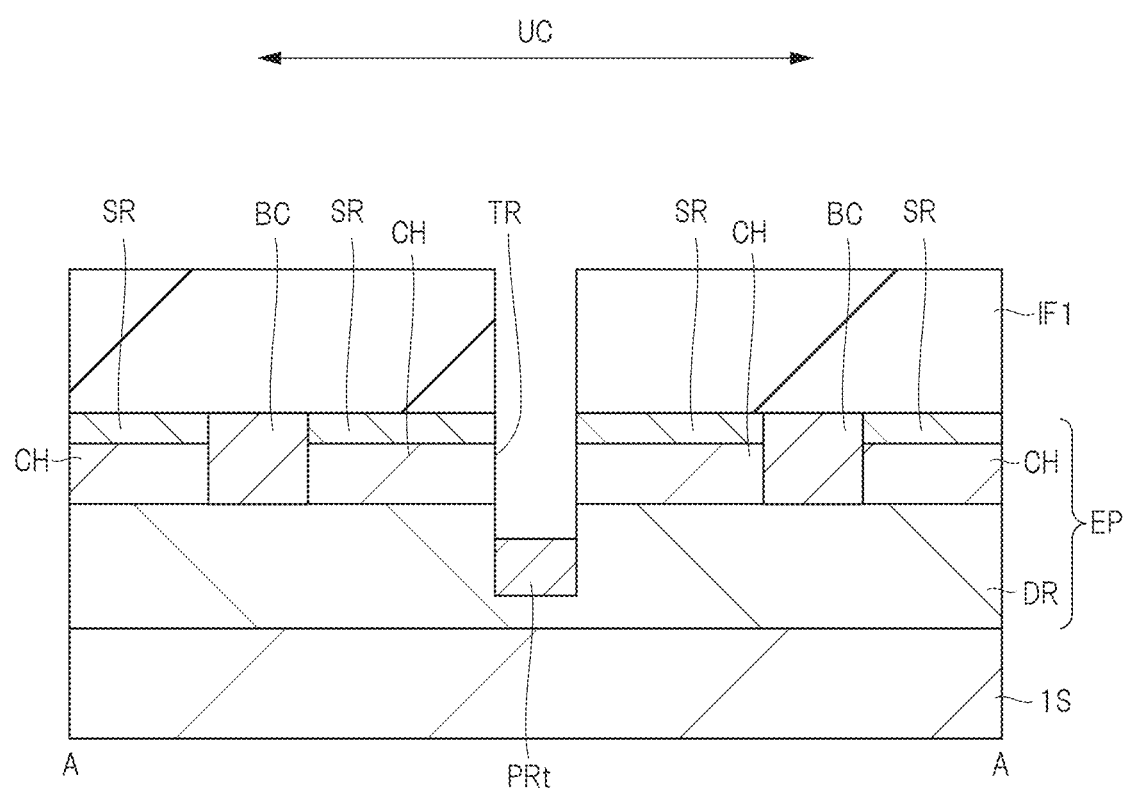
FIG. 41 is a cross-sectional view illustrating the manufacturing process of the semiconductor device according to the fourth embodiment.

Then, as illustrated in FIG. 41, the p-type semiconductor region PRt is formed at a bottom portion of the trench TR by the ion implantation. For example, p-type impurities such as aluminum (Al) or boron (B) are implanted into the bottom portion of the trench TR with using the insulating film IF1 as a mask. At this time, multi-stage implantation may be used to form the p-type semiconductor region PRt.

Figure 42:
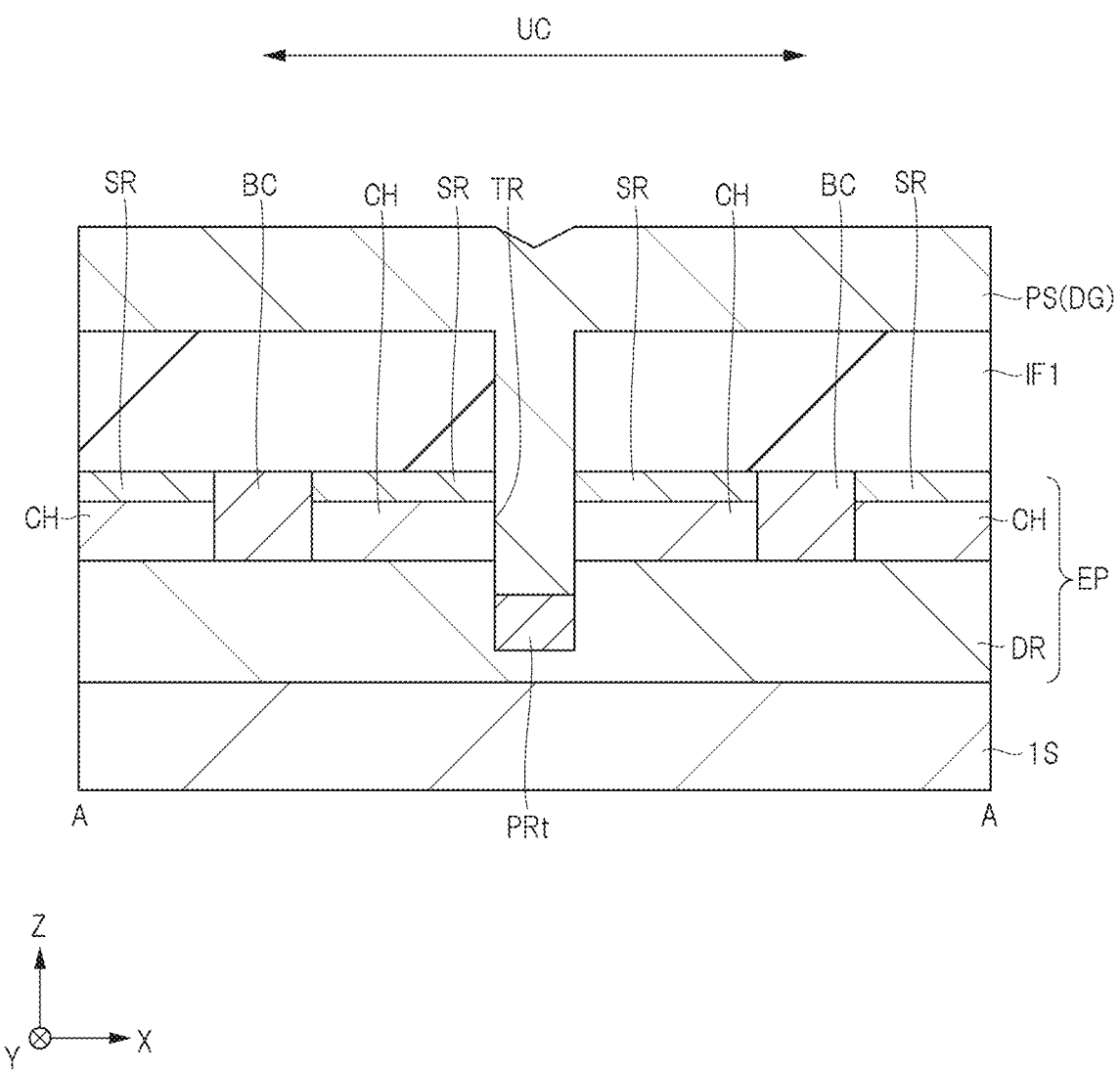
FIG. 42 is a cross-sectional view illustrating the manufacturing process of the semiconductor device according to the fourth embodiment.
Figure 43:
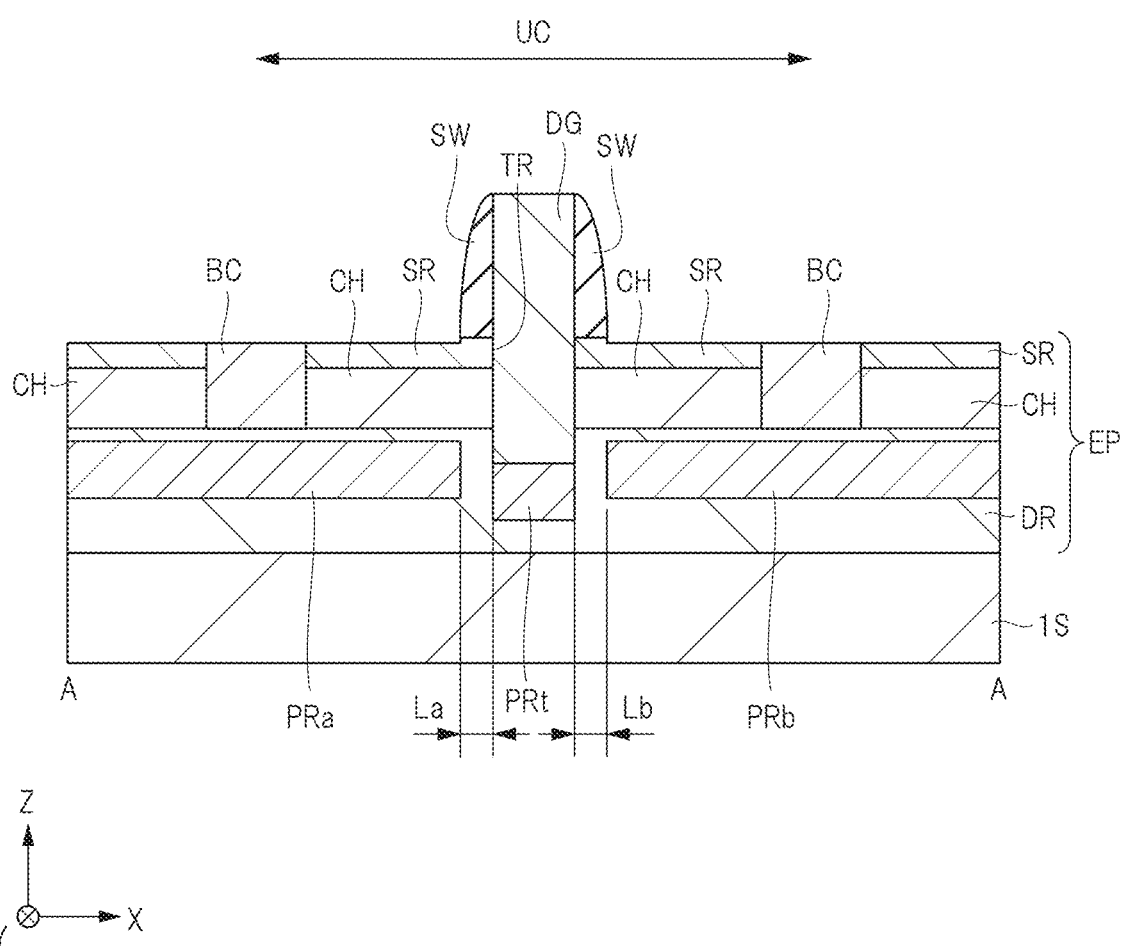
FIG. 43 is a cross-sectional view illustrating the manufacturing process of the semiconductor device according to the fourth embodiment.

Then, as illustrated in FIG. 42 and FIG. 43, the p-type semiconductor regions PRa and PRb are formed. For example, as illustrated in FIG. 42, the polycrystalline silicon film PS is deposited as a dummy gate material by the CVD or the like so as to have a film thickness sufficient to fill the trench TR. Then, after an upper portion of the polycrystalline silicon film PS is polished by the CMP or the like until the insulating film IF1 is exposed, the insulating film IF1 is removed by the etching technique. As a result, the dummy gate DG that is embedded in the trench TR and protrudes from a front surface of the stopper film ST by a distance equivalent to the film thickness of the insulating film IF1 can be formed (FIG. 43).

Then, as is the case with the first embodiment, the side wall films SW are formed on side walls of the dummy gate DG, and p-type impurities are implanted into the drift layer DR with using the dummy gate DG and the side wall films SW as a mask to form the p-type semiconductor regions (PRa and PRb) (FIG. 43).

The subsequent steps are similar to those in the first embodiment.

Fifth Embodiment

In a fifth embodiment, a taper T is formed at an end of each of the p-type semiconductor regions PRa and PRb on a side closer to the trench TR.

[Description of Structure]

Figure 44:
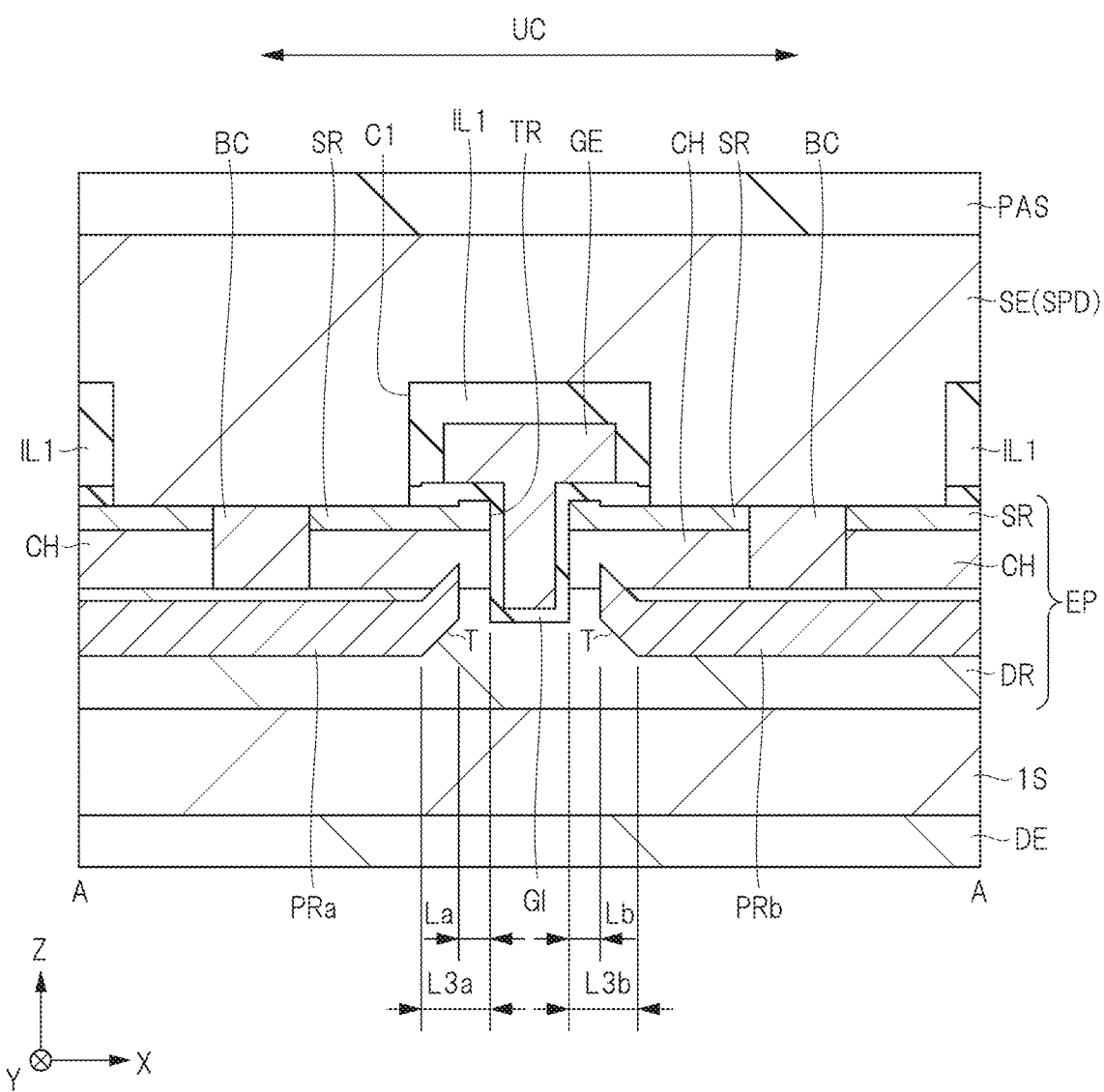
FIG. 44 is a cross-sectional view illustrating a configuration of a semiconductor device according to a fifth embodiment.

FIG. 44 is a cross-sectional view illustrating a configuration of the semiconductor device according to the fifth embodiment. As illustrated in FIG. 44, in the fifth embodiment, the taper (tapered portion) T is provided at an end of the p-type semiconductor region PRa on a side closer to the trench TR such that a distance (L3a) between a lower portion of the p-type semiconductor region PRa and the trench TR is made larger than a distance (La) between an upper portion of the p-type semiconductor region PRa and the trench TR. Furthermore, the taper T is provided at an end of the p-type semiconductor region PRb on aside closer to the trench TR such that a distance (L3b) between a lower portion of the p-type semiconductor region PRb and the trench TR is made larger than a distance (Lb) between an upper portion of the p-type semiconductor region PRb and the trench TR.

In the fifth embodiment, the configuration except for the ends of the p-type semiconductor regions PRa and PRb on the side closer to the trench TR is the same as that of the first embodiment (FIG. 1), and thus the description thereof is omitted. Furthermore, operation of the semiconductor device (transistor) according to the fifth embodiment is the same as that in the first embodiment.

As described above, in the fifth embodiment, it is possible to achieve the effect of miniaturizing the semiconductor elements and improving the element characteristics described in the first embodiment. Moreover, since the current path can be widened by increasing the distances L3a and L3b, it is possible to reduce the on-resistance.

[Description of Manufacturing Method]

Next, a manufacturing method of the semiconductor device according to the fifth embodiment will be described with reference to FIGS. 45 to 53 and a configuration of the semiconductor device will be further clarified. FIGS. 45 to 53 are cross-sectional views illustrating a manufacturing process of the semiconductor device according to the fifth embodiment.

Figure 45:
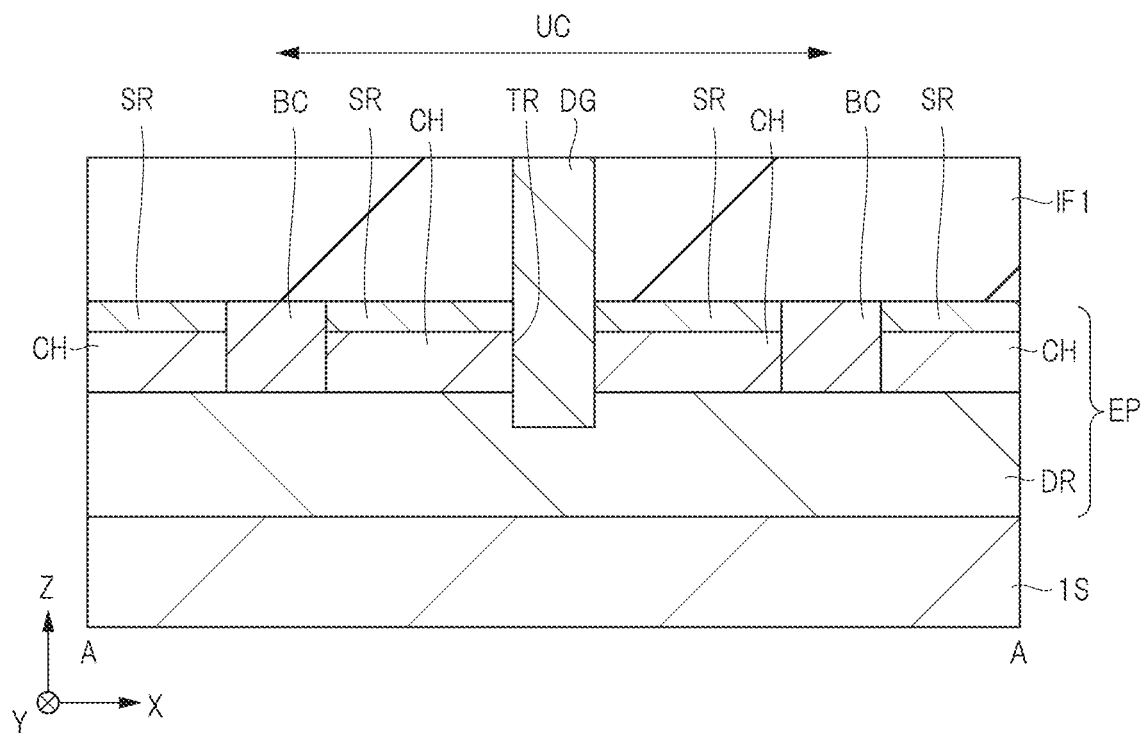
FIG. 45 is a cross-sectional view illustrating a manufacturing process of the semiconductor device according to the fifth embodiment.

As illustrated in FIG. 45, a p-type semiconductor region serving as the channel layer CH, an n-type semiconductor region serving as the source region SR, and p-type semiconductor regions serving as the body contact regions BC are formed in the epitaxial layer EP on the SiC substrate 1S. These regions can be formed in the same manner as that of the first embodiment. Then, the trench TR that penetrates the source region SR and the channel layer CH to reach the drift layer DR is formed.

Figure 46:
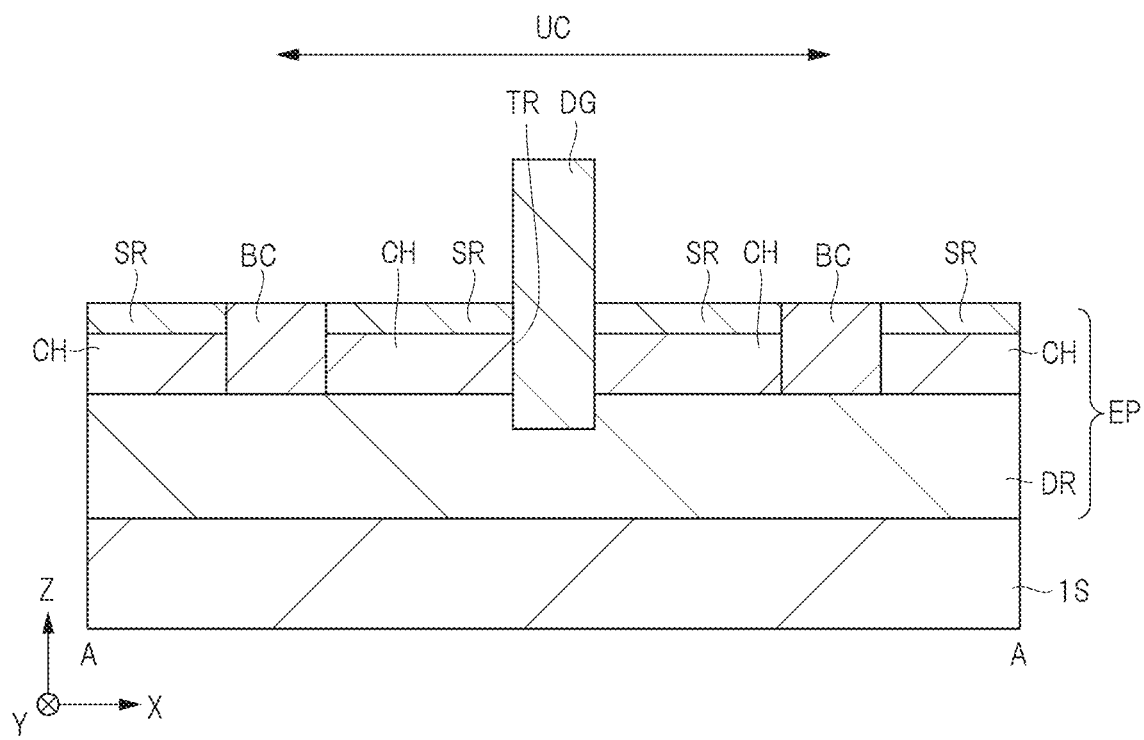
FIG. 46 is a cross-sectional view illustrating the manufacturing process of the semiconductor device according to the fifth embodiment.

For example, the insulating film IF1 having an opening in the formation region of the trench TR is formed on the epitaxial layer EP by using a photolithography technique and an etching technique. Next, the source region SR, the channel layer CH, and an upper portion of the drift layer DR are etched with using the insulating film (hard mask) IF1 as a mask to form the trench TR. Then, the dummy gate DG embedded in the trench is formed, and the insulating film IF1 is removed by using the etching technique (FIG. 46).

Figure 47:
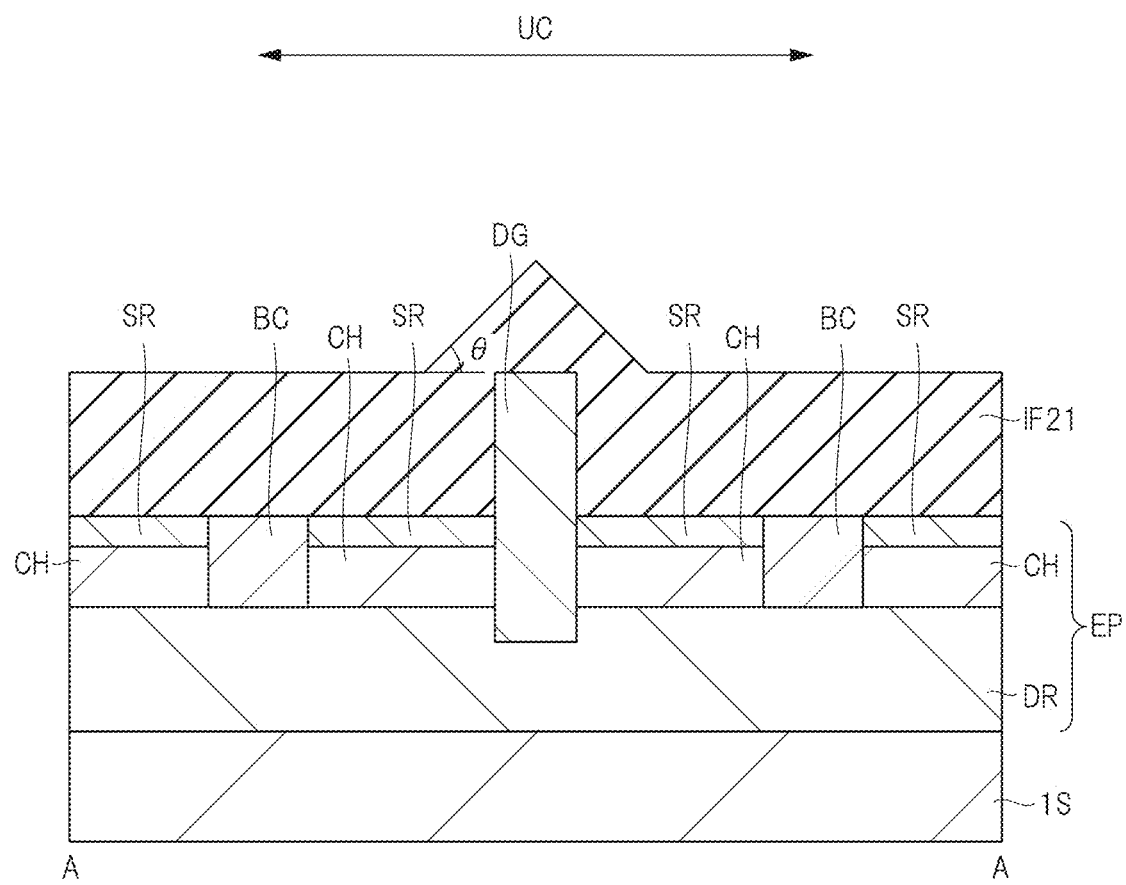
FIG. 47 is a cross-sectional view illustrating the manufacturing process of the semiconductor device according to the fifth embodiment.
Figure 48:
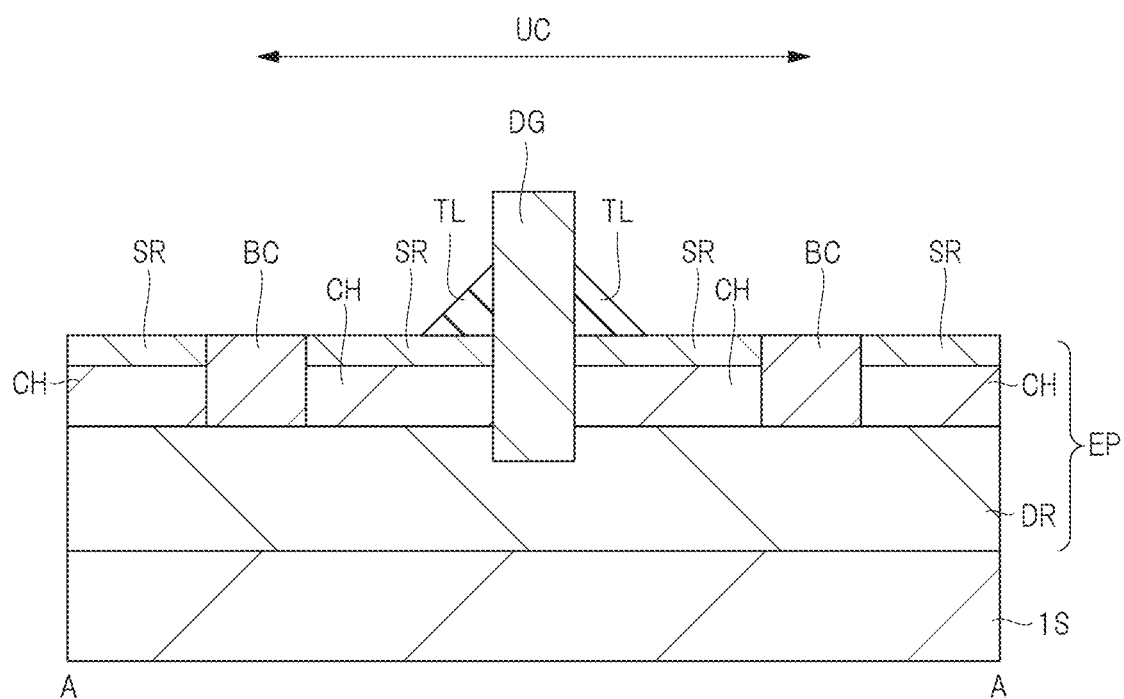
FIG. 48 is a cross-sectional view illustrating the manufacturing process of the semiconductor device according to the fifth embodiment.

Next, as illustrated in FIG. 47, an insulating film (for example, a silicon oxide film) IF21 is formed on the epitaxial layer (source region SR) EP and the dummy gate DG. In the fifth embodiment, the high density plasma CVD is used to form the insulating film (for example, a silicon oxide film) IF21 so as to have a film thickness of approximately 1 to 4 μm. The high density plasma CVD refers to a film formation method of depositing an insulating film under a high density plasma atmosphere. In the high density plasma CVD, by depositing an insulating film while etching the insulating film, the film can be accurately embedded even in fine gaps, and the film with good flatness can be obtained. The high density plasma CVD as described above enables to form a protruding portion with a substantially triangular cross section on the dummy gate DG. Side walls of the protruding portion are tapered at an angle (inclination angle θ) of 45°. Note that a height of the protruding portion can be controlled based on the film thickness of the insulating film IF21. Then, as illustrated in FIG. 48, the insulating film IF21 is etched back, that is, removed by anisotropic dry etching by a predetermined film thickness from a front surface thereof, so that insulating films TL with side walls inclined at an angle of 45° are formed on both sides of the dummy gate DG. In other words, the insulating films TL with tapered side surfaces are formed on the side walls of the dummy gate DG. The position of each of the insulating films TL can be controlled based on the film thickness of the insulating film IF21.

Figure 49:
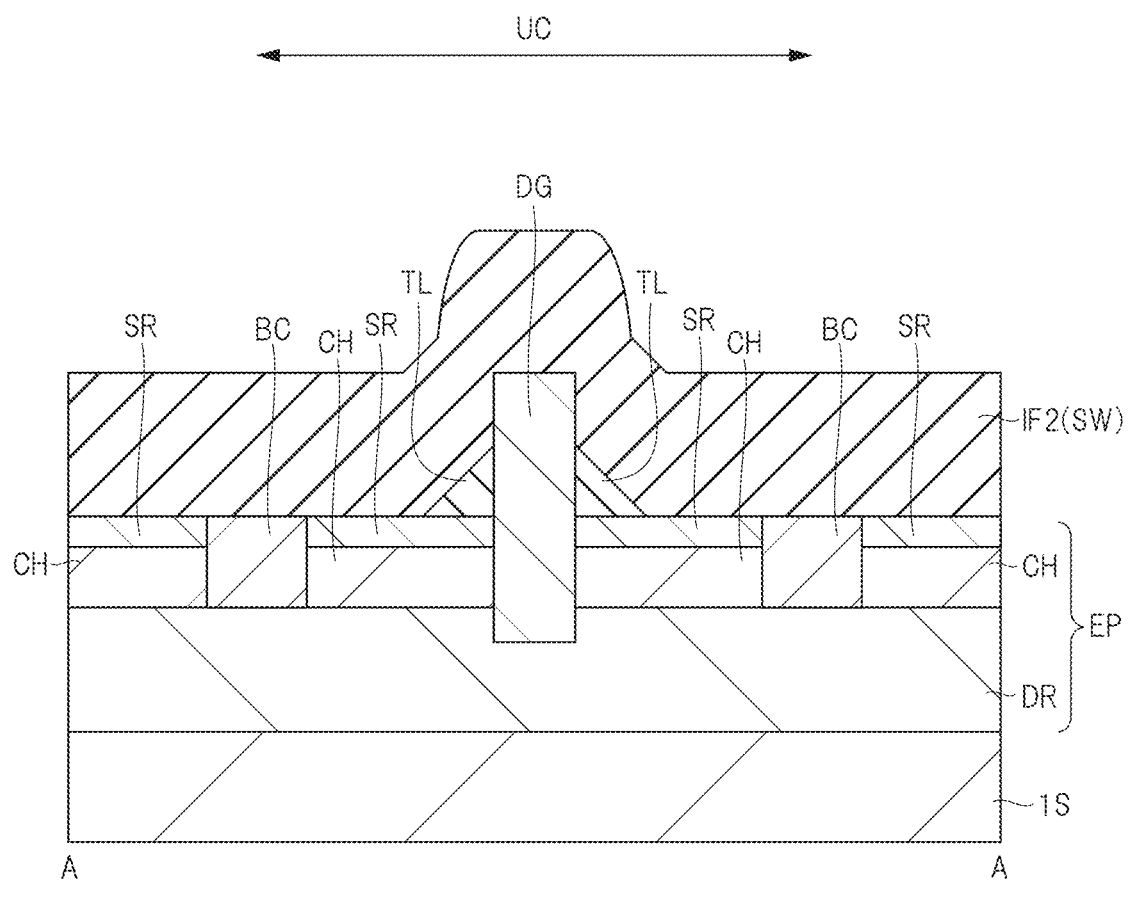
FIG. 49 is a cross-sectional view illustrating the manufacturing process of the semiconductor device according to the fifth embodiment.
Figure 50:
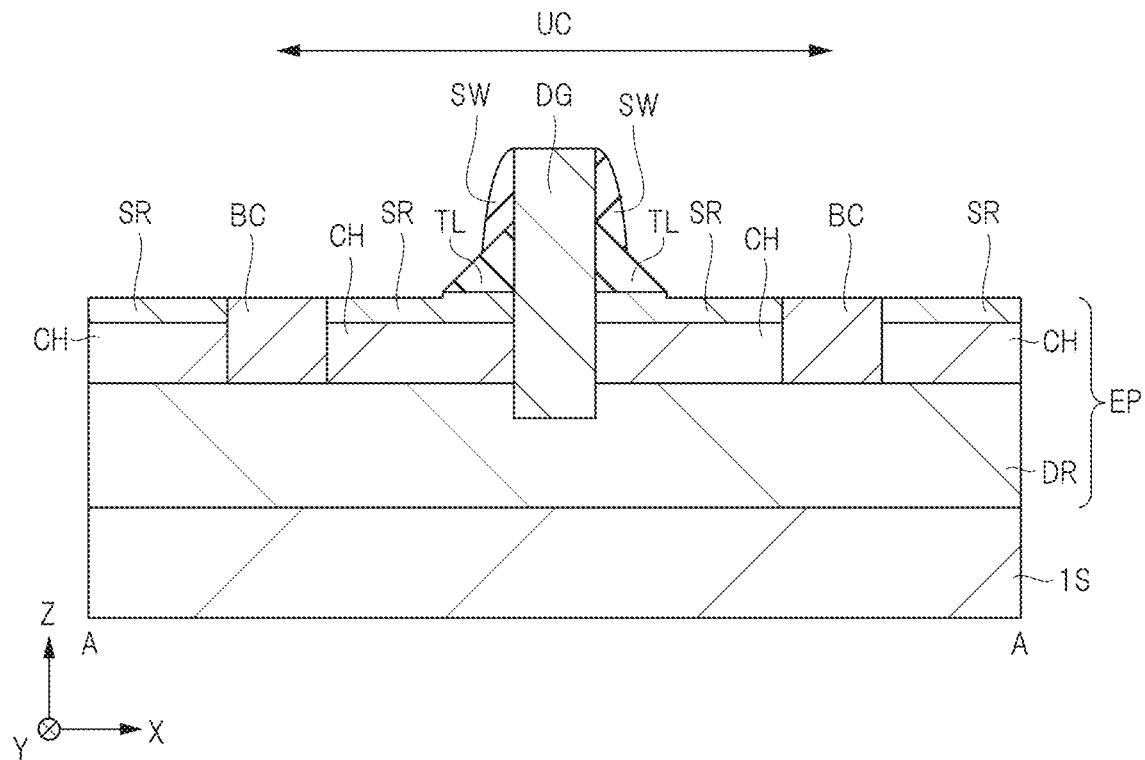
FIG. 50 is a cross-sectional view illustrating the manufacturing process of the semiconductor device according to the fifth embodiment.

Then, as illustrated in FIG. 49, an insulating film (for example, a silicon oxide film) IF2 for forming the side wall films SW is formed on the epitaxial layer (source region SR) EP, the insulating film TL, and the dummy gate DG by the CVD or the like. Then, the insulating film IF2 is etched back as illustrated in FIG. 50. In the etch-back step, the insulating film IF2 is removed by a predetermined film thickness from the front surface thereof by the anisotropic dry etching. By this step, the insulating film IF2 shaped like side walls remains on the insulating film TL on both sides of the protruding portion of the dummy gate DG along the side walls of the dummy gate DG, thereby forming the side wall films SW. In this case, the front surface of portions of the epitaxial layer (source region SR) EP on both sides of the insulating film TL may be slightly etched by over-etching.

Figure 51:
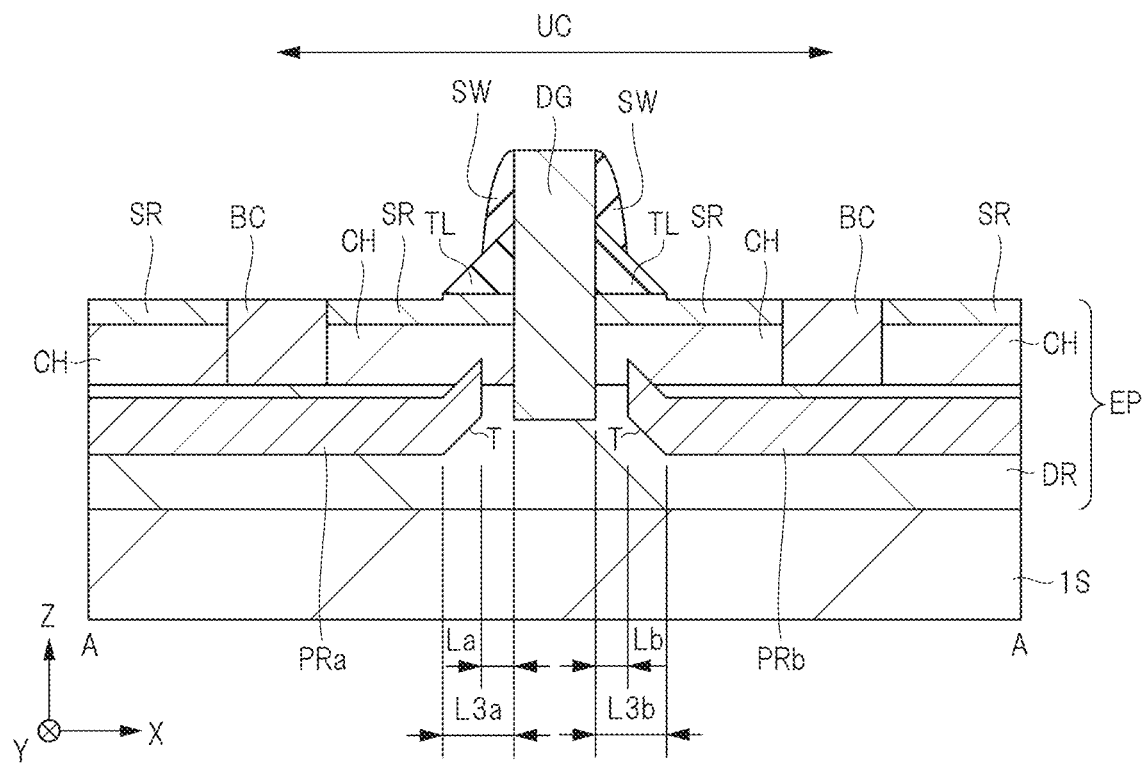
FIG. 51 is a cross-sectional view illustrating the manufacturing process of the semiconductor device according to the fifth embodiment.

Then, as illustrated in FIG. 51, the p-type semiconductor regions (PRa and PRb) are formed by using ion implantation. For example, p-type impurities such as aluminum (Al) or boron (B) are implanted into the drift layer DR with using the dummy gate DG, the insulating film TL, and the side wall films SW as a mask. In the ion implantation, the p-type semiconductor regions (PRa and PRb) are not formed below the side wall films SW, and the taper T is formed at each of the ends of the p-type semiconductor regions (PRa and PRb) by reflecting the side walls of the insulating film TL having an inclination angle of 45°. In other words, the distance between each of the p-type semiconductor regions PRa and PRb and the trench TR gradually increases in the depth direction (La→L3a, Lb→L3b). Note that the shortest distance between each of the p-type semiconductor regions PRa and PRb and the trench TR is shorter than or equal to the width of the trench TR.

Figure 52:
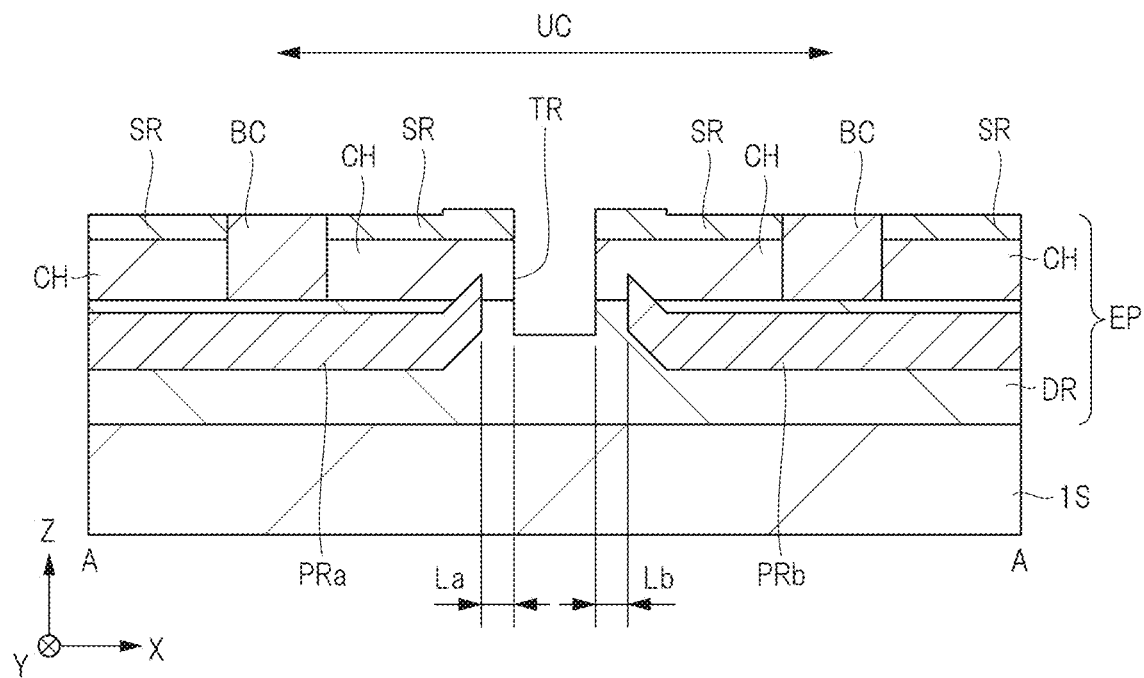
FIG. 52 is a cross-sectional view illustrating the manufacturing process of the semiconductor device according to the fifth embodiment.
Figure 53:
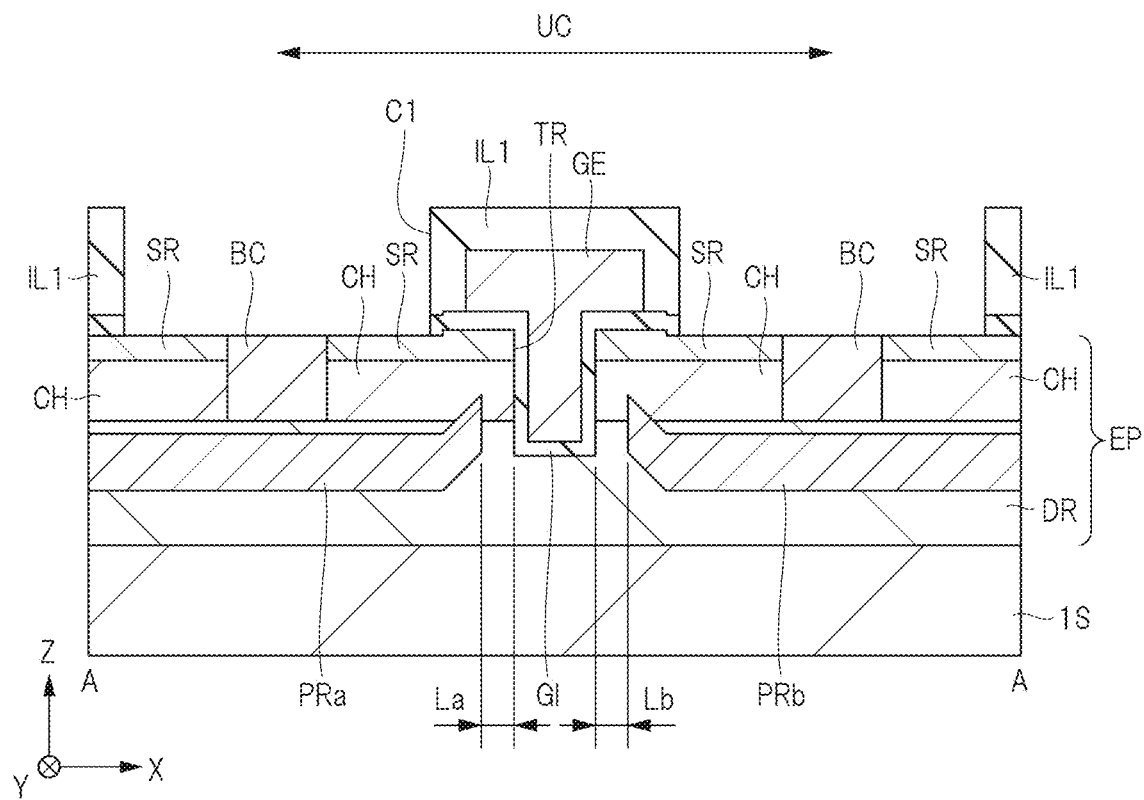
FIG. 53 is a cross-sectional view illustrating the manufacturing process of the semiconductor device according to the fifth embodiment.
Figure 54:
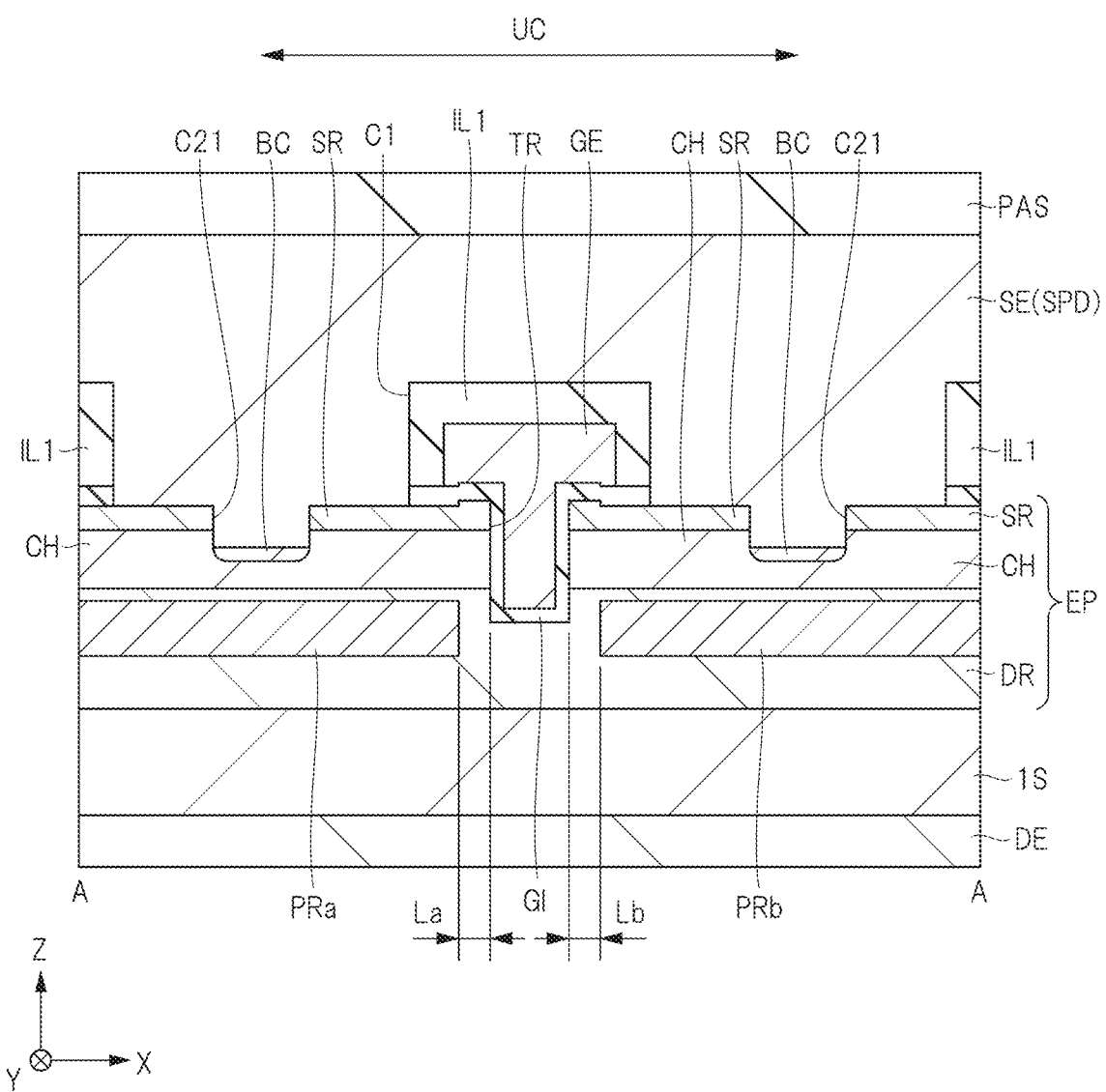
FIG. 54 is a cross-sectional view illustrating a configuration of a semiconductor device according to a sixth embodiment.

Next, as illustrated in FIG. 52, the dummy gate DG and others are removed by the etching technique. Then, as illustrated in FIG. 53, after the gate insulating film GI is formed and the gate electrode GE is further formed, the interlayer insulating film IL1 covering the gate electrode GE is formed, and the contact holes C1 are formed. These can be formed in the same manner as the first embodiment. Then, the source electrode SE is formed, and the surface protection film PAS is formed so as to cover the source electrode SE and others (FIG. 54). Thereafter, the drain electrode DE is formed on the back surface of the SiC substrate 1S (FIG. 44). The surface protection film PAS and the drain electrode DE can be formed in the same manner as the first embodiment.

Sixth Embodiment

In a sixth embodiment, contact holes are formed in formation regions of the body contact regions BC, and the body contact regions BC are provided at the bottom portions of the corresponding contact holes.

[Description of Structure]

FIG. 54 is a cross-sectional view illustrating a configuration of a semiconductor device according to the sixth embodiment. As illustrated in FIG. 54, in the sixth embodiment, contact holes C21 are provided in the formation regions of the body contact regions BC, and the body contact regions BC are provided at bottom portions of the corresponding contact holes C21. Each of the contact holes C21 is a hole penetrating the source region SR to reach the channel layer CH. Also, the contact hole C21 is arranged below the contact hole C1. With respect to the contact holes (C1 and C21) mentioned here, a wider portion of the set of the contact holes corresponds to the contact hole C1, and a narrower portion of the set of the contact holes (C1 and C21) located below the contact hole C1 corresponds to the contact hole C21.

In the sixth embodiment, the configuration except for the contact holes C21 and the corresponding body contact regions BC at the bottom portions thereof is substantially the same as that of the first embodiment (FIG. 1), and thus the description thereof is omitted. Furthermore, operation of the semiconductor device (transistor) according to the sixth embodiment is the same as that in the first embodiment.

Also in the sixth embodiment, it is possible to achieve the effect of miniaturizing the semiconductor elements and improving the element characteristics described in the first embodiment.

[Description of Manufacturing Method]

Next, a manufacturing method of the semiconductor device according to the sixth embodiment will be described with reference to FIGS. 55 to 65 and a configuration of the semiconductor device will be further clarified. FIGS. 55 to 65 are cross-sectional views illustrating a manufacturing process of the semiconductor device according to the sixth embodiment.

Figure 55:
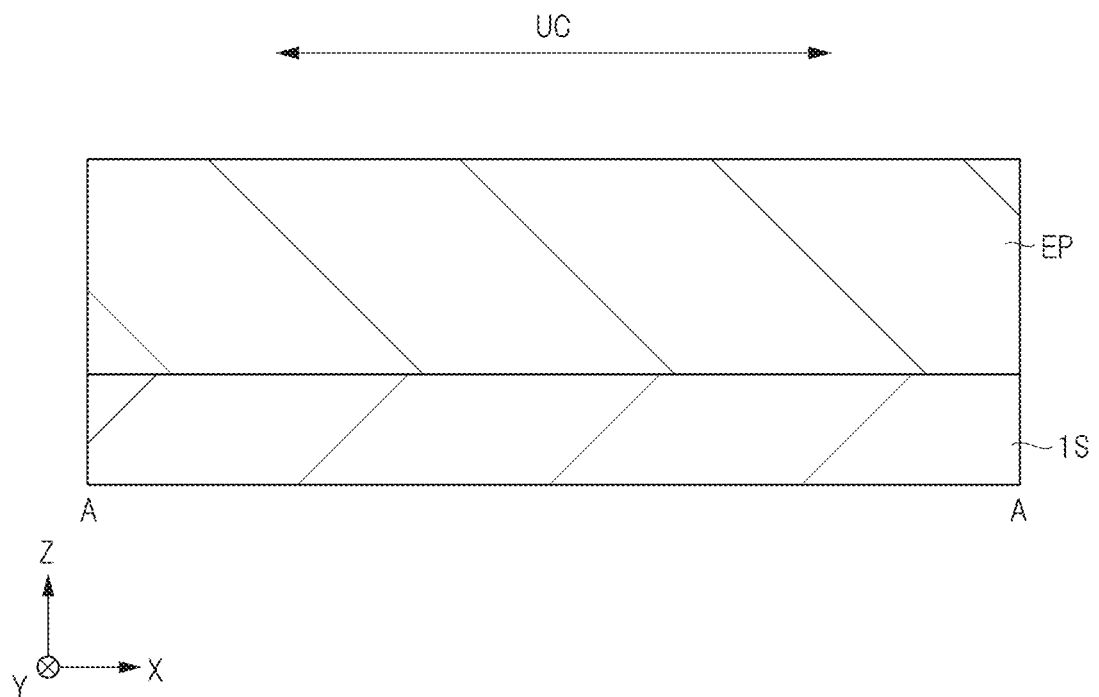
FIG. 55 is a cross-sectional view illustrating a manufacturing process of the semiconductor device according to the sixth embodiment.
Figure 56:
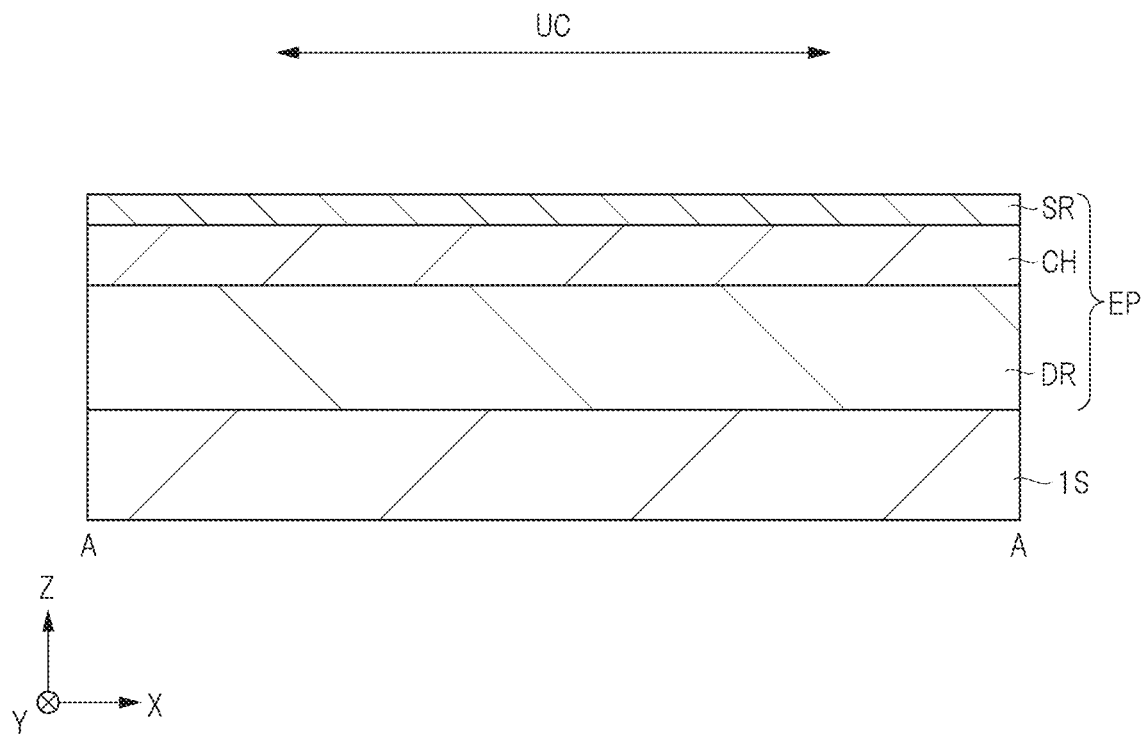
FIG. 56 is a cross-sectional view illustrating the manufacturing process of the semiconductor device according to the sixth embodiment.

As illustrated in FIG. 55, the SiC substrate 1S provided with the epitaxial layer EP is prepared, and a p-type semiconductor region serving as the channel layer CH and an n-type semiconductor region serving as the source region SR are formed by ion implantation as illustrated in FIG. 56. These can be formed in the same manner as the first embodiment.

Figure 57:
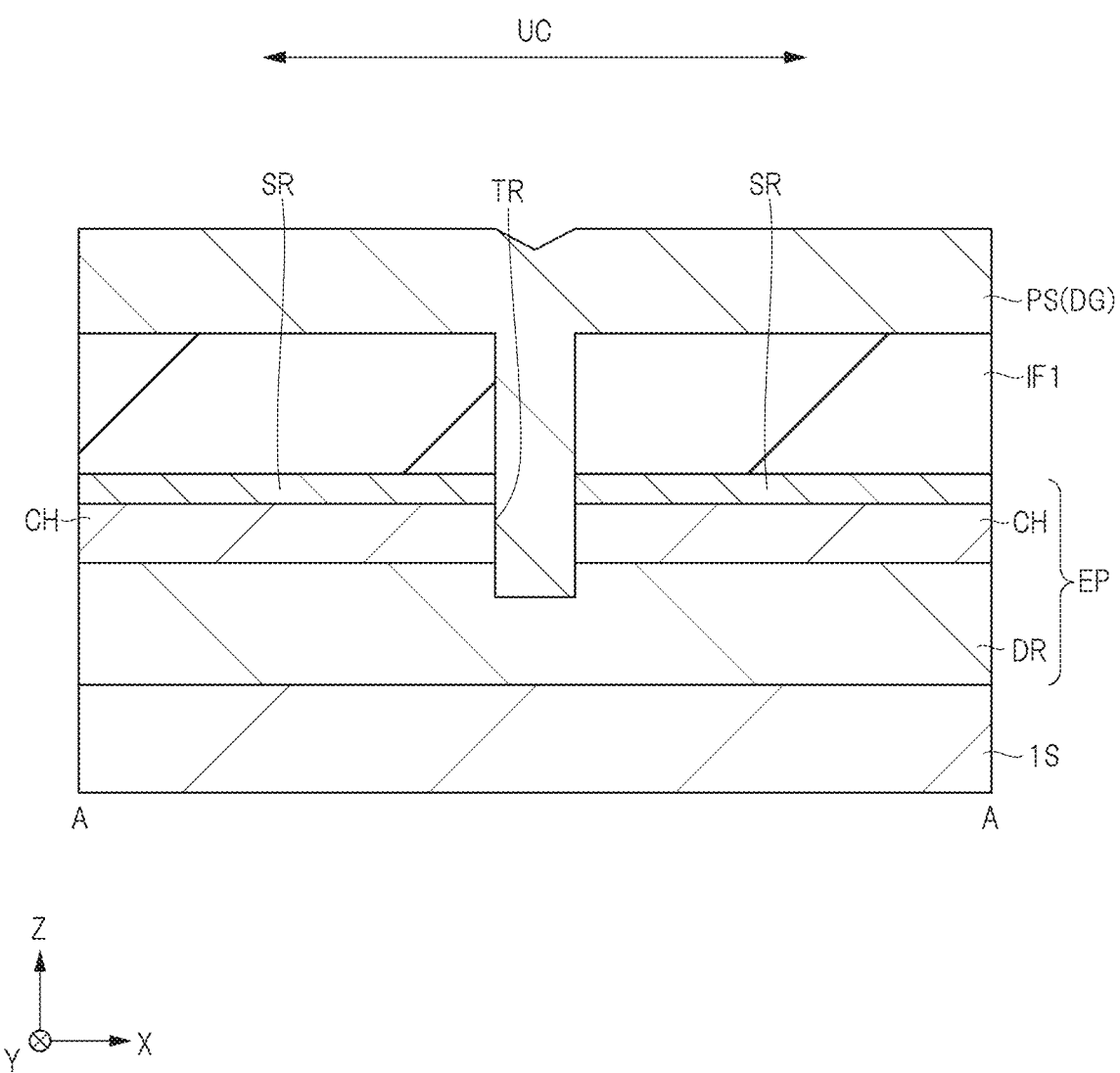
FIG. 57 is a cross-sectional view illustrating the manufacturing process of the semiconductor device according to the sixth embodiment.
Figure 58:
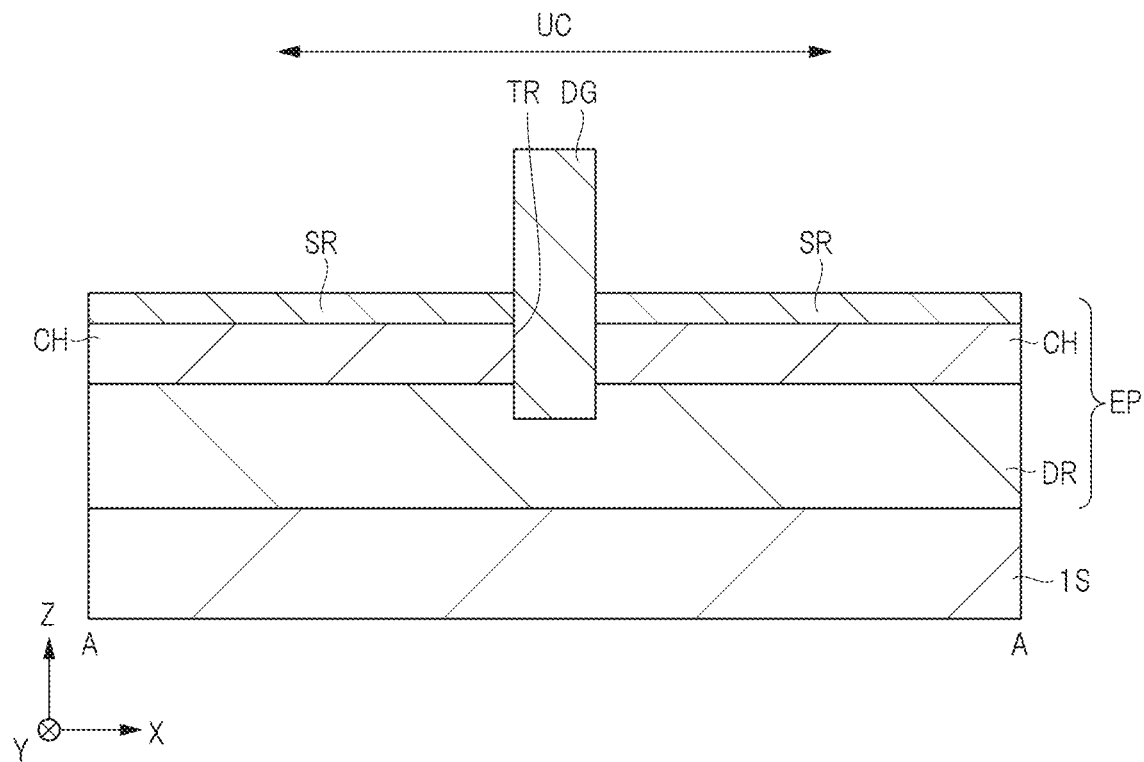
FIG. 58 is a cross-sectional view illustrating the manufacturing process of the semiconductor device according to the sixth embodiment.

Next, as is the case with the first embodiment, the trench TR that penetrates the source region SR and the channel layer CH to reach the drift layer DR is formed (FIG. 57). Then, as is the case with the first embodiment, the dummy gate DG that is provided in the trench TR and protrudes upward from the trench TR is formed (FIG. 58).

Figure 59:
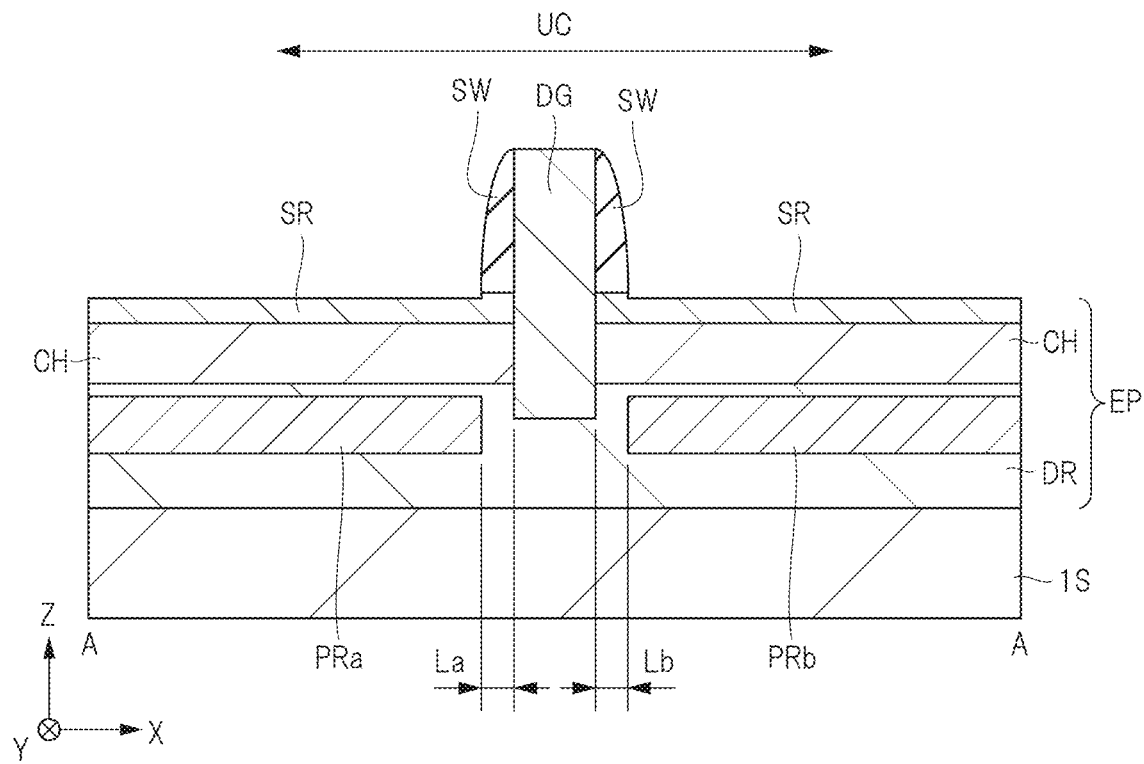
FIG. 59 is a cross-sectional view illustrating the manufacturing process of the semiconductor device according to the sixth embodiment.
Figure 60:
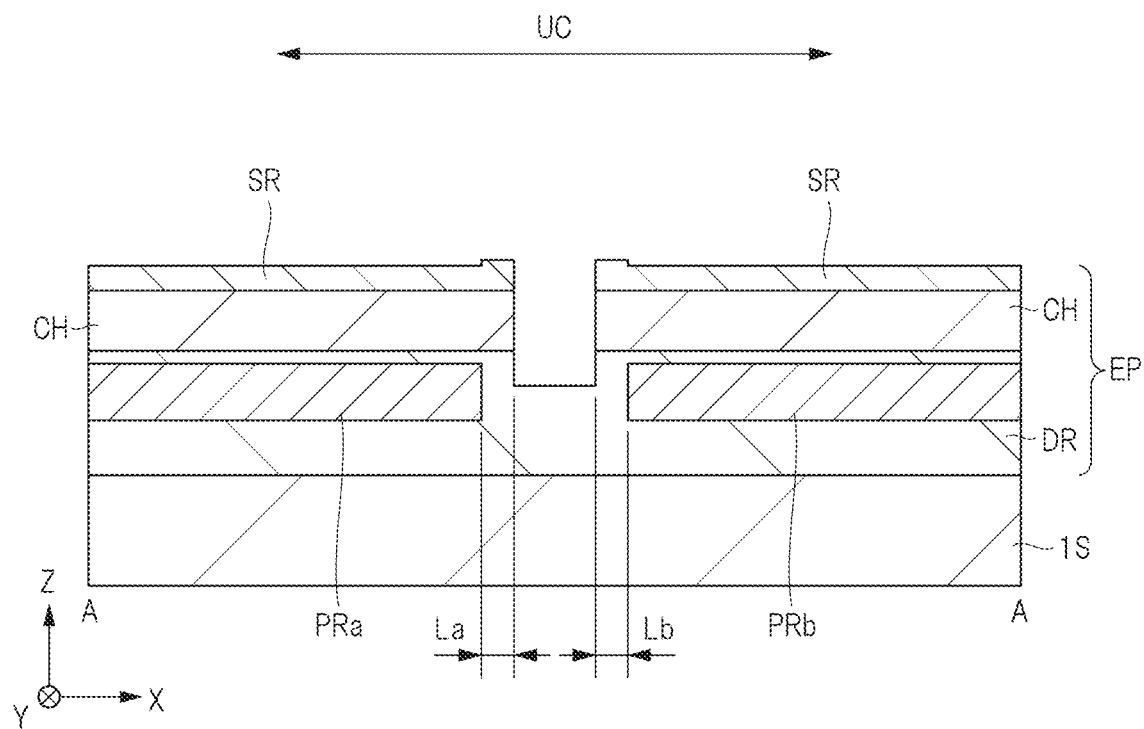
FIG. 60 is a cross-sectional view illustrating the manufacturing process of the semiconductor device according to the sixth embodiment.

Next, as is the case with the first embodiment, the side wall films SW are formed on the side wall portions on both sides of the protruding portion of the dummy gate DG, and p-type impurities are ion-implanted with using the dummy gate DG and the side wall films SW as a mask to form the p-type semiconductor regions PRa and PRb (FIG. 59). Then, the dummy gate DG and the like are removed by the etching technique (FIG. 60).

Figure 61:
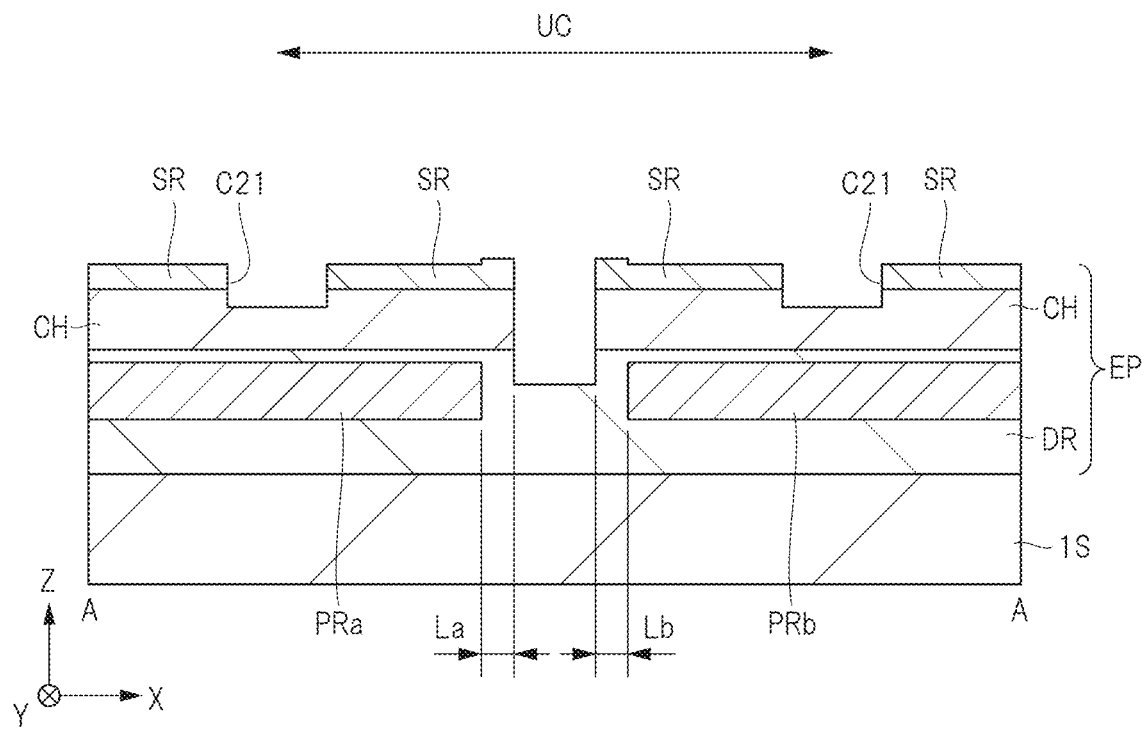
FIG. 61 is a cross-sectional view illustrating the manufacturing process of the semiconductor device according to the sixth embodiment.

Next, as illustrated in FIG. 61, the contact holes C21 are formed in the source regions SR on both sides of the trench TR. For example, hard mask (not illustrated in the drawings) having openings in formation regions of the contact holes C21 is formed on the source region SR by the photolithography technique and the etching technique. Then, the source region SR and the upper portion of the channel layer CH are etched with using the hard mask (not illustrated in the drawings) as a mask to form the contact holes C21. The channel layer CH is exposed in a bottom surface of each of the contact holes C21.

Figure 62:
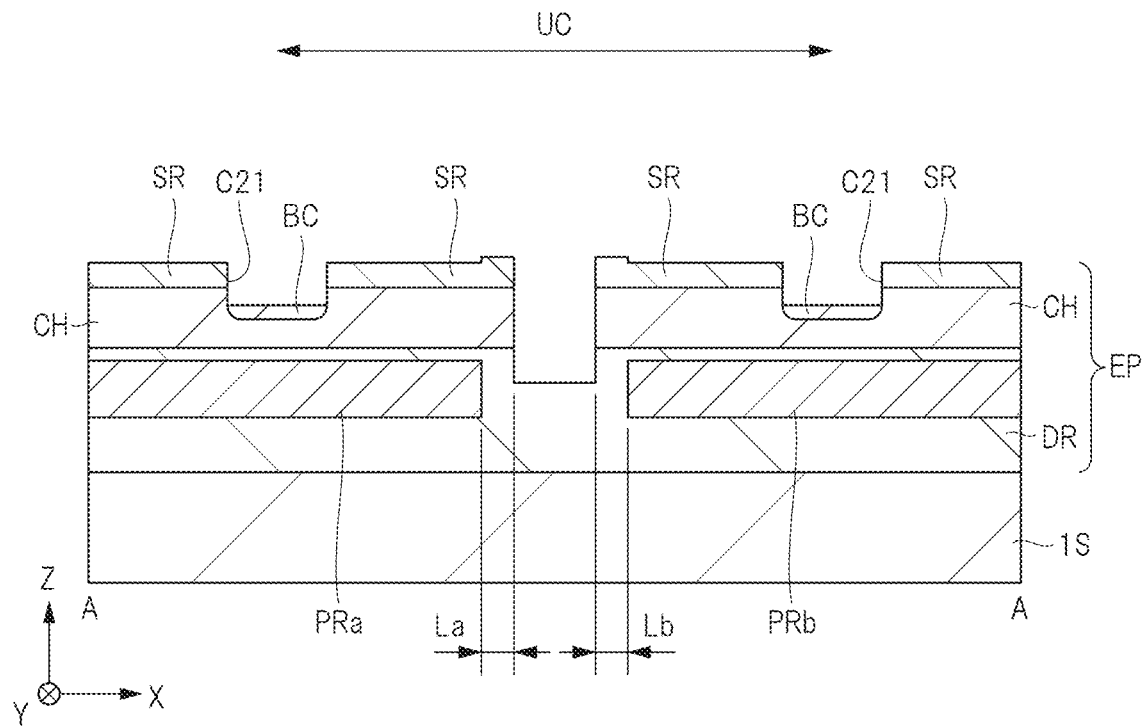
FIG. 62 is a cross-sectional view illustrating the manufacturing process of the semiconductor device according to the sixth embodiment.
Figure 63:
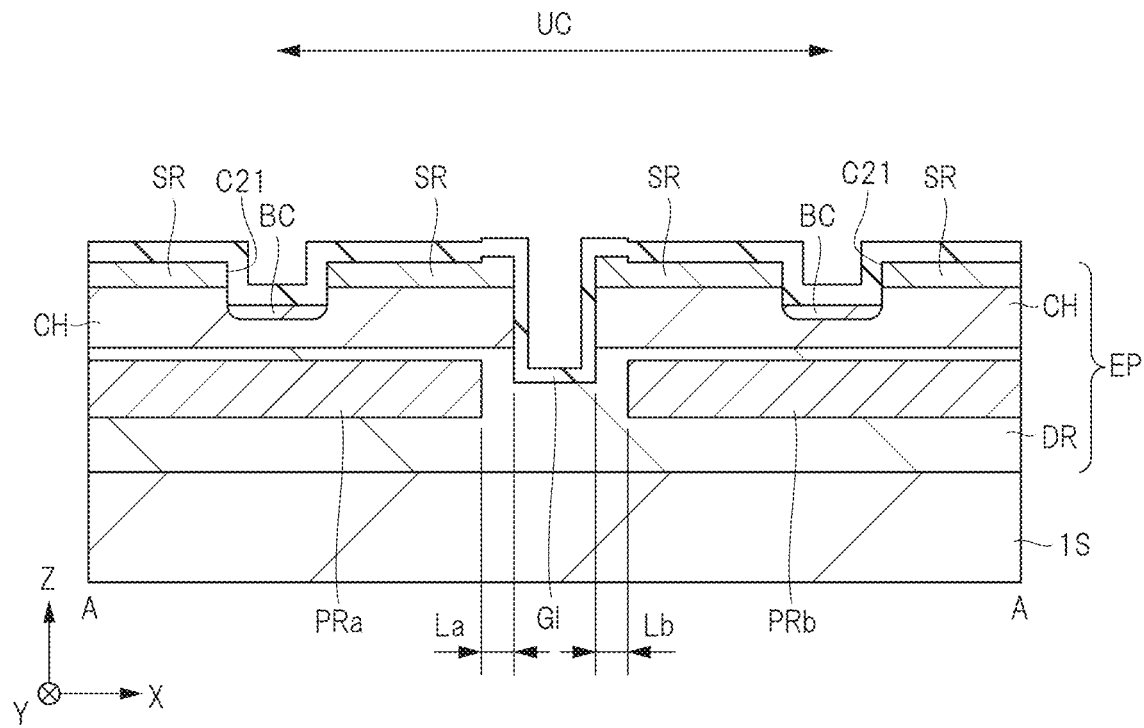
FIG. 63 is a cross-sectional view illustrating the manufacturing process of the semiconductor device according to the sixth embodiment.

Next, as illustrated in FIG. 62 and FIG. 63, the body contact regions BC are formed below bottom surfaces of the contact holes C21, and the gate insulating film GI is further formed on the source region SR including the inside of the trench TR and each of the contact holes C21.

For example, the body contact regions BC are formed by ion-implanting p-type impurities into the channel layer CH exposed in the bottom surface of each of the contact holes C21 with using the hard mask (not illustrated in the drawings) as a mask (FIG. 62). The concentration of the p-type impurities in the body contact regions BC is higher than that of the p-type impurities in the channel layer CH. The, the hard mask (not illustrated in the drawings) is removed.

Next, for example, a silicon oxide film serving as the gate insulating film GI is formed by the ALD or the like on the source region SR including the inside of the trench TR and each of the contact holes 21 (FIG. 63).

Figure 64:
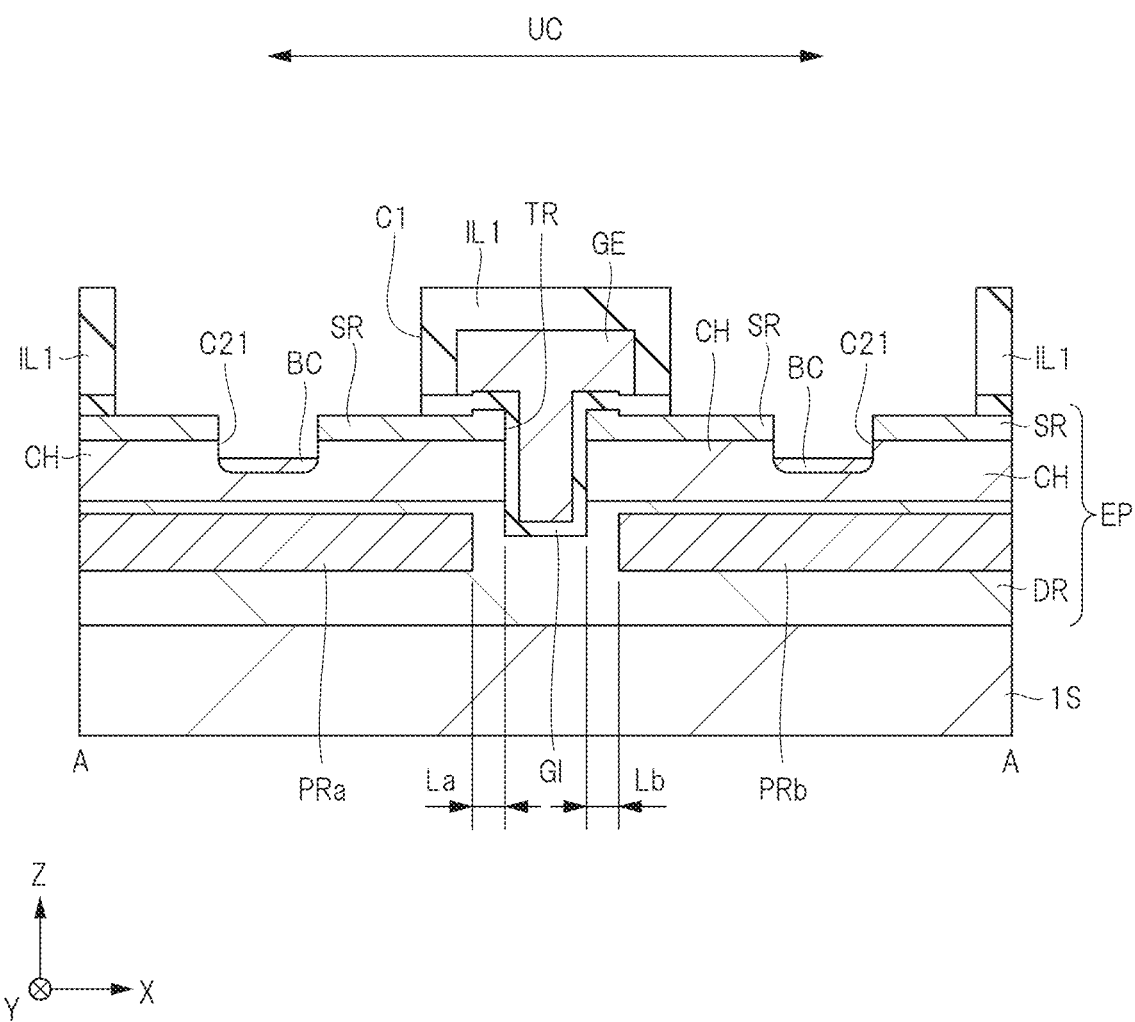
FIG. 64 is a cross-sectional view illustrating the manufacturing process of the semiconductor device according to the sixth embodiment.

Next, as illustrated in FIG. 64, the gate electrode GE and the interlayer insulating film IL1 covering the gate electrode GE are formed, and the contact holes C1 are formed.

For example, as is the case with the first embodiment, a silicon oxide film is formed as the interlayer insulating film IL1 on the gate electrode GE by the CVD. Then, a photoresist film (not illustrated in the drawings) having openings above each of the body contact regions BC and portions of the source region SR on both sides of the body contact regions BC is formed on the interlayer insulating film IL1. Then, the interlayer insulating film IL1 is etched with using the photoresist film as a mask, thereby forming the contact holes C1. The contact holes C21 are located below the respective contact holes C1. Each of the body contact regions BC and the portions of the source region SR on both sides of the body contact region BC are exposed below the set of the contact holes (C1 and C21).

Next, as illustrated in FIG. 65, the source electrode SE is formed. The source electrode SE and the like may be formed after a silicide film is formed on the bottom surface of the set of the contact holes C21 and C1. In a case where the bottom surface of each the contact holes is roughened by etching at the time of forming the contact holes, the silicide grows well. Thereafter, the surface protection film PAS is formed so as to cover the source electrode SE and the like, and the drain electrode DE is formed on the back surface of the SiC substrate 1S (FIG. 54). The source electrode SE, the surface protection film PAS, and the drain electrode DE can be formed in the same manner as the first embodiment.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, any of the embodiments and the applied examples may be combined together. For example, one of Applied Examples 1 and 2 of the second embodiment may be applied to any of the third to sixth embodiments. Alternatively, the third embodiment may be applied to the fourth embodiment or the like. In addition, the fourth embodiment may be applied to the fifth embodiment or the like. Furthermore, the n-type transistor may be replaced with a p-type transistor. Also, the epitaxial layer EP may be omitted, and the channel layer CH, the source region SR, and the like may be formed in the SiC substrate 1S.

Furthermore, in the above-described embodiments, the trench gate type power transistor made of SiC has been described by way of example. However, the configurations of the above-described embodiments may be applied to a trench gate type power transistor made of Si. However, as described above, although a high breakdown voltage of SiC itself can be ensured because SiC has a wider bandgap than silicon (Si), it is important to enhance the breakdown voltage in the components made of other materials (gate insulating film and the like). Thus, the above-described embodiments are more effectively applied to a trench gate type power transistor made of SiC.

What is claimed is:

1. A manufacturing method of a semiconductor device including the steps of:
   (a) preparing a substrate provided with an SiC layer including a drift layer, a channel layer on the drift layer, and a source region on the channel layer;
   (b) forming a first insulating film on the SiC layer;
   (c) forming a trench in the first insulating film and the SiC layer, the trench penetrating the first insulating film, the source region, and the channel layer to reach the drift layer;
   (d) embedding a dummy gate in the trench;
   (e) removing the first insulating film such that the dummy gate protrudes from the source region;
   (f1) forming a second insulating film on the source region and the dummy gate by high density plasma CVD;
   (f2) anisotropically etching the second insulating film to form first films with tapered side surfaces on side walls of the dummy gate;
   (f3) forming side wall films on the first films on the side walls of the dummy gate;
   (g) ion-implanting impurities of a conductivity type opposite to a conductivity type of the drift layer with using the dummy gate, the first films, and the side wall films as a mask, thereby forming a first semiconductor region in the drift layer on one side of the trench and forming a second semiconductor region in the drift layer on the other side of the trench;
   (h) removing the dummy gate, the first films, and the side wall films;
   (i) forming a gate insulating film on an inner wall of the trench; and
   (j) forming a gate electrode on the gate insulating film so as to be embedded in the trench.

2. A semiconductor device including:
   an SiC layer including a drift layer, a channel layer on the drift layer, and a source region on the channel layer;

a trench that penetrates the channel layer to reach the drift layer and is in contact with the source region;
a gate insulating film formed on an inner wall of the trench;
a gate electrode embedded in the trench; and
a first semiconductor region formed in the drift layer on one side of the trench and a second semiconductor region formed in the drift layer on the other side of the trench,
wherein a side surface of an end of the first semiconductor region on a side of the first semiconductor region closer to the trench is spaced apart from the trench in cross-sectional view such that a first portion of the channel layer is disposed between the trench and the side surface of the end of the first semiconductor region,
wherein a side surface of an end of the second semiconductor region on a side of the second semiconductor region closer to the trench is spaced apart from the trench in cross-sectional view such that a second portion of the channel layer is disposed between the trench and the side surface of the end of the second semiconductor region,
wherein the first portion of the channel layer is different from the second portion of the channel layer, and
wherein the side surface of the end of the first semiconductor region includes a tapered portion, and a distance between the trench and the first semiconductor region gradually increases in a depth direction.

3. The semiconductor device according to claim 2, wherein a shortest distance between the trench and the first semiconductor region and a shortest distance between the trench and the second semiconductor region are each shorter than or equal to a width of the trench.

4. The semiconductor device according to claim 2,
wherein the first portion of the channel layer is disposed between the trench and a first portion of the side surface of the end of the first semiconductor region while a first portion of the drift layer is disposed between the trench and a second portion of the side surface of the end of the first semiconductor region, and
wherein the first portion of the side surface of the end of the first semiconductor region is different from the second portion of the side surface of the end of the first semiconductor region.

5. The semiconductor device according to claim 2,
wherein the second portion of the channel layer is disposed between the trench and a first portion of the side surface of the end of the second semiconductor region while a first portion of the drift layer is disposed between the trench and a second portion of the side surface of the end of the second semiconductor region, and
wherein the first portion of the side surface of the end of the second semiconductor region is different from the second portion of the side surface of the end of the second semiconductor region.

6. The semiconductor device according to claim 2,
wherein the first portion of the channel layer extends from the trench to the side surface of the end of the first semiconductor region, and
wherein the second portion of the channel layer extends from the trench to the side surface of the end of the second semiconductor region.

* * * * *